United States Patent
Li et al.

(10) Patent No.: US 8,804,413 B2
(45) Date of Patent: Aug. 12, 2014

(54) MULTI-FREE LAYER MTJ AND MULTI-TERMINAL READ CIRCUIT WITH CONCURRENT AND DIFFERENTIAL SENSING

(75) Inventors: Xia Li, San Diego, CA (US); Wenqing Wu, San Diego, CA (US); Jung Pill Kim, San Diego, CA (US); Xiaochun Zhu, San Diego, CA (US); Seung H. Kang, San Diego, CA (US); Raghu Sagar Madala, San Diego, CA (US); Kendrick H. Yuen, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 62 days.

(21) Appl. No.: 13/586,934

(22) Filed: Aug. 16, 2012

(65) Prior Publication Data

US 2013/0201757 A1  Aug. 8, 2013

Related U.S. Application Data

(60) Provisional application No. 61/595,815, filed on Feb. 7, 2012.

(51) Int. Cl.
*G11C 11/14* (2006.01)
*G11C 11/16* (2006.01)
*G11C 11/15* (2006.01)

(52) U.S. Cl.
CPC ............... *G11C 11/16* (2013.01); *G11C 11/15* (2013.01)
USPC ................ 365/171; 365/158; 365/189.14

(58) Field of Classification Search
CPC .................. G11C 11/16; G11C 11/15
USPC ............... 365/158, 171, 173, 66, 97
See application file for complete search history.

(56) References Cited

U.S. PATENT DOCUMENTS 5,986,925 A   11/1999 Naji et al.
6,498,747 B1 * 12/2002 Gogl et al. .................. 365/158
(Continued)

FOREIGN PATENT DOCUMENTS

JP     2007095765 A    4/2007

OTHER PUBLICATIONS

Partial International Search Report—PCT/US2013/025191—ISA/EPO—May 31, 2013.
(Continued)

*Primary Examiner* — Gene Auduong
(74) *Attorney, Agent, or Firm* — Sam Talpalatsky; Nicholas J. Pauley; Joseph Agusta

(57) ABSTRACT

A multi-free layer magnetic tunnel junction (MTJ) cell includes a bottom electrode layer, an anti-ferromagnetic layer on the bottom electrode layer, a fixed magnetization layer on the anti-ferromagnetic layer and a barrier layer on the fixed magnetization layer. A first free magnetization layer is on a first area of the barrier layer, and a capping layer is on the first free magnetization layer. A free magnetization layer is on a second area of the barrier layer, laterally displaced from the first area, and a capping layer is on the second free magnetization layer. Optionally current switches establish a read current path including the first free magnetization layer concurrent with not establishing a read current path including the second free magnetization layer. Optionally current switches establishing a read current path including the first and second free magnetization layer.

17 Claims, 38 Drawing Sheets

(56) References Cited

U.S. PATENT DOCUMENTS

| | | | |
|---|---|---|---|
| 6,600,184 B1 * | 7/2003 | Gill | 257/295 |
| 6,788,502 B1 | 9/2004 | Gill et al. | |
| 6,885,577 B2 | 4/2005 | Tang et al. | |
| 7,126,201 B2 | 10/2006 | Matsutera et al. | |
| 8,018,011 B2 | 9/2011 | Ranjan et al. | |
| 2002/0154540 A1 | 10/2002 | Sekiguchi et al. | |
| 2006/0039183 A1 | 2/2006 | Lin et al. | |
| 2007/0064351 A1 | 3/2007 | Wang et al. | |
| 2008/0291721 A1 * | 11/2008 | Apalkov et al. | 365/173 |
| 2011/0141796 A1 | 6/2011 | Lee et al. | |

OTHER PUBLICATIONS

International Search Report and Written Opinion—PCT/US2013/025191—ISA/EPO—Oct. 15, 2013.

* cited by examiner

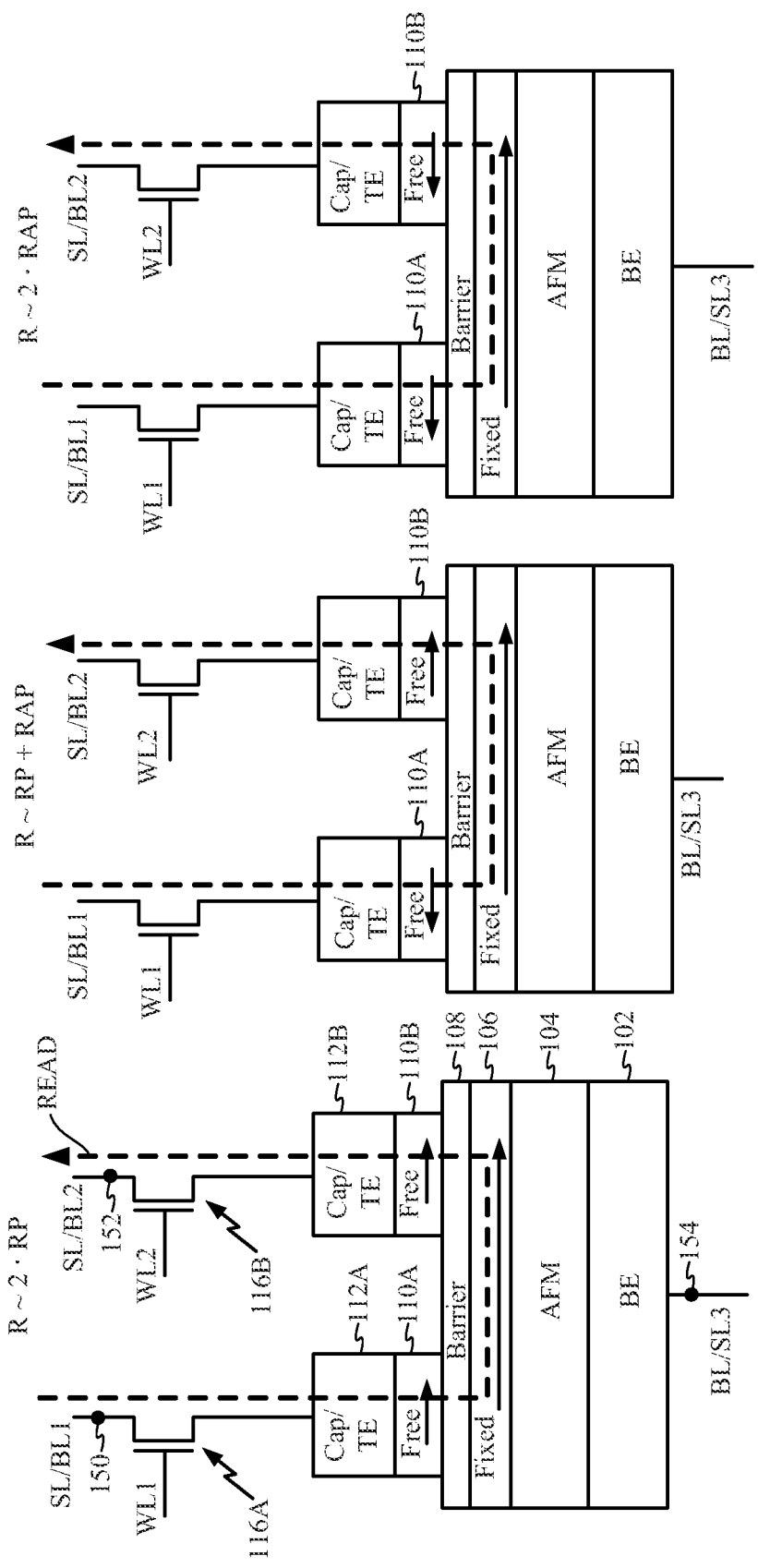

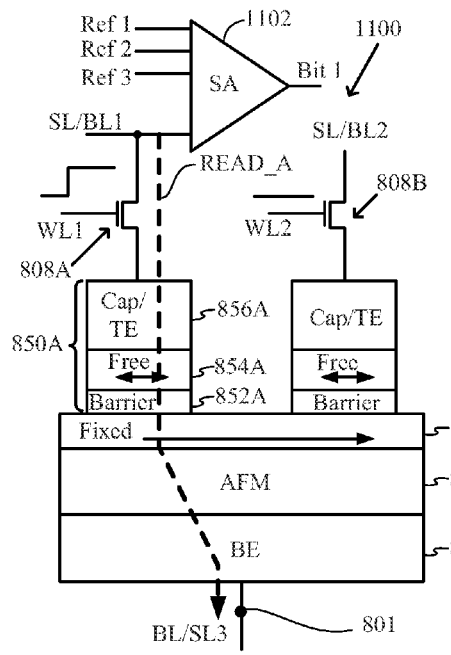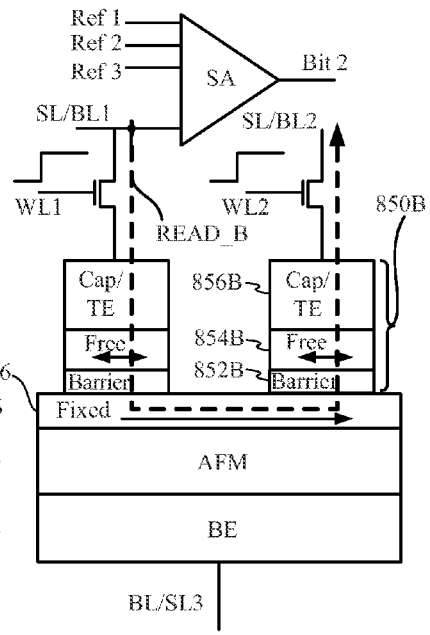
FIG. 11A
FIG. 11B
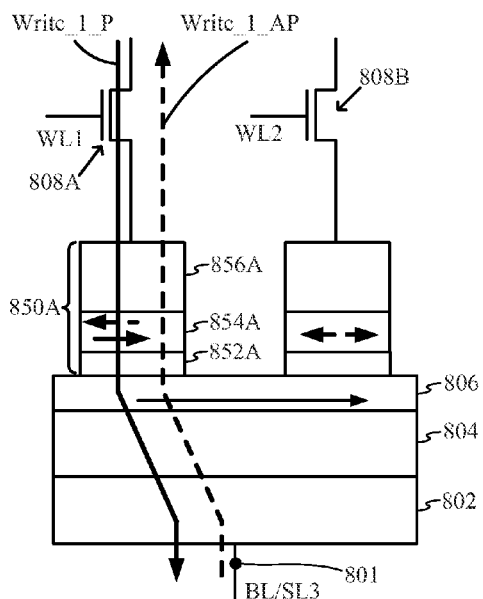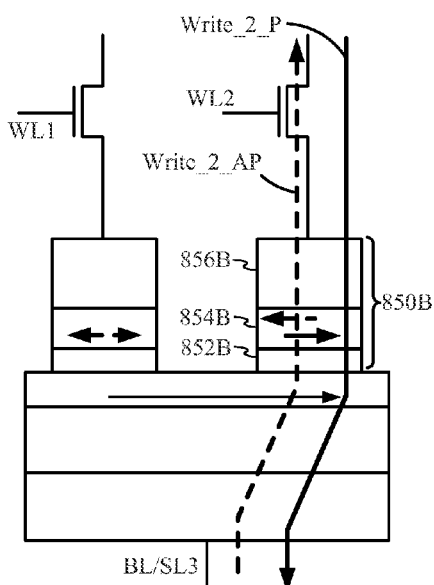
FIG. 10A
FIG. 10B

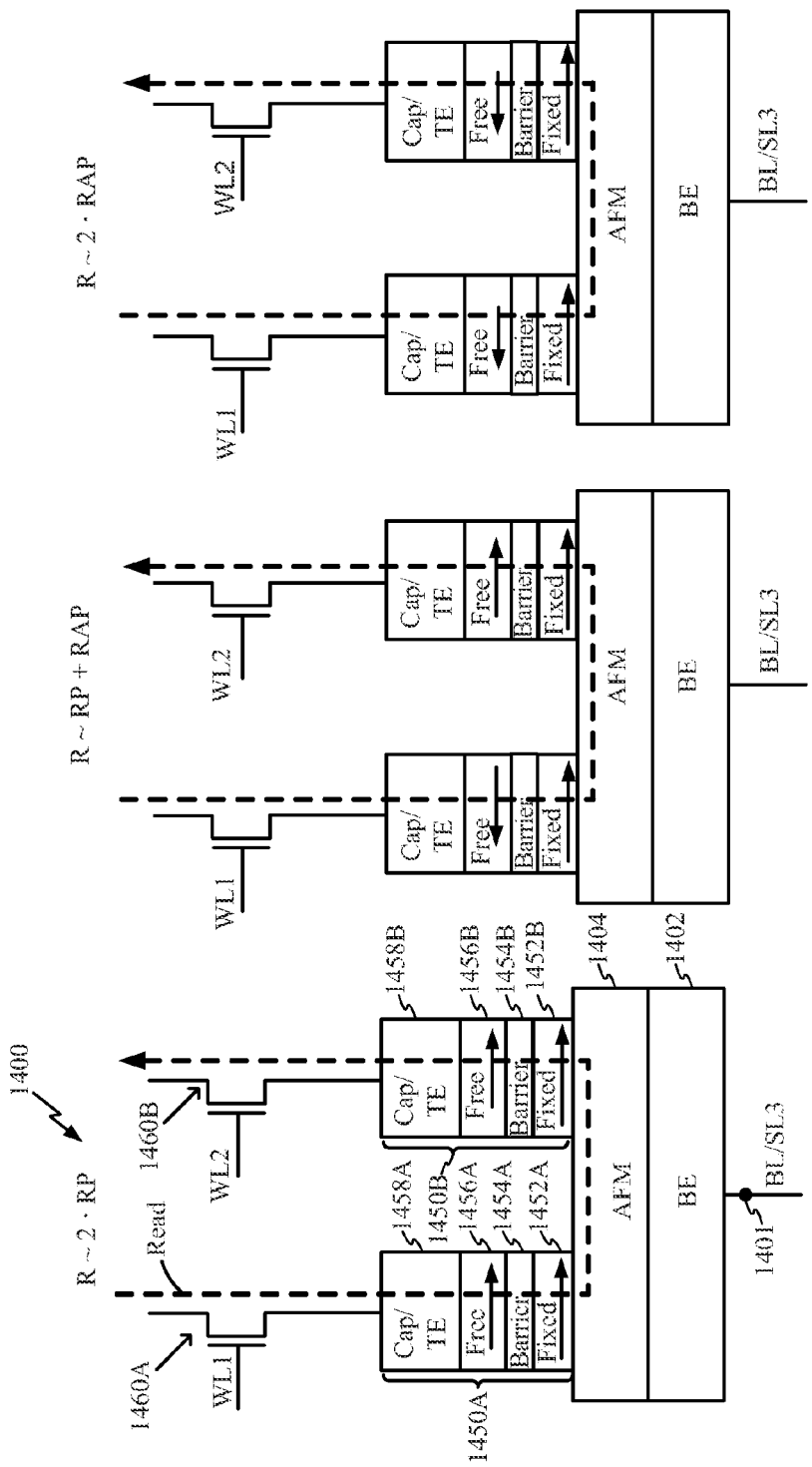

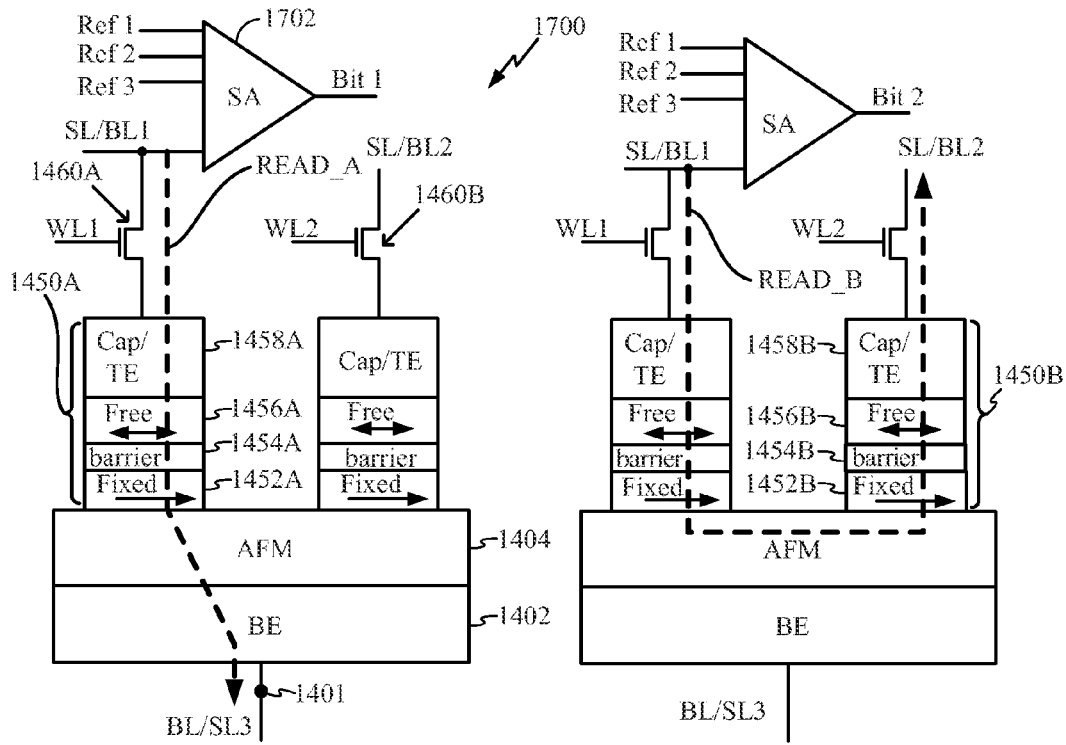
FIG. 17A  FIG. 17B
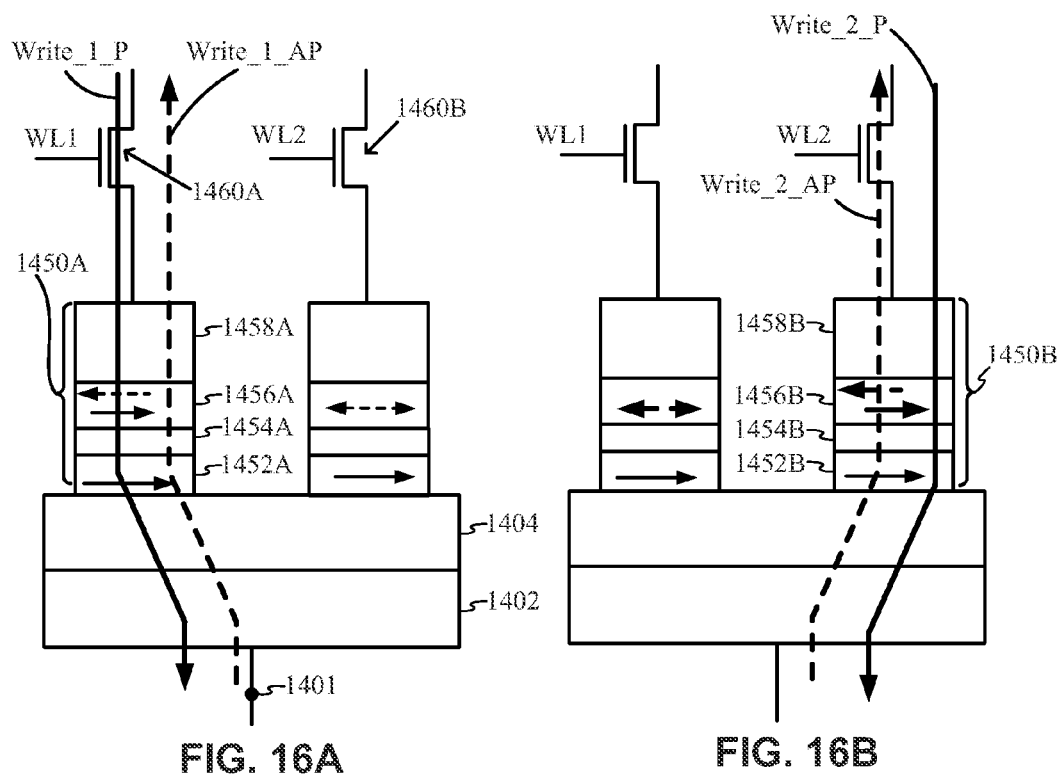
FIG. 16A  FIG. 16B

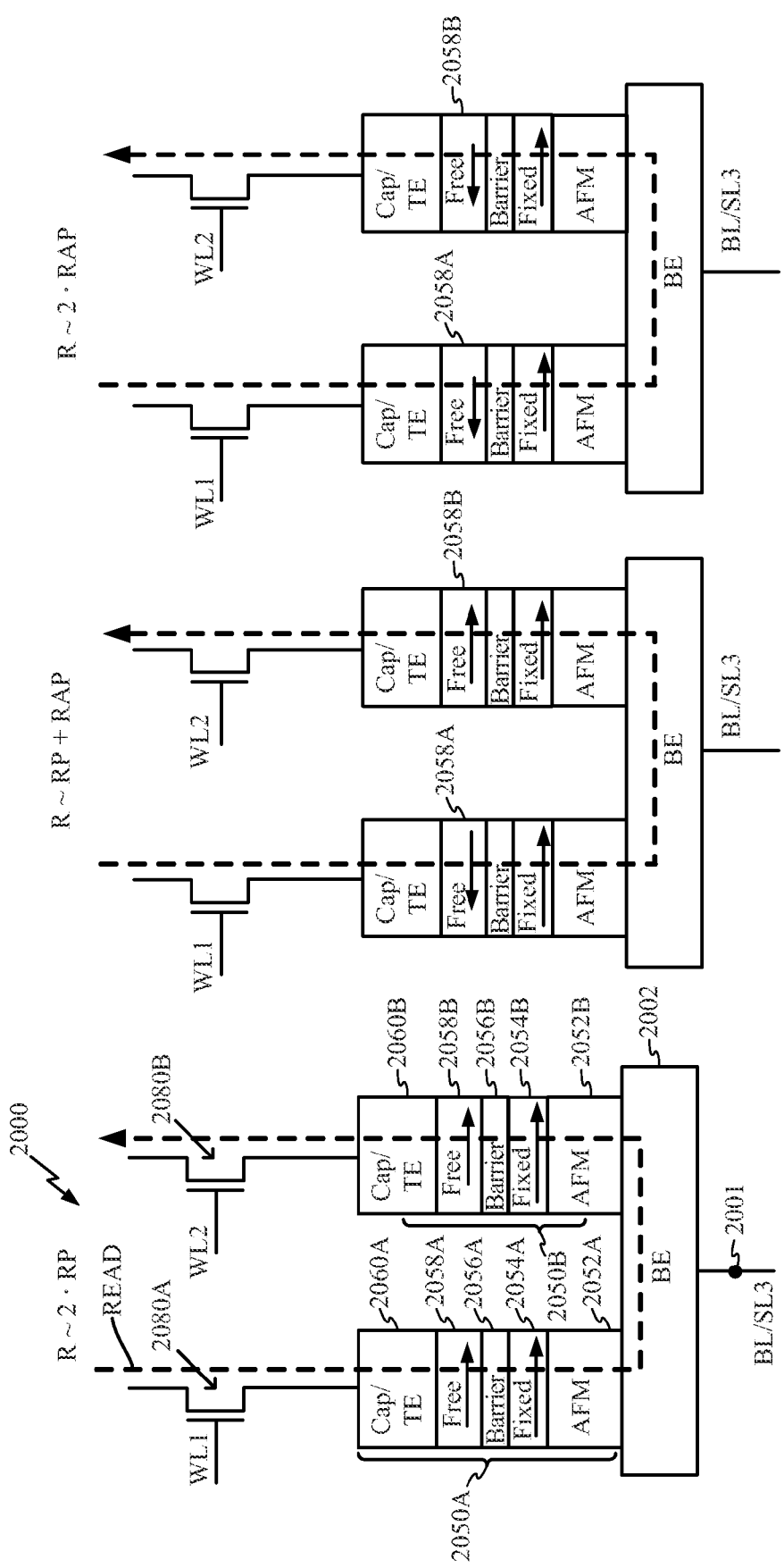

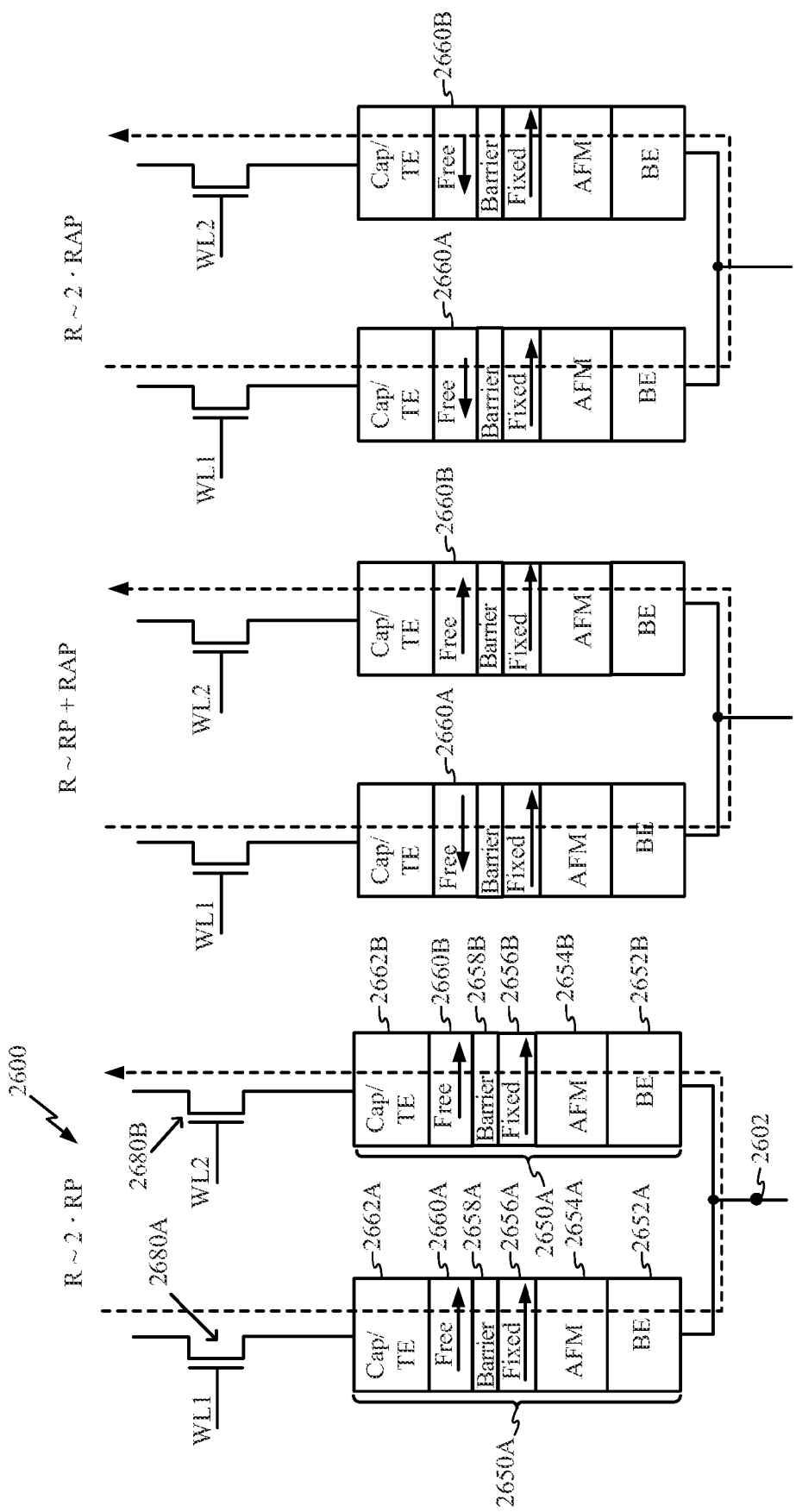

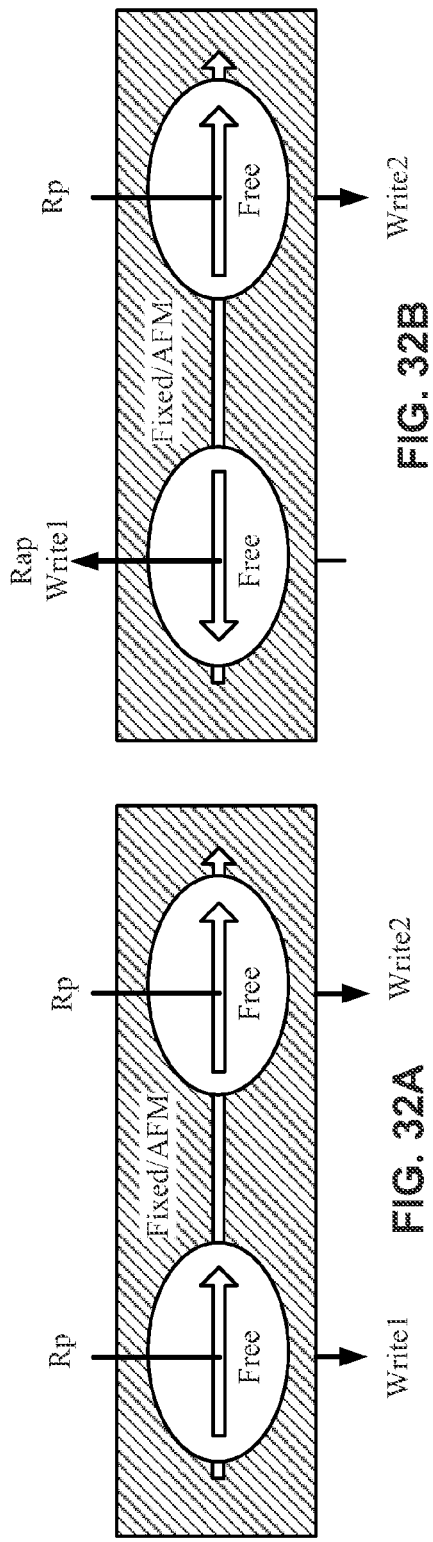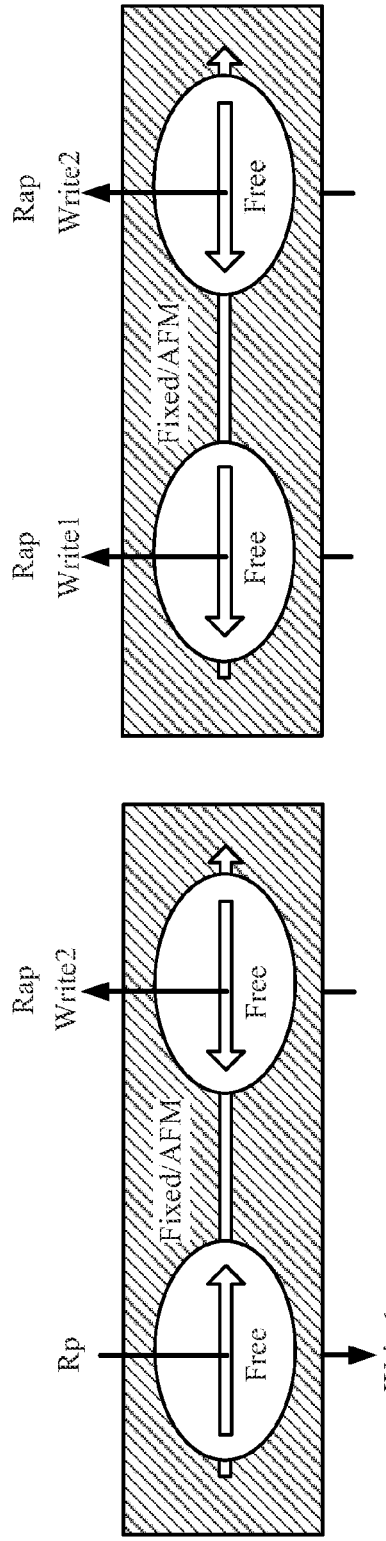
FIG. 32A  FIG. 32B  FIG. 32C  FIG. 32D

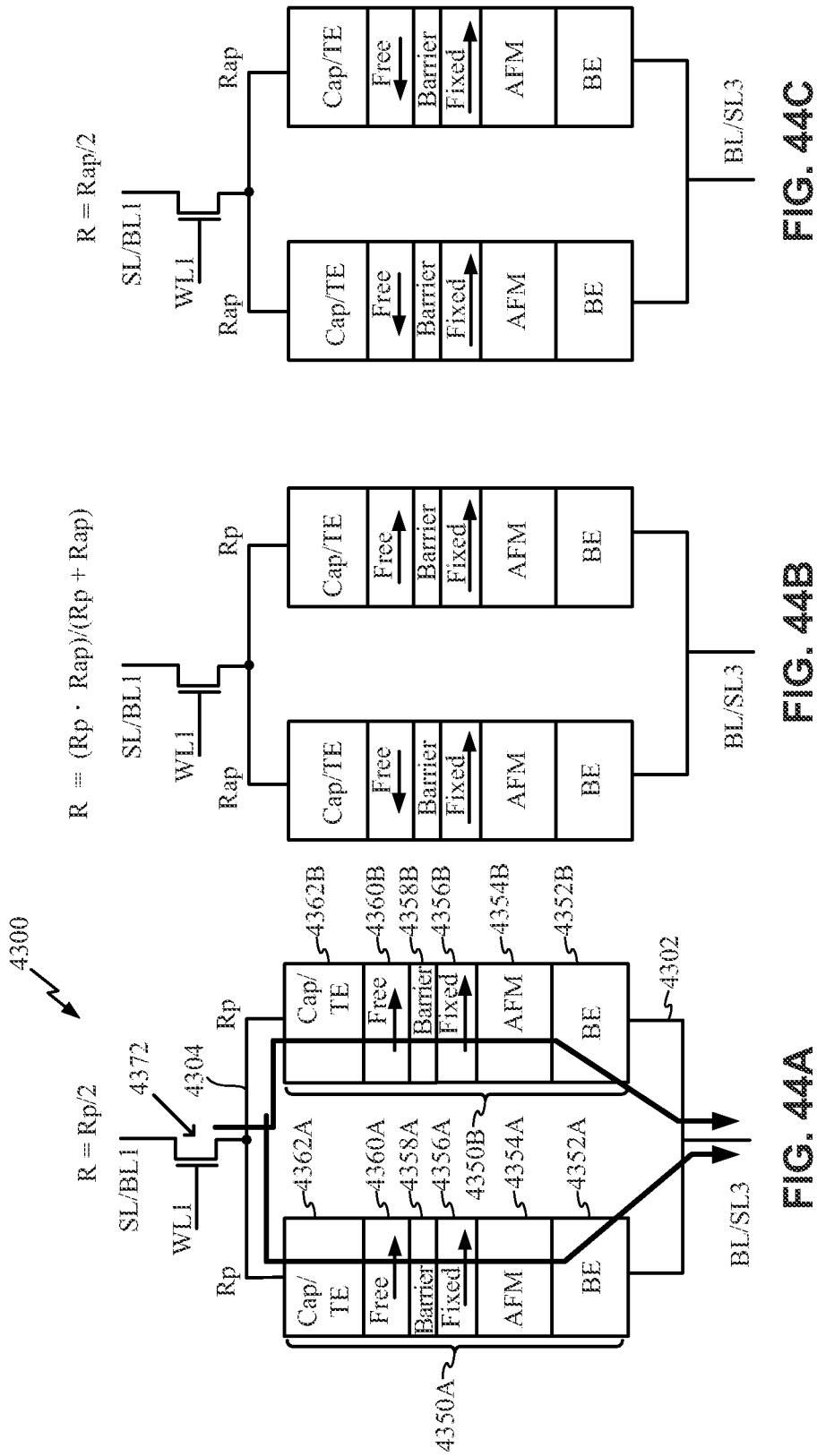

MULTI-FREE LAYER MTJ AND MULTI-TERMINAL READ CIRCUIT WITH CONCURRENT AND DIFFERENTIAL SENSING

CLAIM OF PRIORITY UNDER 35 U.S.C. §119

The present Application for Patent claims priority to Provisional Application No. 61/595,815 entitled "Novel Multi-Free Layer MTJ Structures for Multi-Bits/Levels and for Differential Sensing," filed Feb. 7, 2012, and assigned to the assignee hereof and hereby expressly incorporated by reference herein.

FIELD OF DISCLOSURE

The technical field of the disclosure relates to bi-stable resistive element non-volatile memory and, more specifically, to spin torque transfer (STT) magnetic tunnel junction (MTJ) memory cells.

BACKGROUND

STT-MTJ is considered a promising technology for next generation non-volatile memory, as potential features include fast switching, high switching cycle endurance, low power consumption, and extended unpowered archival storage.

A conventional STT-MTJ element includes a "fixed" magnetization layer having, as its name indicates, a fixed magnetization and a "free" magnetization layer that is switchable between two mutually opposite, stable magnetization states—one being "parallel" (P) to the magnetization of the fixed layer, and the other being opposite, or anti-parallel" (AP), to the fixed magnetic layer. The electrical resistance of a given STT-MTJ element is lower when in its P state than when its AP state. The magnetization state of an STT-MTJ element can therefore be read by detecting its resistance. By assigning one of the P and AP states to represent a first binary value, e.g., a "0", and the other to represent a second binary value, e.g., a "1" the STT-MTJ element can be a binary, i.e., one-bit storage.

The conventional STT-MTJ element, more particularly the free magnetization layer of the STT-MTJ element, can be selectively switched between the P and AP states, and visa versa, by passing an electric "write" current through its free and fixed magnetization layers. Provided the write current is above a given critical point (CPT), the STT-MTJ will switch into the P or AP state, with the selection of which states dependent on the direction of the write current. The STT-MTJ element is read by passing a "read" or "sense" current through the device, having a controlled, repeatable amplitude and, since V=IR, a sense or read voltage that is developed indicates whether the STT-MTJ element is in the P or AP state, i.e., whether the STT-MTJ element is storing a "1" or a "0."

Needs in STT-MTJ memory include lower bit error rate, lower power, and increased storage density, e.g., bits per unit area or volume.

SUMMARY

MTJ memory cells according to various exemplary embodiments can provide, among other features and benefits, multiple free layers arranged in a three-terminal configuration, forming multiple tunnel barriers that, in an aspect, can be individually programmed to selected magnetization states and, according to various aspects, concurrently or individually read.

Example multi-free layer MTJ memory cells according to one or more exemplary embodiments can have a bottom electrode layer, an anti-ferromagnetic (AFM) layer on the bottom electrode layer, a fixed magnetization layer on the anti-ferromagnetic layer, a barrier layer on the fixed magnetization layer, a first free magnetization layer on a first area of the barrier layer, a second free magnetization layer on a second area of the barrier layer, laterally displaced from the first area, a first top electrode coupled to the first free magnetization layer and a second top electrode coupled to the second free magnetization layer, a first current switch for switchably coupling the first top electrode to a first MTJ read/write terminal, a second current switch for switchably coupling the second top electrode to a second MTJ read/write terminal; and a third MTJ read/write terminal coupled to the bottom electrode layer.

In an aspect, example multi-free layer MTJ cells according to one or more exemplary embodiments can further include a read current switch control coupled to the first current switch, the second current switch, configured to switch the first current switch and the second current switch to a read mode, wherein the read mode couples the first top electrode to the first MTJ read/write terminal and, concurrently, couples the second top electrode to the second MTJ read/write terminal.

Example multi-free layer MTJ cells, in an aspect according to one more exemplary embodiments, can be configured to establish in the read mode a read current path between the first MTJ read/write terminal and the second MTJ read/write terminal. In a related aspect, the read current path can include the first free magnetization layer in series with the second free magnetization layer.

Example multi-free layer MTJ cell according to another aspect of one or more exemplary embodiments can be configured to provide a read current path that further includes the fixed magnetization layer between an interface of the fixed magnetization layer with the barrier layer under the first area and an interface of the fixed magnetization layer with the barrier layer under the second area.

Multi-free layer MTJ cells according to one or more embodiments can include a bottom electrode layer, an AFM layer on the bottom electrode layer, a fixed magnetization layer on the AFM layer, a first pillar supported on a first area of the fixed magnetization layer, the first pillar having a first barrier layer forming a base on the first area of the fixed magnetization layer, a first free magnetization layer on the first barrier layer, and a first MTJ terminal coupled to the first free magnetization layer, a second pillar supported on a second area of the barrier layer, laterally displaced from the first area, having a second barrier layer forming a base supported on the second area of the fixed magnetization layer, a second free magnetization layer on the second barrier layer, a second capping layer on the second free magnetization layer, and a second MTJ terminal coupled to the second capping layer; and a third MTJ terminal coupled to the bottom electrode layer.

Example methods according to one or more exemplary embodiments can include injecting a first write current from one of a first MTJ terminal and a base MTJ terminal to the other of the first MTJ terminal and the base MTJ terminal, the first write current passing through a first free magnetization layer, and injecting a second write current from one of a second MTJ terminal and the base MTJ terminal to the other of the second MTJ terminal and the base MTJ terminal, the second write current passing through a second free magnetization layer, detecting an electrical resistance of the first free magnetization layer, and detecting an electrical series electrical resistance of the first free magnetization layer in series with the second free magnetization layer. In an aspect, methods according to one or more exemplary embodiments can include detecting an electrical resistance of the second free magnetization layer based on a result of the detecting the electrical resistance of the first free magnetization layer and a result of the detecting the series electrical resistance of the first free magnetization layer in series with the second free magnetization layer.

Methods according to one or more exemplary embodiments can, in one or more aspects, include detecting the electrical resistance of the first free magnetization layer by injecting a first read current from one of the first MTJ terminal and the base MTJ terminal to a current sink coupling to the other of the first MTJ terminal and the base MTJ terminal, the first read current passing through the first free magnetization layer, and can perform detecting the series electrical resistance of the first free magnetization layer in series with the second free magnetization layer by injecting a second read current from one of the first MTJ terminal and the second MTJ terminal to a current sink coupled to the other of the first MTJ terminal and the second MTJ terminal, the second read current passing through the first free magnetization layer and passing through the second free magnetization layer.

Methods according to one or more exemplary embodiments can provide an MTJ memory storage of a multi-bit data, and can include storing a first bit by injecting a first write current, based on the first bit, from one of a first MTJ terminal and a base MTJ terminal to the other of the first MTJ terminal and the base MTJ terminal, the first write current passing through a first free magnetization layer to place the first free magnetization layer in a state indicating the first bit, and storing a second bit by injecting a second write current, based on the second bit, from one of a second MTJ terminal and the base MTJ terminal to the other of the second MTJ terminal and the base MTJ terminal, the second write current passing through a second free magnetization layer to place the second free magnetization layer in a state indicating the second bit.

Methods according to one or more exemplary embodiments include reading the first bit by injecting a first read current from one of the first MTJ terminal and the base MTJ terminal to a current sink coupled to the other of the first MTJ terminal and the base MTJ terminal, the first read current passing through the first free magnetization layer to form a first bit sense voltage, and detecting the first bit by comparing the first bit sense voltage to a first bit threshold, and reading the second bit by forming a second bit sense voltage indicative of a combination of the magnetization state of the first free magnetization layer and the magnetization state of the second free magnetization layer, by injecting second read current from one of the first MTJ terminal and the second MTJ terminal to a current sink coupled to the other of the first MTJ terminal and the second MTJ terminal, the second read current passing through the first free magnetization layer and passing through the second free magnetization layer, and detecting the second bit by comparing a result of the of forming the second bit sense voltage to a second bit threshold.

Example MTJ memory apparatus according to one embodiment can include means for injecting a first write current from one of a first MTJ terminal and a base MTJ terminal to the other of the first MTJ terminal and the base MTJ terminal, the first write current passing through a first free magnetization layer, and means for injecting a second write current from one of a second MTJ terminal and the base MTJ terminal to the other of the second MTJ terminal and the base MTJ terminal, the second write current passing through a second free magnetization layer.

Example methods for MTJ memory according to one exemplary embodiment can include step of injecting a first write current from one of a first MTJ terminal and a base MTJ terminal to the other of the first MTJ terminal and the base MTJ terminal, the first write current passing through a first free magnetization layer; step of injecting a second write current from one of a second MTJ terminal and the base MTJ terminal to the other of the second MTJ terminal and the base MTJ terminal, the second write current passing through a second free magnetization layer, step of detecting an electrical resistance of the first free magnetization layer, and step of detecting an electrical series electrical resistance of the first free magnetization layer in series with the second free magnetization layer.

BRIEF DESCRIPTION OF THE DRAWINGS

The accompanying drawings found in the attachments are presented to aid in the description of embodiments of the invention and are provided solely for illustration of the embodiments and not limitation thereof.

FIGS. 2A, 2B, and 2C show a two terminal resistance aspect of the FIG. 1 multi-terminal, multi-free layer MTJ structure according to one exemplary embodiment at, respectively, each of a first, second, and third set of magnetization states for storage processes according to various exemplary embodiments.

FIGS. 10A and 10B show example write current flows for writing, respectively, a first free magnetization layer and a second free magnetization layer according to a three-terminal aspect of the FIG. 8 MTJ structure according to one exemplary embodiment.

FIGS. 11A and 11B show, respectively, one individual free magnetization layer read phase and one multi-free layer read phase in one multi-step, three terminal read aspect in relation to the FIG. 8 multi-free layer MTJ structure according to one exemplary embodiment.

FIGS. 15A, 15B, and 15C show a two terminal resistance aspect of the FIG. 14 example multi-free layer MTJ structure according to one exemplary embodiment at, respectively, each of a first, second, and third set of magnetization states FIGS. 16A and 16B show example write current flows for writing, respectively, a first free magnetization layer and a second free magnetization layer of the FIG. 14 example multi-free layer MTJ structure, in a method according to one exemplary embodiment.

FIGS. 17A and 17B show, respectively, one individual free magnetization layer read phase and one multi-free layer read phase, in a multi-step, three terminal read aspect in relation to the FIG. 14 multi-free layer MTJ structure, according to one exemplary embodiment.

FIGS. 21A, 21B, and 21C show a two terminal resistance aspect of the FIG. 20 multiple pillar, common bottom electrode layer, multi-free layer MTJ structure according to one exemplary embodiment, at, respectively, each of a first, second, and third set of magnetization states.

FIGS. 23A and 123B show, respectively, one individual free magnetization layer read phase and one multi-free layer read phase in a multi-step, three terminal read aspect in relation to the FIG. 20 multiple pillar, common bottom electrode layer, multi-free layer MTJ structure according to one exemplary embodiment.

FIGS. 27A, 27B, and 27C show a two terminal resistance aspect of the FIG. 26 example multiple pillar, multi-free layer MTJ structure according to one exemplary embodiment at, respectively, each of a first, second, and third set of magnetization states, for storage according to various exemplary embodiments.

FIGS. 32A, 32B, 32C and 32D show four possible sets of free-layer magnetization states for one two layer example of one multi-free layer, in-plane MTJ structure according to one exemplary embodiment, with corresponding write current directions and resulting resistances.

FIGS. 44A, 44B, and 44C show the FIG. 43 example two-terminal, multiple pillar, at an example first, second, and third set of magnetization states, respectively, that can be formed during a statistical, feedback converging writing process according to one exemplary embodiment.

DETAILED DESCRIPTION

Figure 1:
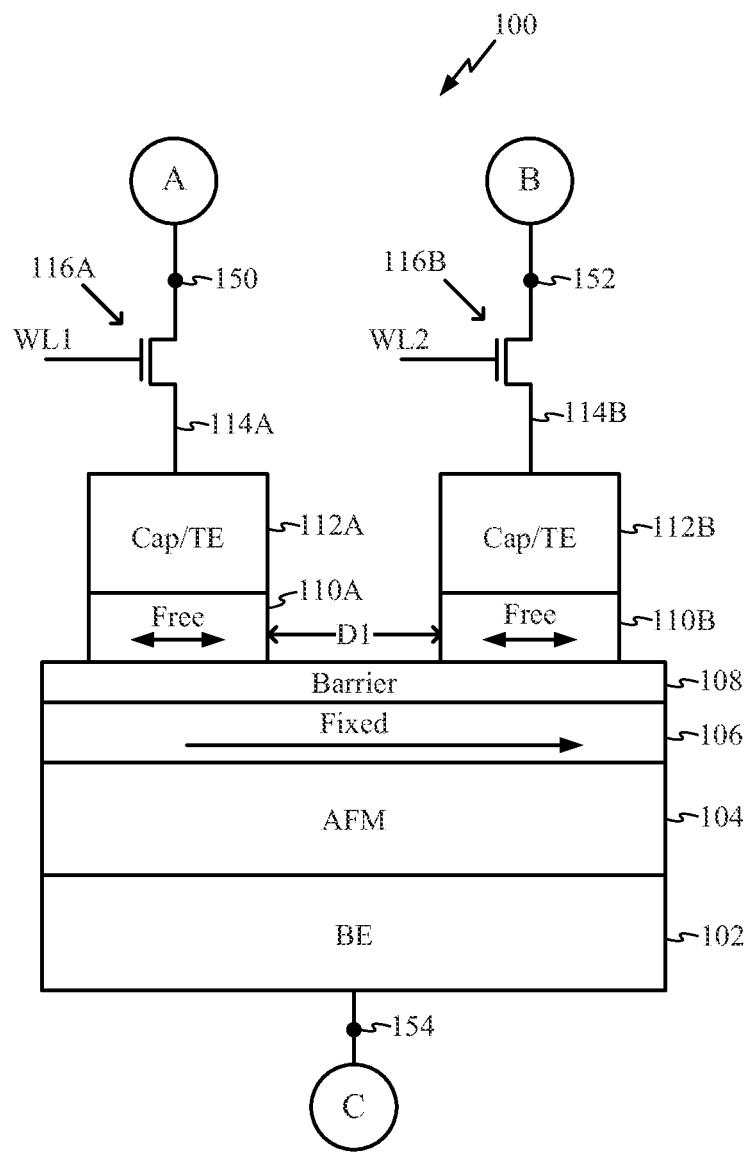
FIG. 1 shows one multi-terminal, multi-free layer MTJ structure according to one exemplary embodiment.

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields, electron spins particles, electrospins, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

FIG. 1 shows one multi-terminal, multi-free layer MTJ structure 100 according to one exemplary embodiment. Referring to FIG. 1, the multi-terminal, multi-free layer MTJ structure 100 can include a bottom electrode layer 102 supporting an antiferromagnetic (AFM) layer 104 which in turn can support a fixed layer 106 with a barrier layer 108 formed on the fixer layer 106. In an aspect the barrier layer 108 supports a first free magnetization layer 1100A and a second free magnetization layer 110B, laterally displaced from the first free magnetization layer 110A by a spacing D1. D1 can be close to minimal conventional MTJ size, and it will be understood by persons of ordinary skill in the MTJ art having view of the present disclosure that minimal conventional MTJ size can depend on the application and on particular MTJ technology selected for the implementation. For purposes of illustration, and without limitation on the numerical value of D1 or of any other parameter that can be used in practices according to the exemplary embodiments, example values of D1 can be 40 nm for 40 nm MTJ technology or 28 nm for 28 nm MTJ technology, it can be 40 nm or 28 nm for 40 nm or 28 nm technology.

Referring still to FIG. 1, a first capping/top electrode layer 112A can be disposed on or above the first free magnetization layer 110A and, similarly, a second capping/top electrode layer 112B can be disposed on or above the second free magnetization layer 110B. The first capping/top electrode layer 112A can couple to a first terminal 114A that can, in an aspect, switchably couple through a first word line switch 116A to a first MTJ cell read/write terminal 150, in turn coupled to an external coupling "A." The external coupling A may, for example, be a bit line/select line capable of being driven by a read current source (not shown) and a write current source (not shown). The first capping/top electrode layer 112B can couple to a second terminal 114B that can, in an aspect, switchably couple through a second word line switch 116B to a second MTJ cell read/write terminal 152 coupled, in turn to an external coupling "B." The coupling B may, for example, be another bit line/select line capable of being driven by the read current source and the write current source. The bottom electrode layer 102 can couple to a third MTJ cell read/write terminal 154. A bit select line (shown as point "C") can couple to the third MTJ cell read/write terminal 154. In one embodiment, described in greater detail at later sections, another switch (not shown in FIG. 1) can be arranged to switchably establish a current path from the bottom electrode layer 102, through the third MTJ cell read/write terminal 154 to a ground reference or other current sink (not shown in FIG. 1), i.e., to connect "C" to ground.

Continuing to refer to FIG. 1, the first word line switch 116A and the second word line switch 116B can be implemented by, for example, an NMOS FET. In an aspect, a first word line WL1 can control the first word line switch 116A and a second word line WL2 can control the second word line switch 116B. In one aspect, described in greater detail at later sections, the WL1 and WL2 signals can control establishment of read current paths according to a sequence, as well as current paths for a write current source (not shown) coupled to the capping/top electrode layer 112A or 112B.

Referring still to FIG. 1, as previously described the first free magnetization layer 110A is spaced from the second free magnetization layer 110B by lateral distance D1 and, because of D1 being short (, for example, without limitation, from approximately a one or more tens of nanometers to one or more hundreds of nanometers), polarization is maintained in the fixed layer 106. Also, the double MTJ increases tunneling magnetoresistance (TMR) and the difference between Rp and Rap (alternatively referenced as "delta R"). Therefore, as will be appreciated by persons of ordinary skill in the art from reading this disclosure, the FIG. 1 structure can provide for low-error read sensing.

FIGS. 2A, 2B, and 2C shows a two terminal resistance aspect of the FIG. 1 multi-terminal, multi-free layer MTJ structure 100 according to one exemplary embodiment at each of a first, second, and third set, respectively, of magnetization states. It will be understood that "magnetization state" means the alignment (parallel (P) or anti-parallel (AP)) of the first and second free magnetization layers 110A and 110B with respect to the alignment of the fixed layer 106. The "two-terminal" resistance aspect refers to the resistance along the READ path between the FIG. 1 first and second MTJ cell read/write terminals 150 and 152 when the third MTJ cell read/write terminal 154 is floating. As will be described in greater detail at later sections, the FIG. 1 multi-terminal, multi-free layer MTJ structure 100 is, in one aspect, capable of a three-terminal mode. The FIG. 2A state is both of the first and second free magnetization layers 110A and 110B being in a parallel (P) alignment with respect to the fixed layer 106. As shown, the resulting resistance through the READ path is approximately two times Rp. The FIG. 2B state is the first free magnetization layer 110A being in an AP alignment and the second free magnetization layer 110B being in a P alignment. Assuming Rap is approximately twice Rp, the resistance of the READ path is approximately three times Rp. Method for selectively writing the first and second free magnetization layers 110A and 110B into any of the FIG. 2A, 2B or 2C magnetization states will be described in greater detail in reference to FIGS. 3A and 3B.

Figures 3A, 3B:
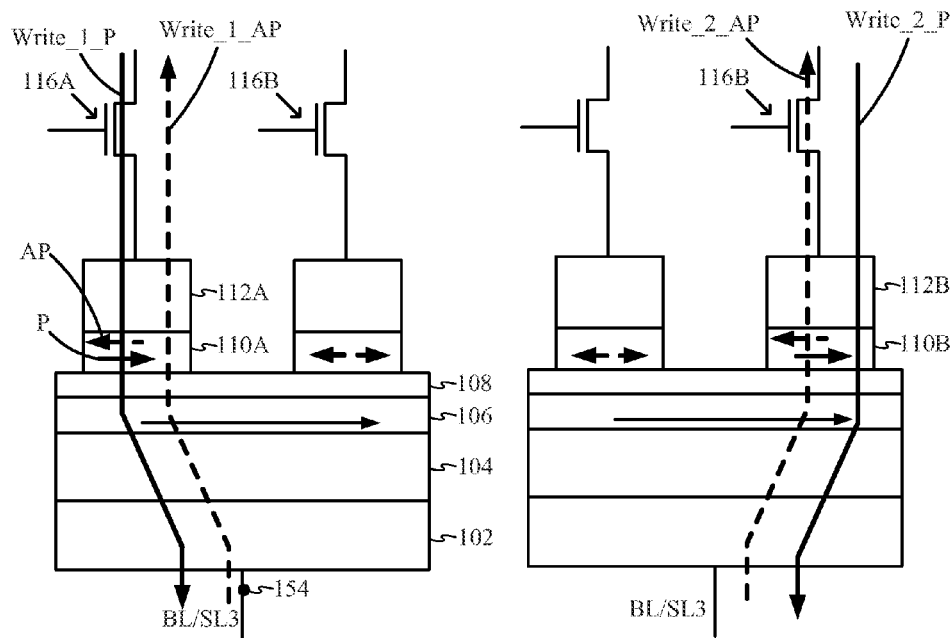
FIGS. 3A and 3B show example write current flows for writing, respectively, a first free magnetization layer and a second free magnetization layer of the FIG. 1 multiple terminal, multi-free layer MTJ structure, in a method according to one exemplary embodiment.

FIGS. 3A and 3B show example write current flows for writing a first free magnetization layer and a second free magnetization layer, respectively, of the FIG. 1 multiple terminal, multi-free layer MTJ structure, in a method according to one exemplary embodiment. Referring to FIG. 3A, the writing is performed by switching the first word line switch 116A ON to couple the first MTJ cell read/write terminal 150 (or the first capping/top electrode layer 112A to a write current source and, concurrently, coupling the third MTJ cell read/write terminal 154 to a ground reference or equivalent current sink. If the write current is the depicted direction of the Write_1_P current, the first free magnetization layer 110A switches to a P state, as shown by the solid magnetization arrow in the first free magnetization layer 110A. If, on the other hand, the write current is in the depicted Write_1_AP direction, the first free magnetization layer 110A switches to the AP state, as shown by the dashed line the first free magnetization layer 110A. Referring to FIG. 3B, writing the second free magnetization layer 110B can be performed by switching the second word line switch 116B ON to couple terminal "B" to the write current source, while coupling the third MTJ cell read/write terminal 154 to a ground reference or equivalent current sink. If the write current is the depicted direction of the Write_2_P current, the second free magnetization layer 110B switches to a P state, as shown by the solid magnetization arrow in the second free magnetization layer 110B. However, of the write current is in the depicted Write_2_AP direction, the second free magnetization layer 110B switches to the AP state, as shown by the dashed line in the second free magnetization layer 110B.

Figures 4A, 4B:
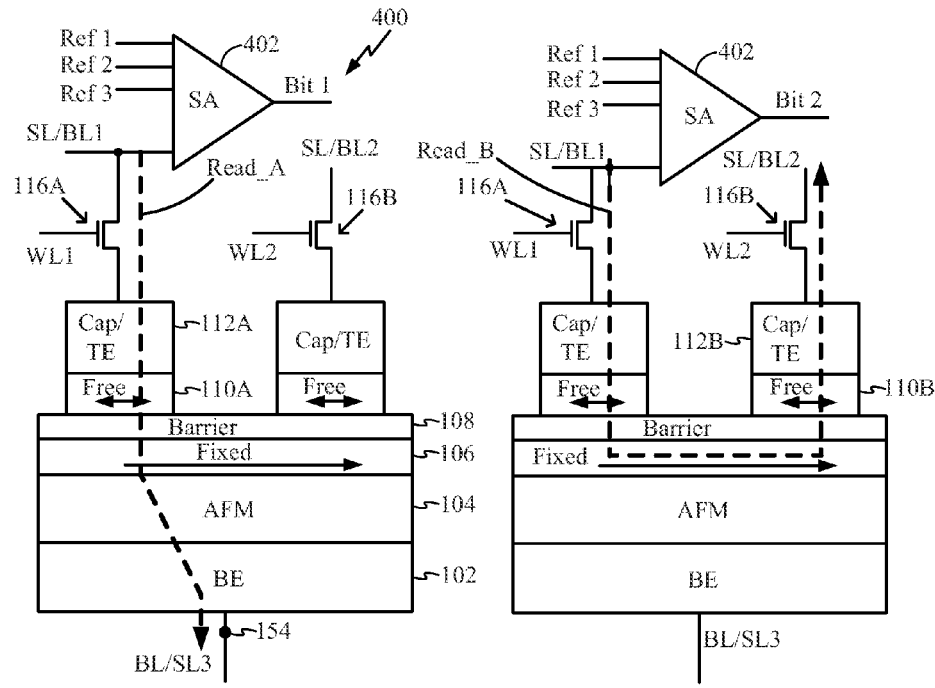
FIGS. 4A and 4B show, respectively, one individual free magnetization layer read phase and one multi-free layer read phase of a two-phase, three-terminal multi-level read circuit in accordance with one exemplary embodiment.

FIGS. 4A and 4B show one individual free magnetization layer read phase and one multi-free layer read phase, respectively, of a two-phase, three-terminal multi-level read circuit 400 aspect in accordance with one exemplary embodiment. To focus on novel concepts without introducing complexity not integral to the concepts, the two-phase, three-terminal multi-level read circuit 400, and example operations further to various embodiments, are described in arrangement utilizing the FIG. 1 example multi-terminal, multi-free layer MTJ structure 100.

Referring to FIG. 4A, the first phase couples the bit line "SL/BL1" to a read current source (not shown), with word line signal WL1 switching the word line switch 116A ON, and word line signal WL2 switching the word line switch 116B OFF. In an aspect bit line/select line BL/SL3 is coupled by, for example an address logic (not shown), and to a ground reference or equivalent current sink (not shown). The result is the read current READ_A passing, according to one example read current polarity, through the MTJ established by the first free magnetization layer 110A separated by the common barrier layer 108 from the common fixed layer 106, then passing through the common AFM layer 104, through the common BE layer 102, and through the bottom terminal 154 to BL/SL3 that, as described above, can be coupled to a ground reference. It will be understood that the direction of the above-described path for the read current READ_A assumed a read polarity of applying the read voltage at SL/BL1 and the ground/current sink at BL/SL3. The direction of the read current READ_A can, of course, be reversed by using a read polarity that applies the read voltage at BL/SL3 and the ground/current sink at SL/B 1.

Referring now to FIG. 4B, further to one aspect the second phase maintains the bit line "SL/BL1" coupled to a read current source (not shown), and word line signal WL1 maintains the word line switch 116A ON, while word line signal WL2 switches the word line switch 116B ON. In an aspect, SL/BL2 is coupled by, for example, a bit line logic (not shown) to ground or an equivalent current sink, and BL/SL3 is uncoupled from the ground reference or equivalent current sink to which it was coupled during the FIG. 4A first phase. The result is the read current READ_B passing from the bit line BL, through the first MTJ cell read/write terminal 150, through the first capping layer/top electrode layer 112A, through the previously described MTJ established by the first free magnetization layer 110A separated by the common barrier layer 108 from the common fixed layer 106, then laterally across the short distance (shown as "D1" in FIG. 1) through common barrier layer 108 to the region under the common barrier layer 108 under the second free magnetization layer 110B, then up though the MTJ established by the second free magnetization layer 110B separated by the common barrier layer 108 from the common fixed layer 106, up through the second capping/top electrode layer 112B, through the second word line switch 116B to the second MTJ cell read/write terminal 152 ground. The READ_B current forms an SL/BL1 sense voltage that is based on the series resistance of the above-described MTJs, namely the MTJ established by the first free magnetization layer 110A separated by the common barrier layer 108 from the common fixed layer 106, and the MTJ established by the second free magnetization layer 110B laterally displaced from the first free magnetization layer 110A and separated by the common barrier layer 108 from the common fixed layer 106. As was described for the read current READ_A in reference to FIG. 4A, the path for the read current READ_B described assumes the read voltage is applied at SL/BL1 and the ground/current sink at SL/BL2. A reverse direction of the read current READ_B can obtained by applying the read voltage at SL/BL2 and the ground/current sink at SL/BL1.

Supply of the reference voltages Ref 1, Ref 2, and Ref 3, and operations of the sense amplifier (SA) 402 according to various exemplary embodiment in detecting the magnetization states of the first and second free magnetization layers 110A and 110B will now be described. In one aspect, the sense amplifier 402 is configured to compare the SL/BL1 sense voltage to Ref 1 during the FIG. 4A first phase and, based on the comparison, to detect the state of the first free magnetization layer 110A. In an aspect, this detection can be provided by setting Ref 1 at the midpoint between the nominal sense voltage of "SL/BL1" resulting from the read current READ_A when the first free magnetization layer 110A is at the P state, as opposed to the nominal sense voltage at "SL/BL1" when in the AP state. Further to this aspect, the SA 402 can be configured to generate, as Bit 1 of the two-bit state, a "1" if the SL/BL1 sense voltage is greater than Ref 1, and a "0" if the SL/BL1 sense voltage is less than Ref 1.

Referring to FIG. 4B it can be seen that the SL/BL2 sense voltage from the READ_B will have one of four possible values. Assuming the magnitude of READ_B is the same as READ_A, all four of the possible values will be higher than the FIG. 4A SL/BL1 sense voltage. A first pair of these four possible READ_B SL/BL2 sense voltages will be formed in response to the second free magnetization layer 110B being in a P or AP state when the first free magnetization layer 110A is in the P state. The second pair of these four possible READ_B SL/BL2 sense voltages will be formed in response to the second free magnetization layer 110B being in a P or AP state when the first free magnetization layer 110A is in the AP state. In one aspect, detecting between the first pair of possible READ_B SL/BL2 sense voltages can be provided by setting Ref 2 at the midpoint between the first pair, and detecting between the second pair of possible READ_B SL/BL2 sense voltages can be provided by setting Ref 3 at the midpoint between that second pair of the four possible voltages. In a further aspect, the SA 402 can be configured to select Ref 2 as the comparison voltage for the FIG. 4B second phase, in response to the FIG. 4A first phase detecting the first free magnetization layer 110A being at the state. In other words, if the FIG. 4A first phase resulted in SA 402 generating a "0" as Bit 1, as the least significant bit of the two-bit state, then Ref 2 is used to determine Bit 2, the most significant bit. On the other hand, if the FIG. 4A first phase resulted in SA 402 generating a Bit 1 of "1" then Ref 3 is used to determine Bit 2. Accordingly, with Ref 1, Ref 2 and Ref 3 as described, the two-phase, three terminal read shown by FIGS. 4A and 4B can resolve the following four storage Bit 2, Bit 1 states, represented by the P or AP magnetizations of the first free magnetization layer 110A and 110B: "00," "01," "10," and "11." It will be understood that the directions of the read currents READ_A and READ_B are described assuming a particular read voltage polarity, which is not intended to limit the scope of any of the exemplary embodiments. On the contrary, as readily understood by persons of ordinary skill in the MTJ arts having view of the present disclosure, the direction of the read currents READ_A and READ_B can be in part a design choice, and can be readily selected and set-up by such persons applying general MTJ design techniques to the current disclosure.

Referring to FIGS. 3A, 3B, 4A, and 4B, it can be seen that the read path has high R and the write path has a low R. It will be appreciated that the example write and read aspect can apply to, for example, multiple bits or large sensing delta R.

Figure 5:
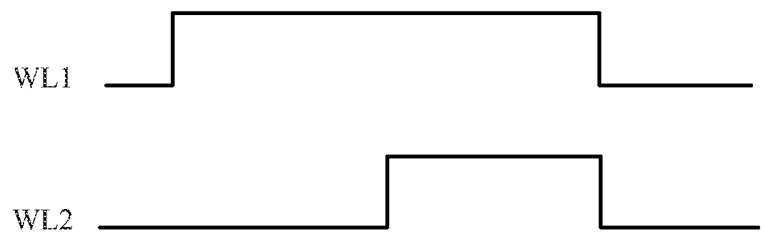
FIG. 5 shows one example read enable control signal waveform for controlling two-phase, three terminal multi-level read circuits in accordance with various exemplary embodiments.

FIG. 5 shows one example word line signal waveform for WL1 and WL2 to control the above-described FIGS. 4A and 4B read processes.

Figure 6:
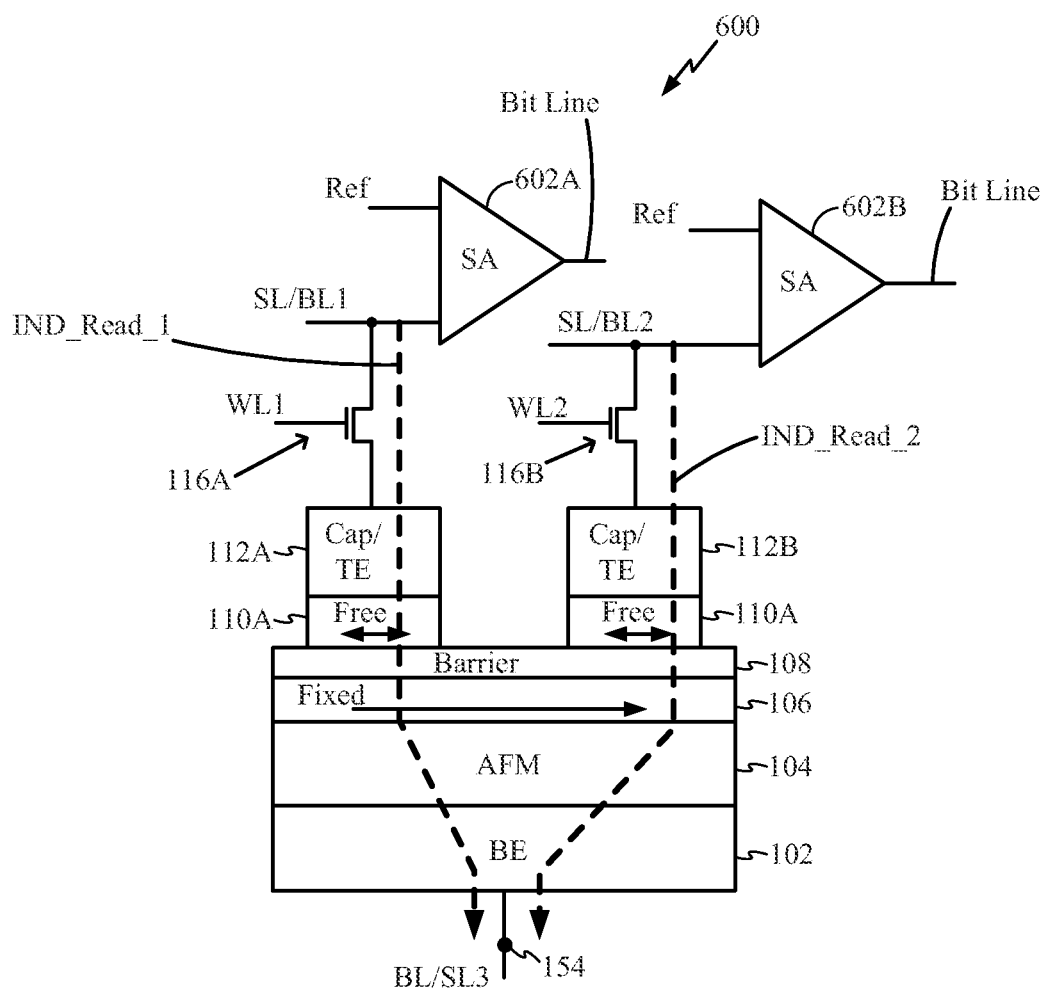
FIG. 6 shows one shows one example multi-free layer, individually readable free magnetization layer MTJ cell according to one three-terminal read aspect.

FIG. 6 shows one example multi-free layer, individually readable free magnetization layer MTJ cell 600 according to one three-terminal read aspect. The FIG. 6 multi-free layer, individually readable free magnetization layer MTJ cell 600 can employ the FIG. 1 multi-terminal, multi-free layer MTJ structure 100. Therefore, to better focus on novel aspects without introduction of details not integral to the inventive concepts, the two-phase, three-terminal multi-level read circuit 400, and example operations further to various embodiments, are described in an arrangement utilizing the FIG. 1 example multi-terminal, multi-free layer MTJ structure 100. It will be understood that this is not intended as a limitation on the scope of any embodiments.

Referring to FIG. 6, the multi-free layer, individually readable free magnetization layer MTJ cell 600 can include a first sense amplifier (SA) 602A to detect the state of the first free magnetization layer 110A and a second SA 602B to detect the state of the second free magnetization layer 110B. In one aspect, both first and second SA 602A and 602B can receive a Ref that is the above-described Ref 1 voltage, the midpoint between the nominal sense voltage resulting from the first and second free magnetization layers 110A and 1010B being at a P state and the nominal sense voltage resulting from the first and second free magnetization layers 110A and 110B being at an AP state.

Referring still to FIG. 6, in an example operation WL1 switches the word line switch 116A ON and, according to one aspect, WL2 concurrently switches the word line switch 116B ON. It is assumed that SL/BL1, coupled through the first MTJ cell read/write terminal 150 and the first word line switch 116A to the first capping/top electrode layer 112A, and SL/BL2, coupled through the second MTJ cell read/write terminal 152 by the second word line switch 116B to the second capping/top electrode layer 112B, are each coupled to a read current source (not shown). Read current IND_Read_1 then passes through the MTJ established by the first free magnetization layer 110A spaced by the common barrier layer 108 above the common fixed layer 106, through the common AFM layer 104, through the common BE layer 102 and third MTJ cell read/write terminal 154 to ground, developing an SL/BL1 sense voltage indicative of the state of the first free magnetization layer 110A. Likewise, IND_Read_2 passes through the MTJ established by the second free magnetization layer 110B spaced, at a location laterally displaced from the first free magnetization layer 110A, by the same common barrier layer 108 above the common fixed layer 106, and though the same common AFM layer 104 and common BE layer 102, through the same third MTJ cell read/write terminal 154 to ground, which develops an SL/BL2 sense voltage indicative of the state of the second free magnetization layer 110B.

The above-described example read operation showed the WL1 switching the first word line switch 116A ON concurrent with WL2 concurrently switching ON the second word line switch 116B. In one alternative aspect, WL1 and WL2 can be sequenced in a sequential or two-phase read operation, where a first phase switches, for example, first word line switch 116A ON while keeping the second word line switch 116B OFF, thereby establishing SL/BL1 sense voltage for reading first free magnetization layer 110A, and a second phase switches the first word line switch 1116A OFF and switching the second word line switch 116B ON, to establish the SL/BL2 sense voltage for reading second free magnetization layer 110B. It will be understood that in this alternative sequential read aspect the order as to which of the first and second word line switches 116A and 116B is switched ON (or OFF) in the first phase and then OFF (or ON) in the second phase and visa a versa is arbitrary. As persons of ordinary skill in the MTJ art will understand from this disclosure, the total read duration may be longer for this sequential read aspect than for the previously described concurrent read aspect. In certain applications, though, the sequential read aspect may, for a given structure and technology, enable or exhibit a higher read accuracy than enabled or exhibited by the concurrent read aspect. For example, it is contemplated that some implementations according to the concurrent read aspect may exhibit, or be analyzed as presenting a potential to exhibit, a possible disturbance of the read voltage from a possible increase in the potential voltage at, or between, one or more of the common fixed layer 106, the common AFM layer 104 and the common BE layer 102.

Figure 7:
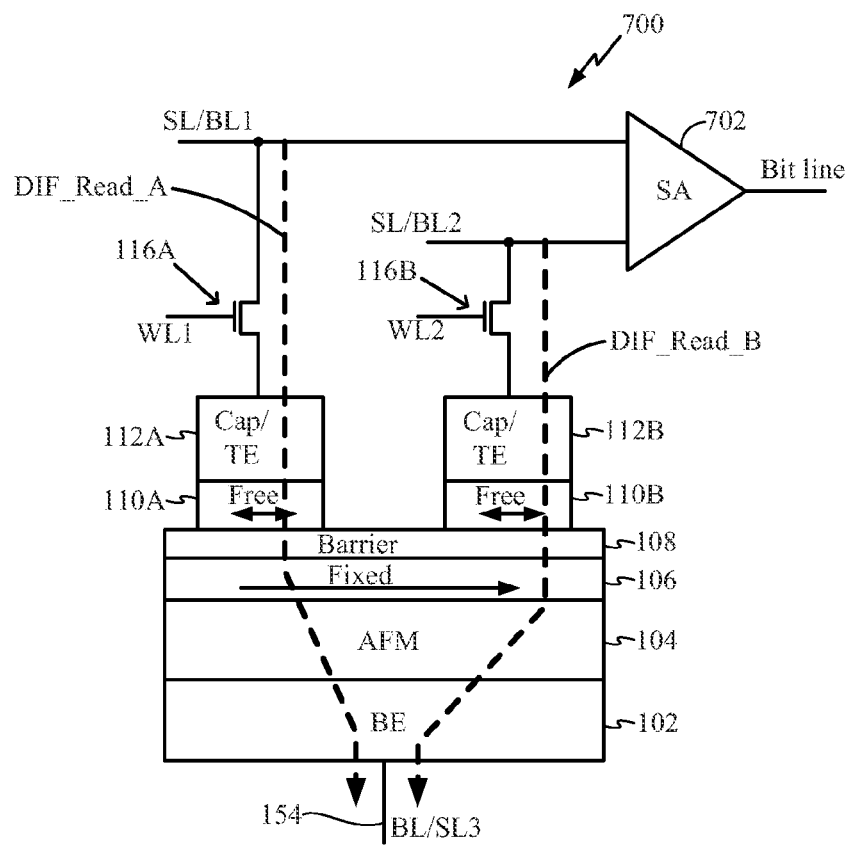
FIG. 7 shows one example multi-free layer, three-terminal differential read MTJ cell according to one exemplary embodiment.

FIG. 7 shows one example multi-free layer differential read MTJ cell 700 according to a further three terminal read aspect. The FIG. 7 multi-free layer differential read MTJ cell 700 can employ the FIG. 1 multiple terminal, multi-free layer MTJ device 100 and is described in such an arrangement to better focus on novel aspects without introduction of details not integral to practicing the inventive concepts. It will be understood that the FIG. 1 multi-terminal, multi-free layer MTJ structure 100 FIG. 1 implementation of the FIG. 7 multi-free layer differential read MTJ cell 700 is only one example, not intended to limit the scope of any embodiments.

In an aspect, a single bit can be written to the FIG. 7 multi-free layer differential read MTJ cell 700 by a write process generally according to the write process described in reference to FIGS. 3A and 3B, with the further feature that the writing injects either Write_1_P or Write_1_AP through first free magnetization layer 110A, and a complementary direction Write_2_AP or Write_2_P through second free magnetization layer 110B, to place the first and second free magnetization layers 110A and 110B in complementary P/AP states. Referring to FIG. 7, as shown by the single SA 702, it will be appreciated that the differential storage and retrieving removes the requirement for a reference cell and, further, may obtain substantially lower bit error rates than readily obtainable using a fixed reference signal.

Figure 8:
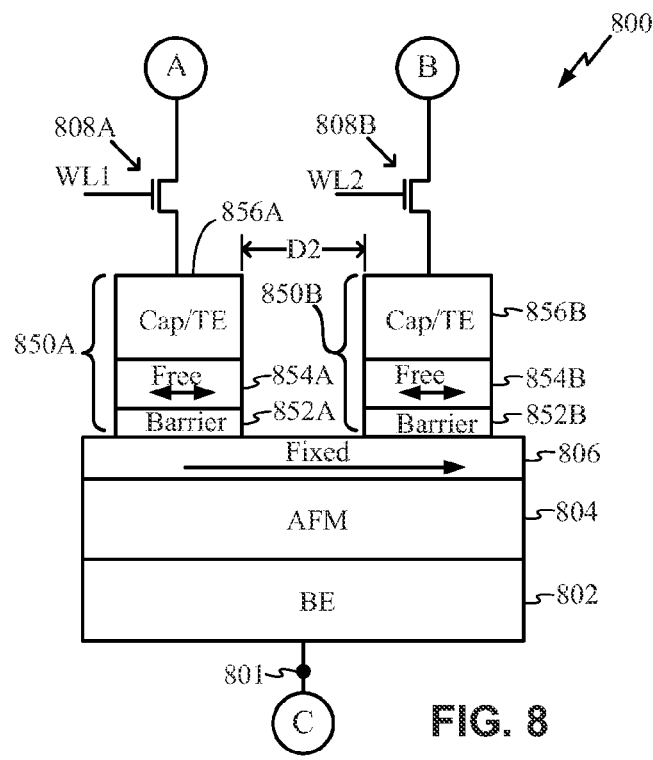
FIG. 8 shows one multi-free layer, separate barrier layer MTJ structure according to another exemplary embodiment.

FIG. 8 shows one multi-free layer, separate barrier layer MTJ device 800 according to one multiple pillar embodiment that can provide multiple parallel MTJs and can have a three-terminal aspect, as one alternative to the FIG. 1 one multi-terminal, multi-free layer MTJ structure 100. Referring to FIG. 8, the multi-free layer MTJ device 800 can include, in bottom-to-top order, a common base electrode layer 802, a common AFM layer 804, and a common fixed layer 806. A bottom electrode or third MTJ cell read/write terminal 801 can couple to a bit line generically represented as "C." A first pillar 850A can be arranged at a first location or first area on the upper surface of the common fixed layer 806 and, at a second location or second area laterally displaced by the distance D2 from the first pillar 850A, a second pillar 850B can be arranged. The distance D2 can be in accordance with D1 described in reference to FIG. 1. First pillar 850A can include a barrier layer 852A as a base, a free magnetization layer 854A on the barrier layer 852A, and a capping/top electrode layer 856A on the free magnetization layer 854A. Second pillar 850B can be identically structured having, in bottom-to-top order starting with a barrier layer 852B that can be its base, a free magnetization layer 854B and a capping/top electrode later 856B. The first pillar 850A's free magnetization layer 854A spaced by the pillar 850A's barrier layer 852A above the common fixed layer 806 form a first MTJ and, similarly, the second pillar 850B's free magnetization layer 854B spaced by the second pillar 850B's barrier layer 852B above the common fixed layer 806 form a second MTJ. In one aspect, the spacing (shown but not separately labeled) between the inner, facing walls of the first and second pillars 850A and 850B can be the same as the "D1" dimension described in reference to the FIG. 1 embodiment.

Figures 9A, 9B, 9C:
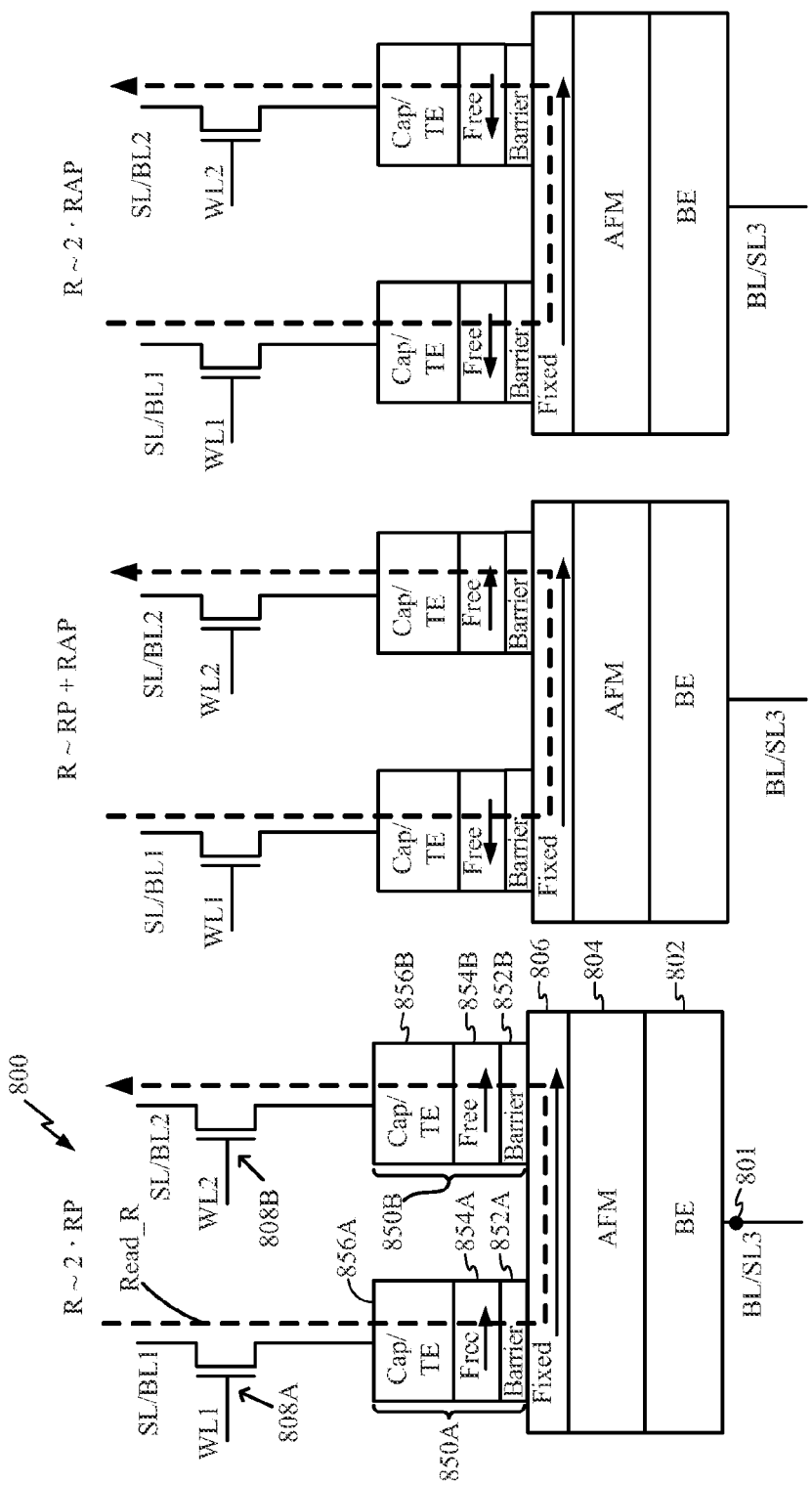
FIGS. 9A, 9B, and 9C a two terminal resistance aspect of the FIG. 8 MTJ structure according to one exemplary embodiment at, respectively, each of a first, second, and third set of magnetization states for storage processes according to various exemplary embodiments.

FIGS. 9A, 9B, and 9C show a two terminal resistance aspect of the FIG. 8 multi-free layer, separate barrier layer MTJ structure 800 according to one exemplary embodiment at each of the first, second, and third set of magnetization states, respectively. The example states represented by FIGS. 9A, 9B and 9C are shown as corresponding to the example states of the FIG. 1 embodiment represented by FIGS. 2A, 2B and 2C and, when WL1 and WL2 switch the word line switches 808A, 808B ON, exhibit substantially the same resistance over the Read_R path, i.e., two-terminal resistance, as previously described. The resistances are marked above FIGS. 9A, 9B and 9C. It will be understood that the direction shown on FIGS. 9A-9B for the Read_R path assumes, arbitrarily, a read polarity applying the read voltage at SL/BL1 and the ground/current sink at SL/BL2. The illustrated direction is only an example, as a reverse direction can be obtained, and used, by applying the read voltage at SL/BL2 and the ground/current sink at SL/BL1.

FIGS. 10A and 10B show example write current flows Write_1_P and Write_1_AP for writing, in the FIG. 10A mode, the free magnetization layer 854A of the first pillar 850A and, in the FIG. 10B mode, write current flows Write_2_P and Write_2_AP for writing the free magnetization layer 854B of the second pillar 850B. The Write_1_P, Write_1_AP, Write_2_P, and Write_2_AP can be as described in reference to the FIGS. 3A and 3B, except for the free magnetization layers 854A and 854B being written to selected ones of the P or AP states, as opposed to FIG. 1 first and second free magnetization layers 110A and 110B.

FIGS. 11A and 11B show, respectively, one individual free magnetization layer read phase and one multi-free layer read phase of a two-phase, three-terminal multi-level read circuit 1100 aspect in accordance with one exemplary embodiment. The two-phase, three-terminal multi-level read circuit 400 can utilize the FIG. 8 example multi-free layer MTJ device 800. In an aspect, the two-phase, three-terminal multi-level read circuit 1100 can include a sense amplifier (SA)1102 that can receive Ref 1, Ref 2 and Ref 3, these being at respective voltages as described for the Ref 1, Ref 2 and Ref 3 received by the SA 402 of the FIGS. 4A and 4B two-phase, three-terminal multi-level read circuit 400.

Referring to FIG. 11A, according to one aspect, in the first phase SL/BL1 is coupled to a read current source (not shown), word line signal WL1 switches the word line switch 808A ON, and word line signal WL2 switches the word line switch 808B OFF. In a further aspect, BL/SL3 is coupled by, for example an address logic (not shown) to a ground reference or equivalent current sink (not shown). The read current READ_A then passes through the MTJ established by the first pillar 850A's free magnetization layer 854A separated, by the first pillar 850A's barrier layer 852A from the common fixed layer 806, and establishes an SL/BL1 sense voltage that, as previously described, the SA 1102 compares to Ref 1. The Bit 1 output of SA 1102 can, in one aspect, be a "0" if the first pillar 850A free magnetization layer 854A is in the P state, and a "1" if it is in the AP state. As previously described, Bit 1 output by SA 1102 can be the least significant, or rightmost bit of a two-bit state Bit 2, Bit 1. The direction shown on FIG. 11A for the read current READ_A assumes, arbitrarily, a read polarity of the read voltage at SL/BL1 and the ground/current sink at SL/BL2. This is only an example, and a reverse direction for READ_A can be obtained, and used, by applying the read voltage at SL/BL2 and the ground/current sink at SL/BL1.

Referring to FIG. 11B, in one aspect the second phase includes WL1 maintaining the word line switch 808A ON, and word line signal WL2 switching the word line switch 808B ON, and BL/SL3 being uncoupled from the ground reference or equivalent current sink to which it was coupled during the FIG. 11A first phase. This establishes a current path for read current READ_B, the path being from SL/BL1, through the first pillar 850A, into the common fixed layer 806, across the distance of approximately D1 through the common fixed layer, and up through the second pillar 850B, through the word line switch 808B, and then to SL/BL2 which, as described above, is grounded. The resistance of the READ_B path is the series resistance of the above-described MTJs, namely the MTJ established by the first pillar 850A's free magnetization layer 854A separated, by the first pillar 850A's barrier layer 852A from the common fixed layer 806, and the MTJ established by the second pillar 850B's free magnetization layer 854B separated, by the second pillar 850B's barrier layer 852A from the common fixed layer 806. This READ_B current forms an SL/BL1 sense voltage indicative of the above-described resistance, and SA 1102 compares this voltage to one of Ref 2 and Ref 3. The comparison generates Bit 2, depending on the FIG. 11A first phase detected state of the free magnetization layer, in other words depending on whether the FIG. 11A first phase Bit 1 output was a "0" or a "1." In an aspect, by the same general concepts as described for the embodiments show at FIGS. 4A and 4B, the sequence of the FIG. 11A first phase and FIG. 11B second phase can resolve the following four storage states, represented by the P or AP magnetizations of the free magnetization layer 854A and 854B: "00," "01," "10," and "11." It will be understood that the direction shown on FIG. 11B for the read current READ_B assumes, arbitrarily, a read polarity of the read voltage at SL/BL1 and the ground/current sink at SL/BL2. This direction is only an example, and a reverse direction for READ_B can be obtained, and used, by applying the read voltage at SL/BL2 and the ground/current sink at SL/BL1.

Figure 12:
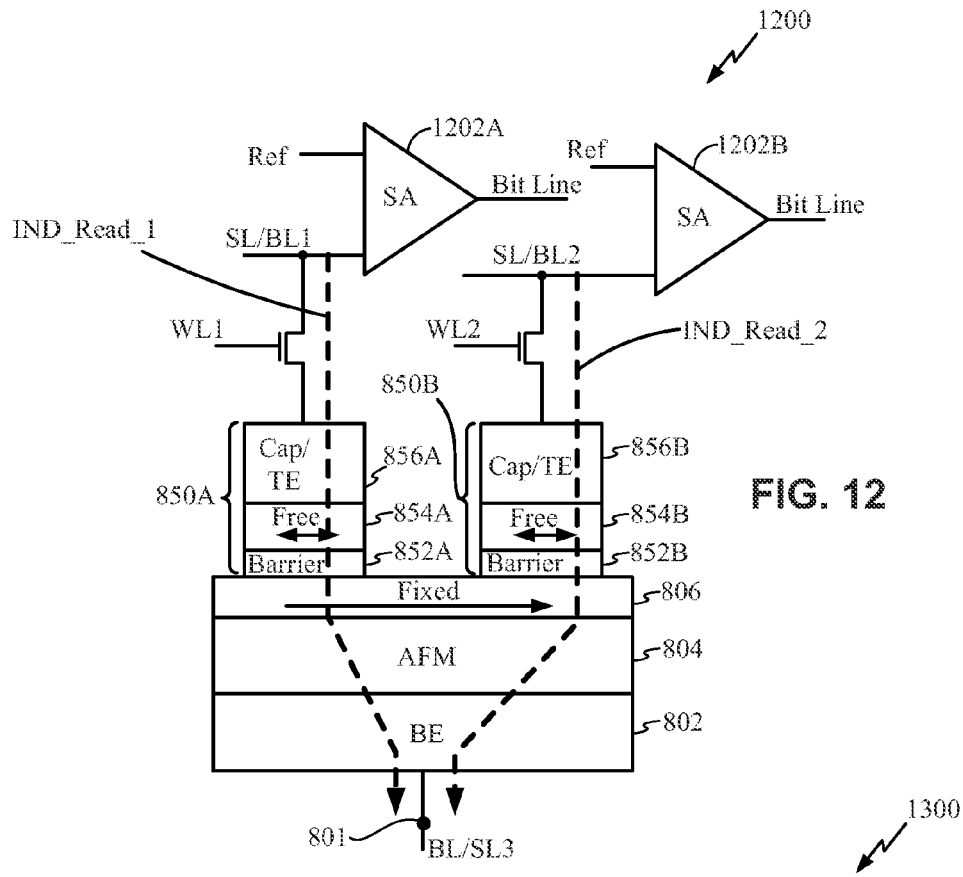
FIG. 12 shows one example multiple individual free magnetization layer read MTJ cell in relation to the FIG. 8 multi-free layer MTJ structure, according to one exemplary embodiment.

FIG. 12 shows one example multi-free layer, individually readable free magnetization layer MTJ cell 1200 according to one three-terminal read aspect that, in the depicted example configuration, can utilize the FIG. 8 multiple terminal, multi-free layer MTJ device 800.

Referring to FIG. 12, the multi-free layer, individually readable free magnetization layer 1200 can include a first sense amplifier (SA) 1202A to detect the state of the first pillar 850A free magnetization layer 854A, and a second SA 1202B to detect the state of the second pillar 850B free magnetization layer 854B. In one aspect, both SA 1202A and 1202B can receive a Ref that is the above-described Ref 1 voltage, the midpoint between the nominal sense voltage resulting from the free magnetization layers 854A and 854B being at a P state and the nominal sense voltage resulting from the free magnetization layers 854A and 854B being at an AP state. Assuming read current sources are coupled to SL/BL1 and SL/BL2 as previously described, in an aspect a read current IND_Read_1 passes through the MTJ established by the first pillar 850A having the free magnetization layer 854A spaced by the first pillar 850A's barrier layer 852A above the common fixed layer 806, which develops an SL/BL1 sense voltage indicative of the state of free magnetization layer 845A. Similarly, IND_Read_2 passes through the MTJ established by the second pillar 850B having the free magnetization layer 854B spaced by the pillar 850B's barrier layer 852B above the common fixed layer 806, which develops an SL/BL2 sense voltage indicative of the state of free magnetization layer 845B. It will be understood that the directions described for the read current IND_Read_1 and IND_Read_2 shown on FIG. 12 assume, arbitrarily, a read polarity applying the read voltage at SL/BL1 and SL/BL2 and the ground/current sink at BL/SL3, and that a reverse direction for either or both of IND_Read_1 and IND_Read_2 can be obtained, and used, by applying an opposite assignment of read voltage and ground/current sink to one or both of SL/BL1 and SL/BL2 with respect to BL/SL3.

Figure 13:
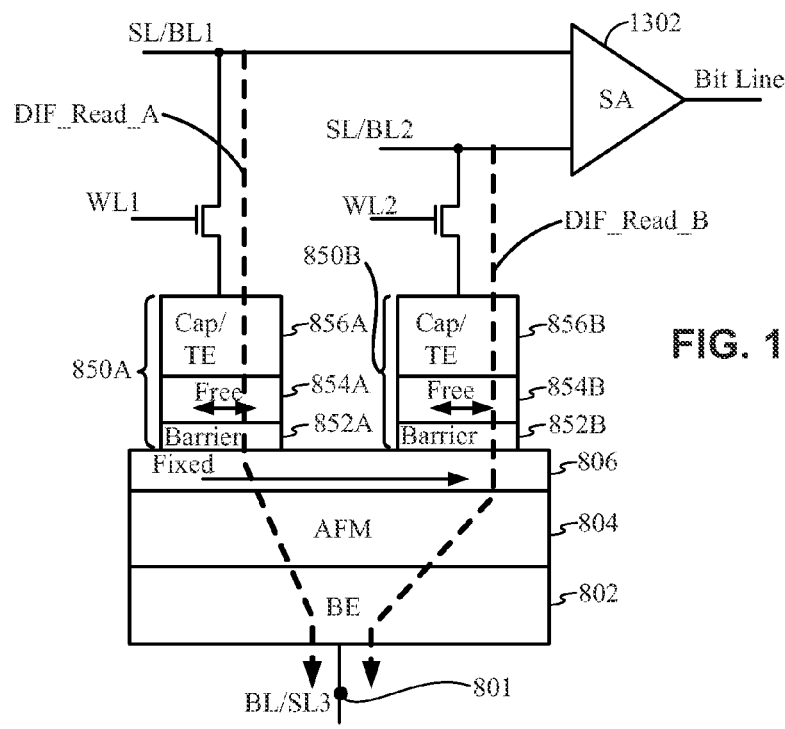
FIG. 13 shows one example multi-free layer differential read MTJ cell according to another three terminal read aspect, employing the FIG. 8 multi-free layer MTJ structure according to one exemplary embodiment.

FIG. 13 shows one example multi-free layer differential read MTJ cell 1300 according to another three terminal read aspect, employing the FIG. 8 multi-free layer MTJ device 800 according to one exemplary embodiment, in a combination with a differential sense amplifier 1302. In an aspect, a general operation of the FIG. 13 multi-free layer differential read MTJ cell 1300 can be according to the general operation described for the FIG. 7 multi-free layer differential read MTJ cell 700.

Figure 14:
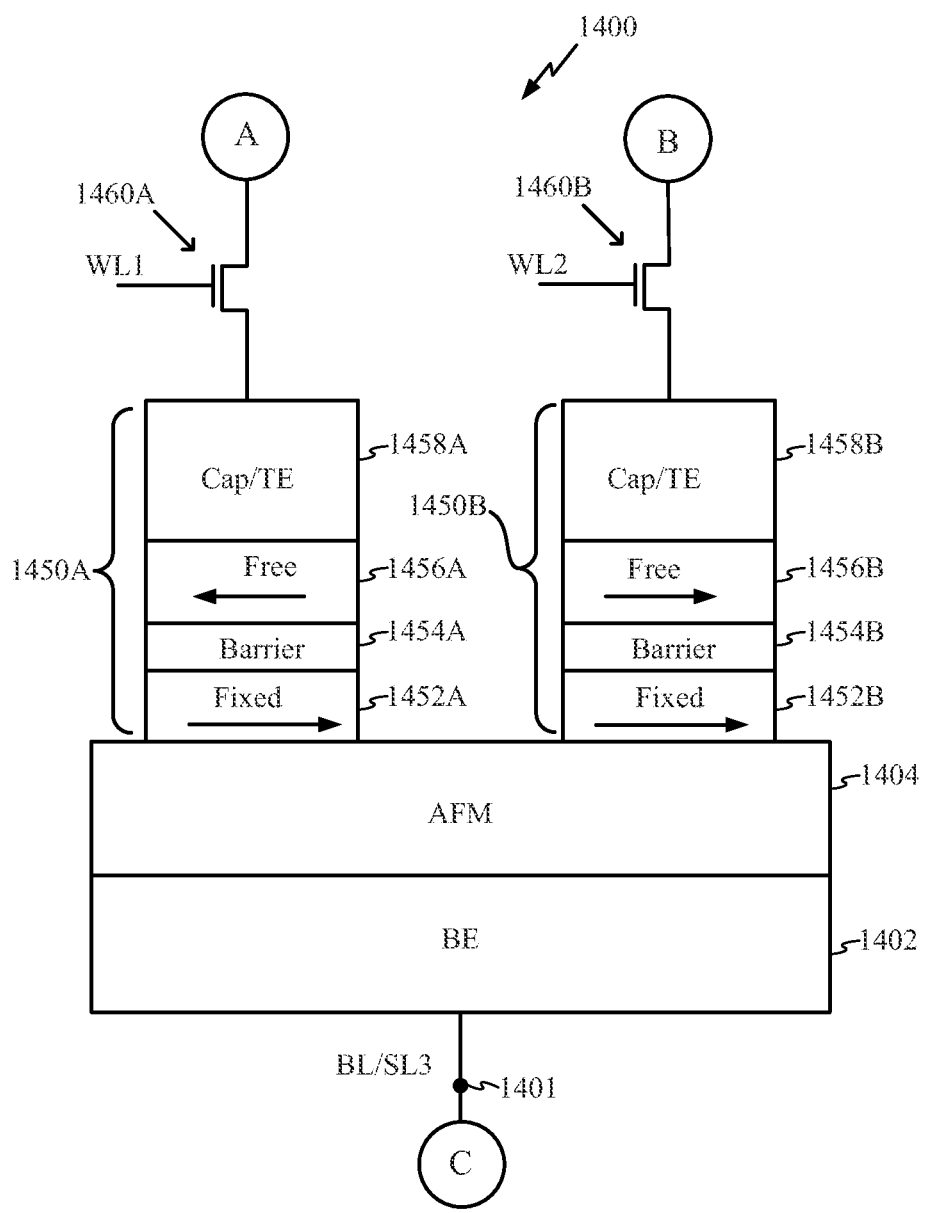
FIG. 14 shows one example multiple pillar, common anti-ferromagnetic (AFM) layer, common bottom electrode layer, multi-free layer MTJ structure according to one exemplary embodiment.

FIG. 14 shows one example multiple pillar, multi-free layer MTJ device 1400 according to one exemplary embodiment that can provide multiple parallel MTJs and can have a three-terminal aspect, as another alternative to the FIG. 1 one multi-terminal, multi-free layer MTJ structure 100, and an alternative to the FIG. 8 multiple pillar, multi-free layer MTJ device 800. In an aspect, the multiple pillar, multi-free layer MTJ device 1400 can include, in bottom-to-top order, a common base electrode layer 1402 and a common AFM layer 1404. A bottom electrode or third MTJ cell read/write terminal 1401 can couple to a bit line generically represented as "C." A first pillar 1450A can be arranged at a first location on the upper surface of the common AFM layer 1404 and, laterally displaced by, for example, the previously described distance D1 from the first pillar 1450A, a second pillar 1450B can be arranged. The first pillar 1450A can include a fixed layer 1452A as a base and, in a bottom-to-top order beginning with a top surface of the fixed layer 1452A, barrier layer 1454A, a free magnetization layer 1456A, and a capping/top electrode layer 1458A. The second pillar 1450B can be identically structured to the first pillar 1450A having, in bottom-to-top order starting with a fixed layer 1452B that can be the base, a barrier layer 1454B, a free magnetization layer 1456B and a capping/top electrode later 1458B. In one aspect, a word line switch 1460A, controlled by word line WL1 couples the capping/top electrode layer 1458A to a generic terminal A, and a word line switch 1460B, controlled by word line WL2, couples the capping/top electrode layer 1458B to a generic terminal B.

Referring FIGS. 1 and 14 together, persons of ordinary skill in the MTJ art having view of the present disclosure may appreciate that in various fabrication processes contemplated by this disclosure that include adapting conventional MTJ fabrication techniques, for example etching, to form devices in accordance with these figures that etching for the FIG. 14 structure may be made simpler because the thickness (shown but not separately labeled) of the AFM layer 1404 can enable its use as an etch stop in an etching of, for example, a fixed layer (not shown) from which fixed layers 1452A and 1452B remain, a barrier layer (not shown) from which barrier layers 1454A and 1454B remain, a free magnetization layer (not shown) from which free magnetization layers 1456A and 1456B remain and, depending on the fabrication process selected, a capping/top electrode layer (not shown) from which capping/top electrode layers 1458A and 1458B remain.

FIGS. 15A, 15B, and 15C show a two terminal resistance aspect of the FIG. 14 multiple pillar, multi-free layer MTJ device 1400 according to one exemplary embodiment at, respectively, each of the first, second, and third set of magnetization states. The example states represented by FIGS. 15A, 15B and 15C are shown as corresponding to the example states of the FIG. 1 embodiment represented by FIGS. 2A, 2B and 2C and, when WL1 and WL2 switch the word line switches 1460A, 1460B ON, exhibit substantially the same resistance over the Read_R path, i.e., the two-terminal resistance, as previously described. The resistances are marked above FIGS. 15A, 15B and 15C. It will be understood that the direction of Read_R path assumes, arbitrarily, a read polarity applying the read voltage at SL/BL1 and the ground/current sink at SL/BL2, and that the reverse direction can be obtained, and used, by applying the read voltage at SL/BL2 and the ground/current sink at SL/BL1.

FIGS. 16A and 16B show example write current flows Write_1_P and Write_1_AP for writing, in the FIG. 16A mode, the free magnetization layer 1456A of the first pillar 1450A and, in the FIG. 16B mode, write current flows Write_2_P and Write_2_AP for writing the free magnetization layer 1456B of the second pillar 1456B. The Write_1_P, Write_1_AP, Write_2_P, and Write_2_AP can be as described in reference to the FIGS. 3A and 3B, except for the free magnetization layers 1456A and 1456B being written to selected ones of the P or AP states, as opposed to FIG. 1 first and second free magnetization layers 110A and 110B.

FIGS. 17A and 17B show, respectively, one individual free magnetization layer read phase and one multi-free layer read phase of a two-phase, three-terminal multi-level read circuit 1700 aspect in accordance with one exemplary embodiment that, in an aspect, can utilize the FIG. 14 example multiple pillar, multi-free layer MTJ device 1400. In an aspect, the two-phase, three-terminal multi-level read circuit can include a sense amplifier (SA) 1702 that can receive Ref 1, Ref 2 and Ref 3, these being at respective voltages as described for the Ref 1, Ref 2 and Ref 3 received by the SA 402 of the FIGS. 4A and 4B two-phase, three-terminal multi-level read circuit 400.

Referring to FIG. 17A, the first phase assumes SL/BL1 is coupled to a read current source (not shown) and, in an aspect, word line signal WL1 switches the word line switch 1460A ON and word line signal WL2 switches the word line switch 1460B OFF. In a further aspect. BL/SL3 is coupled by, for example, an address logic (not shown) to a ground reference or equivalent current sink (not shown). The path for Read current READ_A is therefore established, and READ_A passes through the MTJ established by the first pillar 1450A's free magnetization layer 1456A separated, by the first pillar 1450A's barrier layer 1454A, from the first pillar 1450A's fixed layer 1452, establishes a BL sense voltage. This develops an SL/BL1 sense voltage that, in an aspect, SA 1702 compares to Ref 1. The Bit 1 output of SA 1702 can, in one aspect, be a "0" if the first pillar 1450A free magnetization layer 1456A is in the P state, and a "1" if it is in the AP state. The direction shown on FIG. 17A for the read current READ A assumes, arbitrarily, a read polarity of the read voltage at SL/BL1 and the ground/current sink at SL/BL2. This is only an example, and a reverse direction for READ_A can be obtained, and used, by applying the read voltage at SL/BL2 and the ground/current sink at SL/BL2.

Referring to FIG. 17B, in one aspect the second phase includes WL1 maintaining the word line switch 1460A ON, word line signal WL2 switching the word line switch 1460B ON, and BL/SL3 being uncoupled from the ground reference or equivalent current sink to which it was coupled during the FIG. 17A first phase. The path for the read current READ_B is then established, the path passing from SL/BL1, through the first pillar 1450A, into the common AFM layer 1404, across the distance of approximately D1 through the common AFM layer 1404, and up through the second pillar 1450B, through the word line switch 1460B to SL/BL2 to ground. The resistance of the READ_B path is the series resistance of the above-described MTJs, namely the MTJ established by the first pillar 1450A's free magnetization layer 1456A separated, by the first pillar 1450A's barrier layer 1454A, from the first pillar 1450A's fixed layer 1452A, and the MTJ established by the second pillar 1450B's free magnetization layer 1456B separated, by the second pillar 1450B's barrier layer 1454B, from the second pillar 1450B's fixed layer 1452B. This READ_B current forms an SL/BL1 sense voltage indicative of the above-described series resistance. The FIG. 17B example direction for the read current READ_A assumes, arbitrarily, a read polarity of the read voltage at SL/BL1 and the ground/current sink at SL/BL2. A reverse direction for READ_A can be obtained, and used, by applying the read voltage at SL/BL2 and the ground/current sink at SL/BL1.

Referring still to FIG. 17B, in an aspect SA 1702 compares the above-described SL/BL1 sense voltage resulting from the READ_B current to one of Ref 2 and Ref 3, depending on the FIG. 17A first phase detected state of the free magnetization layer, in other words depending on whether the FIG. 17A first phase output Bit 1 was a "0" or a "1." In an aspect, by the same general concepts as described for the embodiments shown at FIGS. 4A and 4B, and shown at FIGS. 11A and 11B, the sequence of the FIG. 17A first phase and FIG. 17B second phase can resolve and output as Bit 2. Bit 1, the following four storage states represented by the P or AP magnetizations of the free magnetization layers 1456A and 1456B: "00," "01," "10," and "11."

Figure 18:
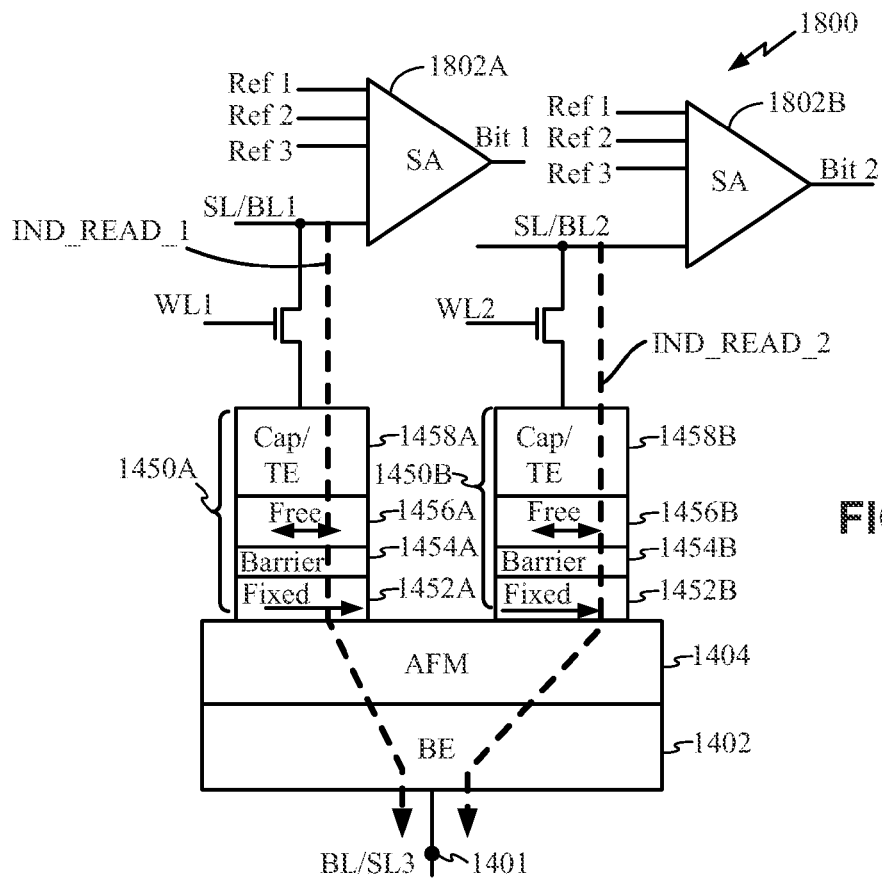
FIG. 18 shows one example multiple individual free magnetization layer read MTJ cell according to one read aspect in relation to the FIG. 14 multi-free layer MTJ structure in a method according to one exemplary embodiment.

FIG. 18 shows one example multi-free layer, individually readable free layer MTJ cell 1800 according to one three-terminal read aspect that, in the depicted example configuration, can utilize the FIG. 14 multiple pillar, multi-free layer MTJ device 1400. The multi-free layer, individually readable free layer MTJ cell 1800 can include a first sense amplifier (SA) 1802A to detect the state of the first pillar 1450A free magnetization layer 1456A, and a second SA 1802B to detect the state of the second pillar 1450B free magnetization layer 1456B. In one aspect, both SA 1802A and 1802B can receive a Ref that is the above-described Ref 1 voltage, the midpoint between the nominal sense voltage resulting from the free magnetization layers 1456A and 1456B being at a P state and the nominal sense voltage resulting from the free magnetization layers 1456A and 1456B being at an AP state. Assuming read current sources are coupled to SL/BL1 and SL/BL2 as previously described, in an aspect a current IND_Read_1 passes through the MTJ established by the first pillar 1450A having the free magnetization layer 1456A spaced by the pillar 1450A's barrier layer 1454A above its fixed layer 1452A, which develops an SL/BL1 sense voltage indicative of the state of free magnetization layer 1456A. Similarly, IND_Read_2 passes through the MTJ established by the second pillar 1450B having its free magnetization layer 1456B spaced by the first pillar 1450B's barrier layer 1452B above its fixed layer 1452B, which develops an SL/BL2 sense voltage indicative of the state of free magnetization layer 1456B. It will be understood that the directions described for the read current IND_Read_1 and IND_Read_2 shown on FIG. 12 assume, arbitrarily, a read polarity applying the read voltage at SL/BL1 and SL/BL2 and the ground/current sink at BL/SL3, and that a reverse direction for either or both of IND_Read_1 and IND_Read_2 can be obtained, and used, by applying an opposite assignment of read voltage and ground/current sink to one or both of SL/BL1 and SL/BL2 with respect to BL/SL3.

Figure 19:
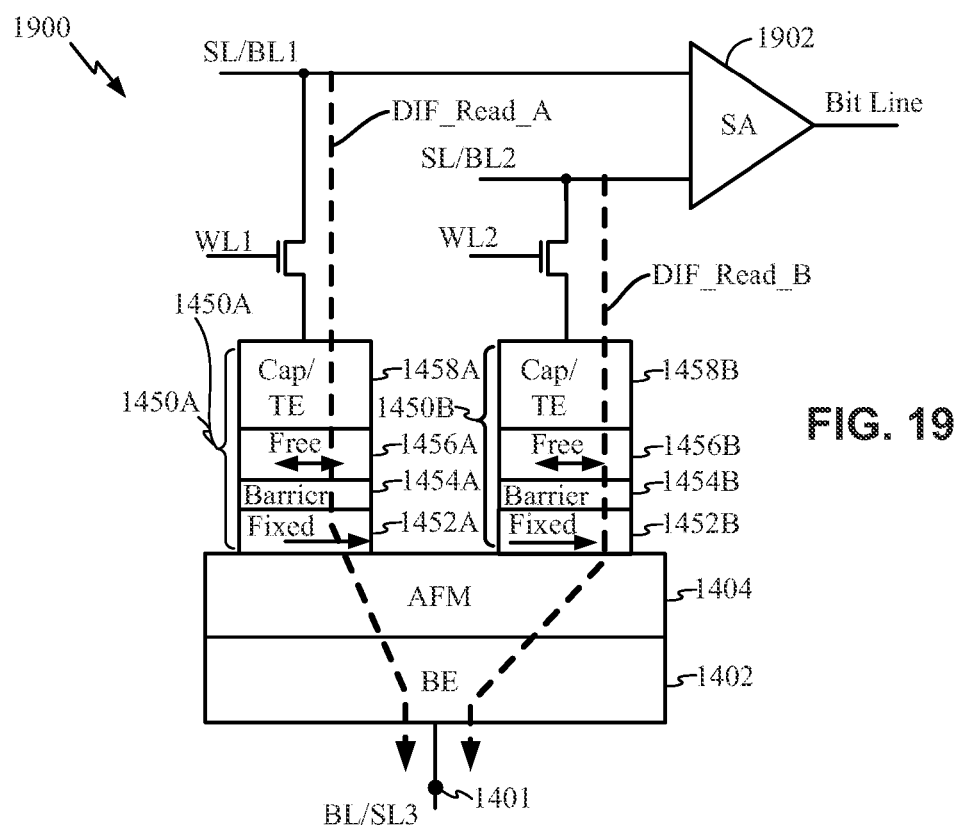
FIG. 19 shows one example multi-free layer differential read MTJ cell according to one three terminal read aspect, in relation to the FIG. 14 multi-free layer MTJ structure according to one exemplary embodiment.

FIG. 19 shows one example multi-free layer differential read MTJ cell 1900 according to another three terminal read aspect, employing the FIG. 14 multiple pillar, multi-free layer MTJ device 1400 according to one exemplary embodiment, in a combination with a differential sense amplifier 1902. In an aspect, a general operation of the FIG. 19 multi-free layer differential read MTJ cell 1900 can be according to the general operation described for the FIG. 7 multi-free layer differential read MTJ cell 700.

Figure 20:
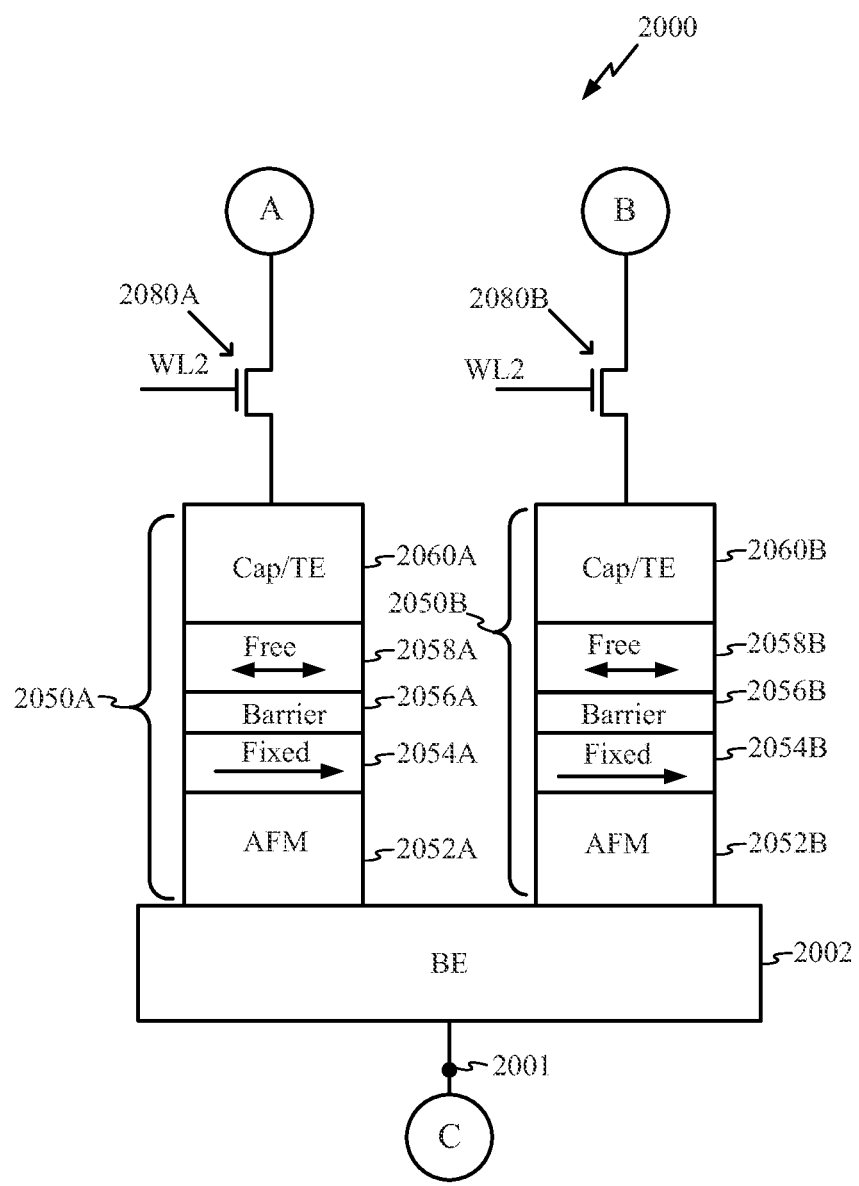
FIG. 20 shows one example multiple pillar, common bottom electrode layer, multi-free layer MTJ structure according to one exemplary embodiment, in an aspect including pillars having a capping layer, free-layer, barrier layer, and AFM layer.

FIG. 20 shows one example multiple pillar, multi-free layer MTJ device 2000 according to one exemplary embodiment that can provide multiple parallel MTJs and can have a three-terminal aspect, as another alternative to the FIG. 1 one multi-terminal, multi-free layer MTJ device 100. The exemplary embodiments shown by the FIG. 20 multiple pillar, multi-free layer MTJ device 2000 can be another alternative to the FIG. 8 multiple pillar, multi-free layer MTJ device 800, and/or to the FIG. 14 multiple pillar, multi-free layer MTJ device 1400.

Referring to FIG. 20, in an aspect the multiple pillar, multi-free layer MTJ device 2000 can include, in bottom-to-top order, a common base electrode (BE) layer 2002 that can couple, for example through a bottom or third MTJ cell read/write terminal 2001, to a bit line generically represent as "C." A first pillar 2050A can be arranged at a first location on the upper surface of the common BE layer 2002 and, laterally displaced by, for example, the previously described distance D1 from the first pillar 2050A, a second pillar 2050B can be arranged. The first pillar 2050A can include an AFM layer 2052A as a base and, in a bottom-to-top order beginning with a top surface of the AFM layer 2052A, a fixer layer 2054A, a barrier layer 2056A, a free magnetization layer 2058A, and a capping/top electrode layer 2060A. The second pillar 2050B can be identically structured to the first pillar 2050A having, in bottom-to-top order starting with an AFM layer 2052B that can be the base, a fixed layer 2054B, a barrier layer 2056B, a free magnetization layer 2058B and a capping/top electrode later 2060B. In one aspect, a word line switch 2080A, controlled by word line WL1 switchably couples the capping/top electrode layer 2060A to a generic terminal A, and a word line switch 2080B, controlled by word line WL2, switchably couples the capping/top electrode layer 2060B to a generic terminal B.

FIGS. 21A, 21B, and 21C show a two terminal resistance aspect of the FIG. 20 multiple pillar, multi-free layer MTJ device 2000 according to one exemplary embodiment at, respectively, each of the first, second, and third set of magnetization states. The example states represented by FIGS. 21A, 21B and 21C are shown as corresponding to the example states of the FIG. 1 embodiment represented by FIGS. 2A, 2B and 2C and, when WL1 and WL2 switch the word line switches 2080A, 2080B ON, exhibit substantially the same resistance over the Read_R path, i.e., a two-terminal resistance, as previously described. The resistances are marked above in FIGS. 21A, 21B and 21C. It will be understood that the direction of Read_R path assumes, arbitrarily, a read polarity applying the read voltage at SL/BL1 and the ground/current sink at SL/BL2, and that the reverse direction can be obtained, and used, by applying the read voltage at SL/BL2 and the ground/current sink at SL/BL1.

Figures 22A, 22B:
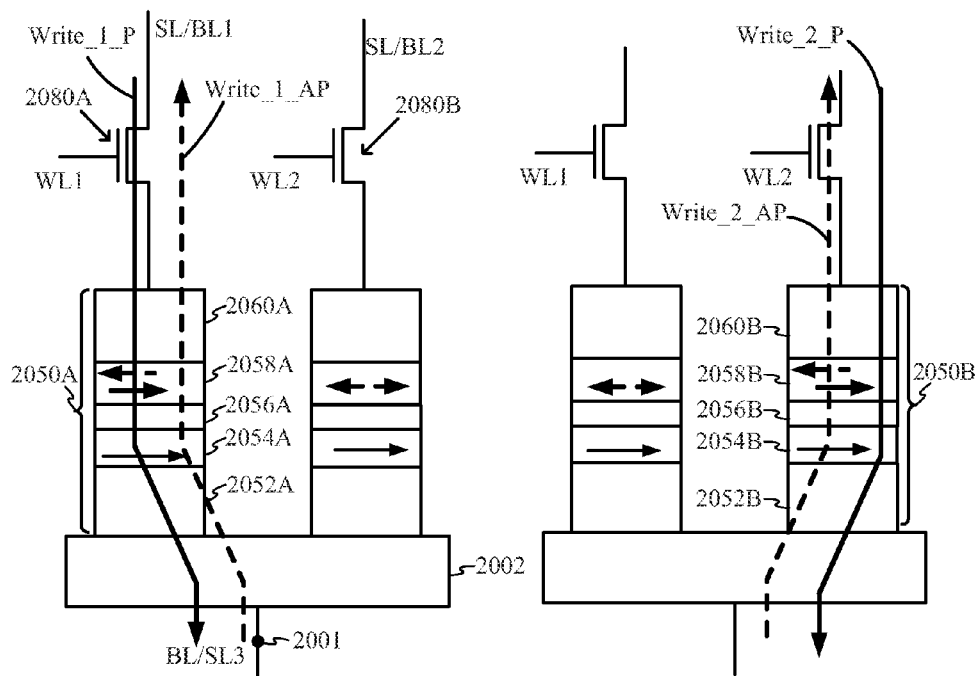
FIGS. 22A and 22B show example write current flows for writing, respectively, a first free magnetization layer and a second free magnetization layer of the FIG. 20 example multiple pillar, common bottom electrode layer, multi-free layer MTJ structure according to one exemplary embodiment, in a writing method according to one exemplary embodiment.

FIGS. 22A and 22B show example write current flows Write_1_P and Write_1_AP for writing, in the FIG. 22A mode, the free magnetization layer 2058A of the first pillar 2050A and, in the FIG. 20B mode, write current flows Write_2_P and Write_2_AP for writing the free magnetization layer 2058B of the second pillar 2050B. The Write_1_P, Write_1_AP, Write_2_P, and Write_2_AP can be as described in reference to the FIGS. 3A and 3B, except for the free magnetization layers 2058A and 2058B being written to selected ones of the P or AP states, as opposed to FIG. 1 first and second free magnetization layers 110A and 110B.

Figures 23A, 23B:
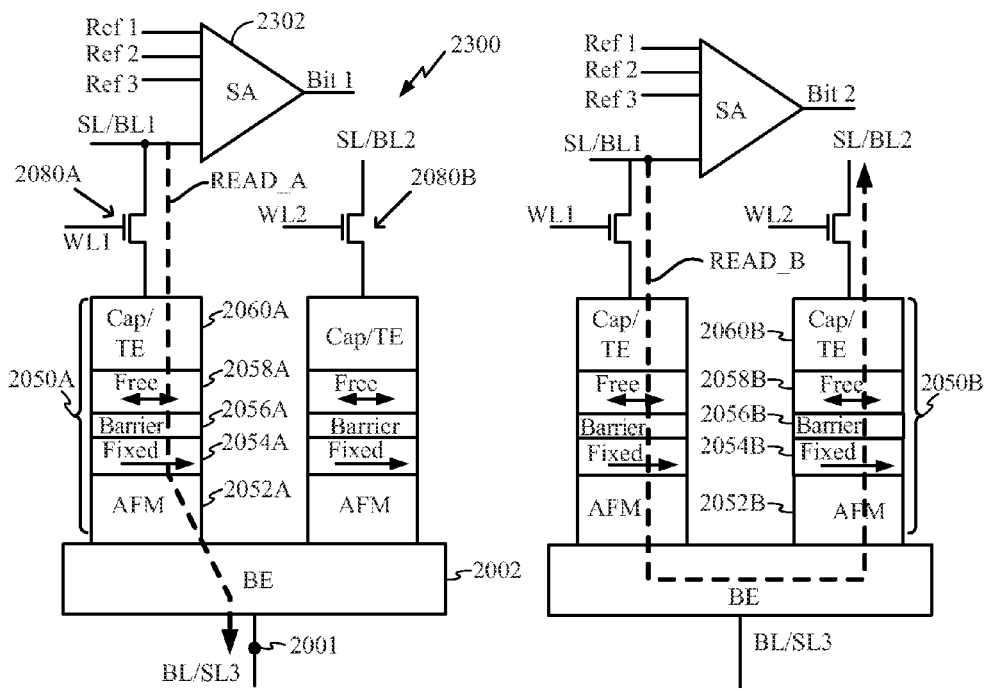

FIGS. 23A and 23B show, respectively, one individual free magnetization layer read phase and one multi-free layer read phase of a two-phase, three-terminal multi-level read circuit 2300 aspect in accordance with one exemplary embodiment that, in an aspect, can utilize the FIG. 20 example multiple pillar, multi-free layer MTJ device 2000. In an aspect, two-phase, three-terminal multi-level read circuit 2300 can include a sense amplifier (SA) 2302 that can receive Ref 1, Ref 2 and Ref 3, these being at respective voltages as described for the Ref 1, Ref 2 and Ref 3 received by the SA 402 of the FIGS. 4A and 4B two-phase, three-terminal multi-level read circuit 400.

Referring to FIG. 23A, the first phase couples SL/BL1 to a read current source (not shown), and with word line signal WL1 switches the word line switch 2080A ON, and with word line signal WL2 switches the word line switch 2080B OFF. In an aspect, during the FIG. 23A first phase, BL/SL3 is coupled by, for example an address logic (not shown) to a ground reference or equivalent current sink (not shown). This establishes a path for read current READ_A, passing through the MTJ established by the first pillar 2050A's free magnetization layer 2058A to develop an SL/BL1 sense voltage that varies based on, and therefore indicates, the magnetization state of the 2050A's free magnetization layer 2058A. In an aspect, during the FIG. 23A first phase, SA 2302 compares the SL/BL1 sense voltage to Ref 1 and can be configured to output, in one aspect, a "0" if the first pillar 2050A free magnetization layer 2058A is in the P state, and a "1" if it is in the AP state. Which of the P and AP states represents a "0," and which represents a "1," can be a design choice. As previously described, the Bit 1 output of SA 2302 can be a least significant, or rightmost bit of a two-bit state Bit 2, Bit 1 that can be output by the sequence of the FIG. 23A first phase and the FIG. 23B second phase. The FIG. 23A example direction for the read current READ_A assumes, arbitrarily, a read polarity of the read voltage at SL/BL1 and the ground/current sink at SL/BL2, and a reverse direction for READ_A can be obtained, and used, by applying the read voltage at SL/BL2 and the ground/current sink at SL/BL1.

Referring to FIG. 23B, in one aspect the second phase includes WL1 maintaining the word line switch 2080A ON, word line signal WL2 switching the word line switch 2080B ON and, the bit line/select line BL/SL3 being uncoupled from the ground reference or equivalent current sink to which it was coupled during the FIG. 23A first phase. The read current READ_B can then pass from SL/BL1, through the first pillar 2050A, into the common BE layer 2002, across the distance of approximately D1 through the common BE layer 2002, and up through the second pillar 2050B, through the word line switch 2080B to ground. The READ_B current path includes the above-described MTJ formed by the first pillar 2050A, and the MTJ established by the second pillar 2050B's free magnetization layer 2058B separated, by second the pillar 2050B's barrier layer 2056B, from the second pillar 2050B's fixed layer 2054B. The resistance of the READ_B path is the series resistance of these MTJs, and the READ_B current forms an SL/BL1 sense voltage indicative of the same. The depicted direction of the read current READ_B assumes, arbitrarily, a read polarity of the read voltage at SL/BL1 and the ground/current sink at SL/BL2. This is only an example, and a reverse direction for READ_A can be employed by applying the read voltage at SL/BL2 and the ground/current sink at SL/BL1.

Referring still to FIG. 23B, in an aspect SA 2302 compares the above-described SL/BL1 sense voltage resulting from the READ_B current to one of Ref 2 and Ref 3, depending on the FIG. 23A first phase detected state of the free magnetization layer, in other words depending on whether the FIG. 23A first phase Bit 1 output was a "0" or a "1." In an aspect, by the same general concepts as described for the embodiments shown at FIGS. 4A and 4B, the sequence of the FIG. 23A first phase and FIG. 23B second phase can resolve the following four storage states, represented by Bit 2, Bit 2, of the P or AP magnetizations of the free magnetization layer 1456A and 1456B: "00," "01," "10," and "11."

Figure 24:
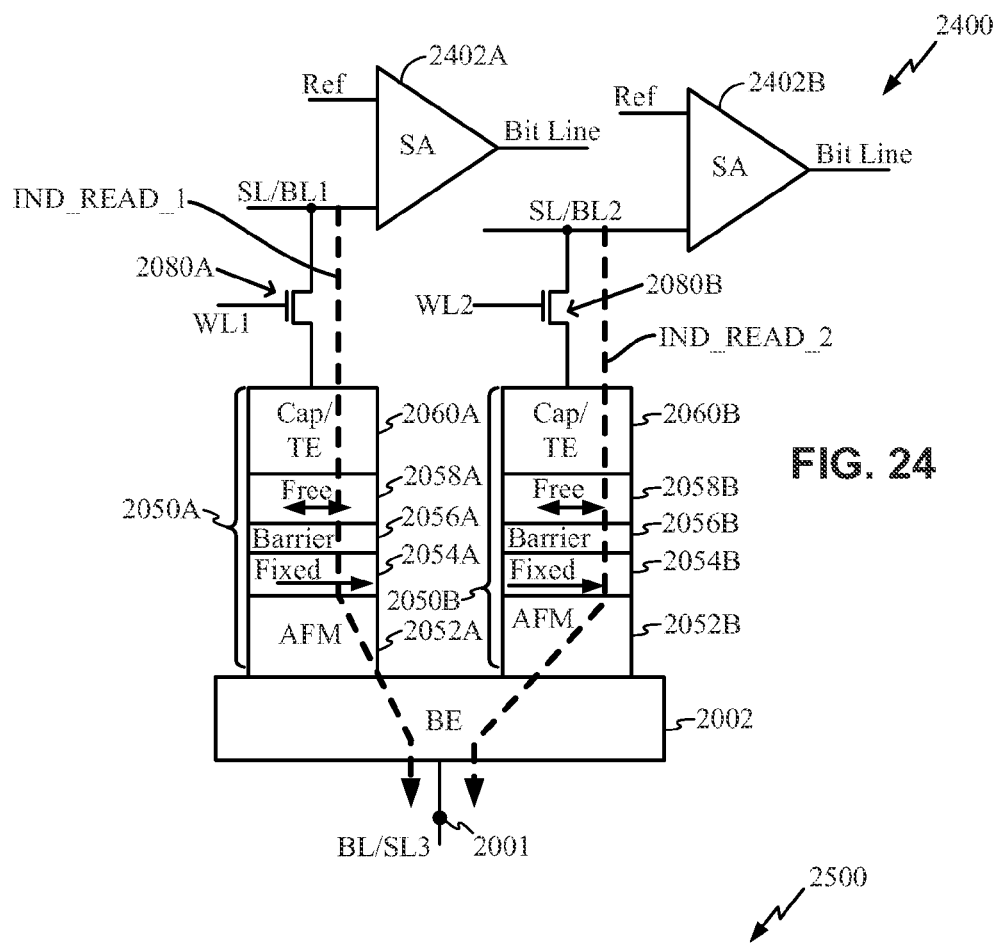
FIG. 24 shows one example multiple individual free magnetization layer read cell according to one three terminal read aspect, in relation to the FIG. 20 multiple pillar, common bottom electrode layer, multi-free layer MTJ structure according to one exemplary embodiment, in a method according to one exemplary embodiment.

FIG. 24 shows one example multi-free layer, individually readable free magnetization layer MTJ cell 2400 according to one three-terminal read aspect that, in the depicted example configuration, can utilize the FIG. 20 multiple pillar, multi-free layer MTJ device 2000. The multi-free layer, individually readable free magnetization layer MTJ cell 2400 can include a first sense amplifier (SA) 2402A to detect the state of the first pillar 2050A's free magnetization layer 2058A, and a second SA 2402B to detect the state of the second pillar 2050B free magnetization layer 2058B. The first and second SAs 2402A and 2402B can, in one aspect, receive the plurality of reference voltages Ref 1, Ref 2 and Ref 3 but, in a further aspect, will use only the Ref 1 voltage. In an example operation WL1 and W12 switches the word line switches 2080A and 2080B ON. Assuming read current sources as previously described, in an aspect IND_Read_1 passes through the MTJ established by the first pillar 2050A having the free magnetization layer 2058A spaced by the first pillar 2050A's barrier layer 2056A above the first pillar 2050A's fixed layer 2054A, which develops an SL/BL1 sense voltage indicative of the state of the free magnetization layer 2054A. Similarly, IND_Read_2 passes through the MTJ established by the second pillar 2050B having its free magnetization layer 2058B spaced by the pillar 2050B's barrier layer 2056B above its fixed layer 2054B, which develops an SL/BL2 sense voltage indicative of the state of the free magnetization layer 2054B. It will be understood that the directions described for the read current IND_Read_and IND_Read_2 shown on FIG. 24 assume, arbitrarily, a read polarity applying the read voltage at SL/BL1 and SL/BL2 and the ground/current sink at BL/SL3, and that a reverse direction for either or both of IND_Read_1 and IND_Read_2 can be obtained, and used, by applying an opposite assignment of read voltage and ground/current sink to one or both of SL/BL1 and SL/BL2 with respect to BL/SL3.

Figure 25:
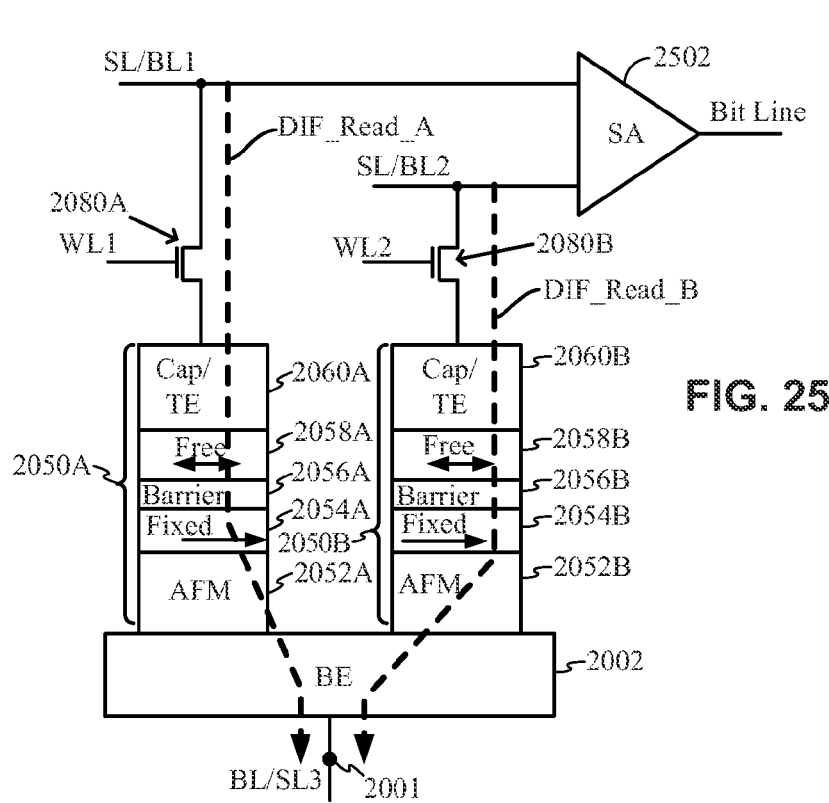
FIG. 25 shows one example multi-free layer differential read MTJ cell according to a another three terminal read aspect, in relation to the FIG. 20 multiple pillar, common bottom electrode layer, multi-free layer MTJ structure according to one exemplary embodiment.

FIG. 25 shows one example multi-free layer differential read MTJ cell 2500 according to another three terminal read aspect, employing the FIG. 20 multiple pillar, multi-free layer MTJ device 2000 according to one exemplary embodiment, in a combination with a differential sense amplifier 2502.

Figure 26:
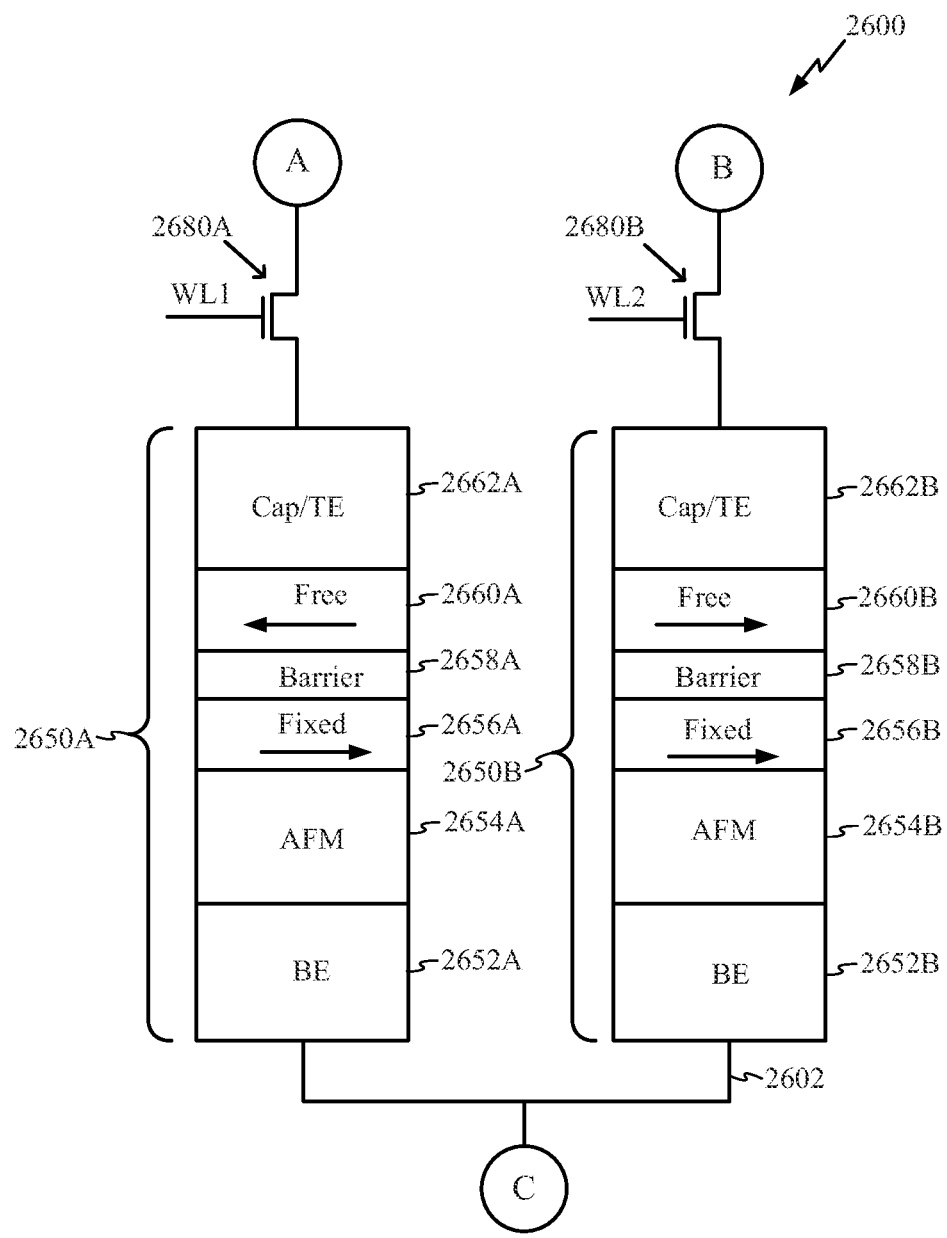
FIG. 26 shows one example multiple pillar, multi-free layer MTJ structure according to one exemplary embodiment, in an aspect including pillars having a capping layer, a free-layer, a barrier layer, an AFM layer and a bottom electrode layer.

FIG. 26 shows one example multiple pillar, multi-free layer MTJ device 2600 according to one exemplary embodiment that can provide multiple parallel MTJs and can have a three-terminal aspect, as another alternative to the FIG. 1 one multi-terminal, multi-free layer MTJ device 100, an alternative to the FIG. 8 multi-free layer MTJ device 800, and/or to the FIG. 14 multiple pillar, multi-free layer MTJ device 1400, and/or to the alternative to the FIG. 20 multiple pillar, multi-free layer MTJ device 2000. In an aspect, the multiple pillar, multi-free layer MTJ device 2600 can include a first pillar 2650A in parallel with a second pillar 2650B can be arranged. The first pillar 2650A can include, in bottom-to-top order, beginning with a bottom electrode (BE) layer 2652A, an AFM layer 2654A, a fixed layer 2656A, a barrier layer 2658A, a free magnetization layer 2660A, and a capping/top electrode layer 2662A. The second pillar 2650B can be identically structured to the first pillar 2650A having, in bottom-to-top order starting with a BE layer 2652B, an AFM layer 2654B, a fixed layer 2656B, a barrier layer 2658B, a free magnetization layer 2660B and a capping/top electrode later 2662B. In an aspect a bottom interconnect 2602 can coupled the BE layers 2652A and 2652B of the first and the second pillars 2650A, 2650B, respectively. In an aspect, a word line switch 2680A, controlled by word line WL1 switchably couples the capping/top electrode layer 2652A to a generic terminal A, and a word line switch 2680B, controlled by word line WL2, switchably couples the capping/top electrode layer 2652B to a generic terminal B.

FIGS. 27A, 27B, and 27C show a two terminal resistance aspect of the FIG. 26 multiple pillar, multi-free layer MTJ device 2600 according to one exemplary embodiment at, respectively, each of the first, second, and third set of magnetization states. The example states represented by FIGS. 27A, 27B and 27C are shown as corresponding to the example states of the FIG. 1 embodiment represented by FIGS. 2A, 2B and 2C and, when WL1 and WL2 switch the word line switches 2680A, 2680B ON, exhibit substantially the same resistance over the Read_R path, i.e., two-terminal resistance, as previously described. The resistances are marked above FIGS. 27A, 27B and 27C. It will be understood that the direction of Read_R path assumes, arbitrarily, a read polarity applying the read voltage at SL/BL1 and the ground/current sink at SL/BL2, and that the reverse direction can be obtained, and used, by applying the read voltage at SL/BL2 and the ground/current sink at SL/BL1.

Figure 28A:
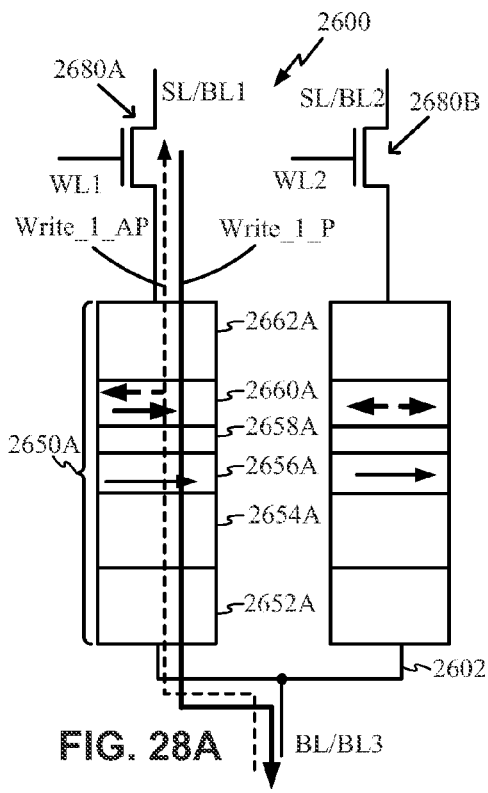
FIGS. 28A and 28B show example write current flows for writing, respectively, a first free magnetization layer in first pillar and a second free magnetization layer in a second pillar of the FIG. 26 example multiple pillar, multi-free layer MTJ structure, in a method according to one exemplary embodiment.
Figure 28B:
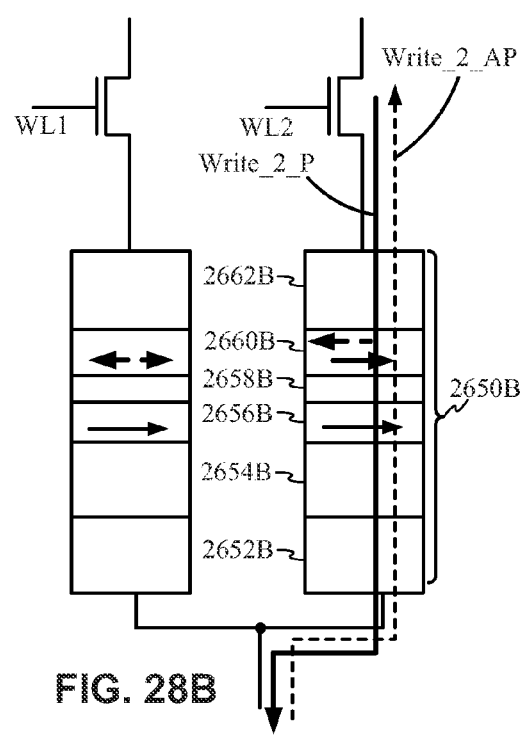

FIGS. 28A and 28B show example write current flows Write_1_P and Write_1_AP for writing, in the FIG. 28A mode, the free magnetization layer 2660A of the first pillar 2650A and, in the FIG. 28B mode, write current flows Write_2_P and Write_2_AP for writing the free magnetization layer 2660B of the second pillar 2650B. The Write_1_P, Write_1_AP, Write_2_P, and Write_2_AP can be as described in reference to the FIGS. 3A and 3B, except for the free magnetization layers 2660A and 2660B being written to selected ones of the P or AP states, as opposed to FIG. 1 first and second free magnetization layers 110A and 110B.

Figure 29A:
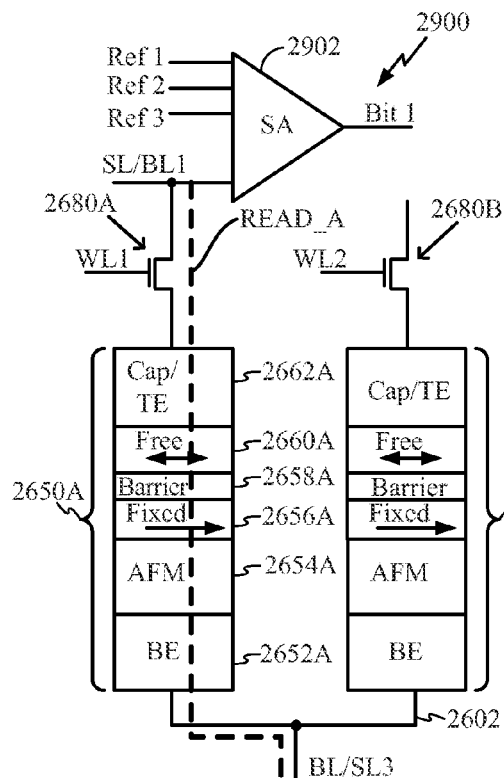
FIGS. 29A and 29B show, respectively, one individual free magnetization layer read phase and one multi-free layer read phase, illustrating one multi-step, three terminal read aspect in relation to FIG. 26 example multiple pillar, multi-free layer MTJ structure.
Figure 29B:
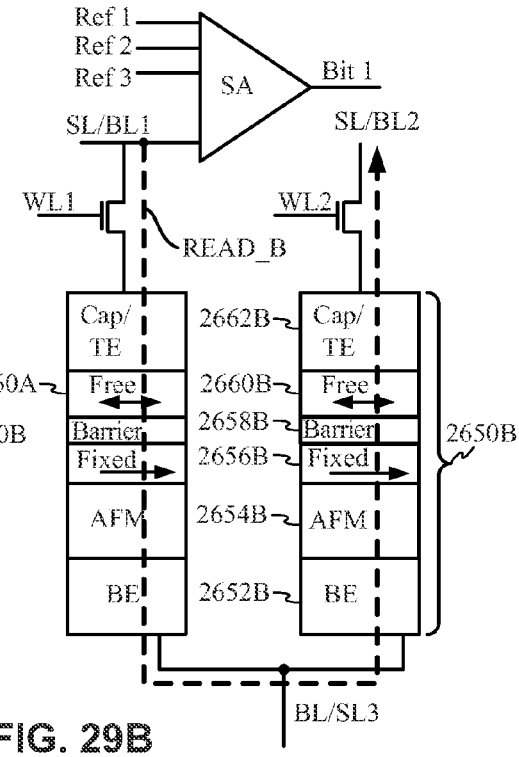

FIGS. 29A and 29B show, respectively, one individual free magnetization layer read phase and one multi-free layer read phase of a two-phase, three-terminal multi-level read circuit 2900 aspect in accordance with one exemplary embodiment that, in an aspect, can utilize the FIG. 26 example multiple pillar, multi-free layer MTJ device 2600. In an aspect, two-phase, three-terminal multi-level read circuit 2900 can include a sense amplifier (SA) 2902 that can receive Ref 1, Ref 2 and Ref 3, these being at respective voltages as described for the Ref 1, Ref 2 and Ref 3 received by the SA 402 of the FIGS. 4A and 4B two-phase, three-terminal multi-level read circuit 400.

Referring to FIG. 29A, the first phase couples SL/BL1 to a read current source (not shown), with word line signal WL1 switching the word line switch 2680A ON and word line signal WL2 switching the word line switch 2680B OFF. In an aspect the FIG. 29A first phase includes coupling BL/SL3, by for example an address logic (not shown), to a ground reference or equivalent current sink (not shown). This establishes a path for read current READ_A, passing through the MTJ established by the first pillar 2650A's free magnetization layer 2660A separated, by the first pillar 2650A's barrier layer 2658A, from the first pillar 2650A's fixed layer 2656A. The read current READ_A therefore establishes an SL/BL1 sense voltage indicative of the resistance of this MTJ. In an aspect, the SA 2902 compares this SL/BL1 sense voltage to Ref 1. The Bit 1 output of SA 2902 can, in one aspect, be a "0" if the first pillar 2650A free magnetization layer 2660A is in the P state, and a "1" if it is in the AP state. The depicted direction of the read current READ_A assumes, arbitrarily, a read polarity of the read voltage at SL/BL1 and the ground/current sink at SL/BL2. This is only an example, and a reverse direction for READ_A can be employed by applying the read voltage at SL/BL2 and the ground/current sink at SL/BL1.

Referring to FIG. 29B, in one aspect the second phase includes WL1 maintaining the word line switch 2680A ON, word line signal WL2 switching the word line switch 2680B ON, and BL/SL3 being uncoupled from the ground reference or equivalent current sink to which it was coupled during the FIG. 29A first phase. This establishes a path for read current READ_B, from SL/BL1, through the first pillar 2650A, across the bottom interconnect 2602, up through the second pillar 2650B, through the word line switch 2680B to ground. The READ_B current path includes the above-described MTJ formed by the first pillar 2050A, and the MTJ established by the second pillar 2650B's free magnetization layer 2660B separated, by the second pillar 2650B's barrier layer 2658B, from the second pillar 2650B's fixed layer 2656B. The resistance of the READ_B path is the series resistance of these MTJs, and the READ_B current forms an SL/BL1 sense voltage indicative of the same. The depicted direction of the read current READ_B assumes, arbitrarily, a read polarity of the read voltage at SL/BL1 and the ground/current sink at SL/BL2. This is only an example, and a reverse direction for READ_B can be employed by applying the read voltage at SL/BL2 and the ground/current sink at SL/BL1.

Referring still to FIG. 29B, in an aspect SA 2902 compares the above-described SL/BL1 sense voltage resulting from the READ_B current to one of Ref 2 and Ref 3, depending on the FIG. 29A first phase detected state of the free magnetization layer, in other words depending on whether the FIG. 29A first phase output was a "0" or a "1." In an aspect, by the same general concepts as described for the embodiments shown at FIGS. 4A and 4B, the sequence of the FIG. 29A first phase and FIG. 29B second phase can resolve the following four storage states, represented by Bit 2, Bit, the P or AP magnetizations of the free magnetization layers 2660A and 2660B: "00," "01," "10," and "11."

Figure 30:
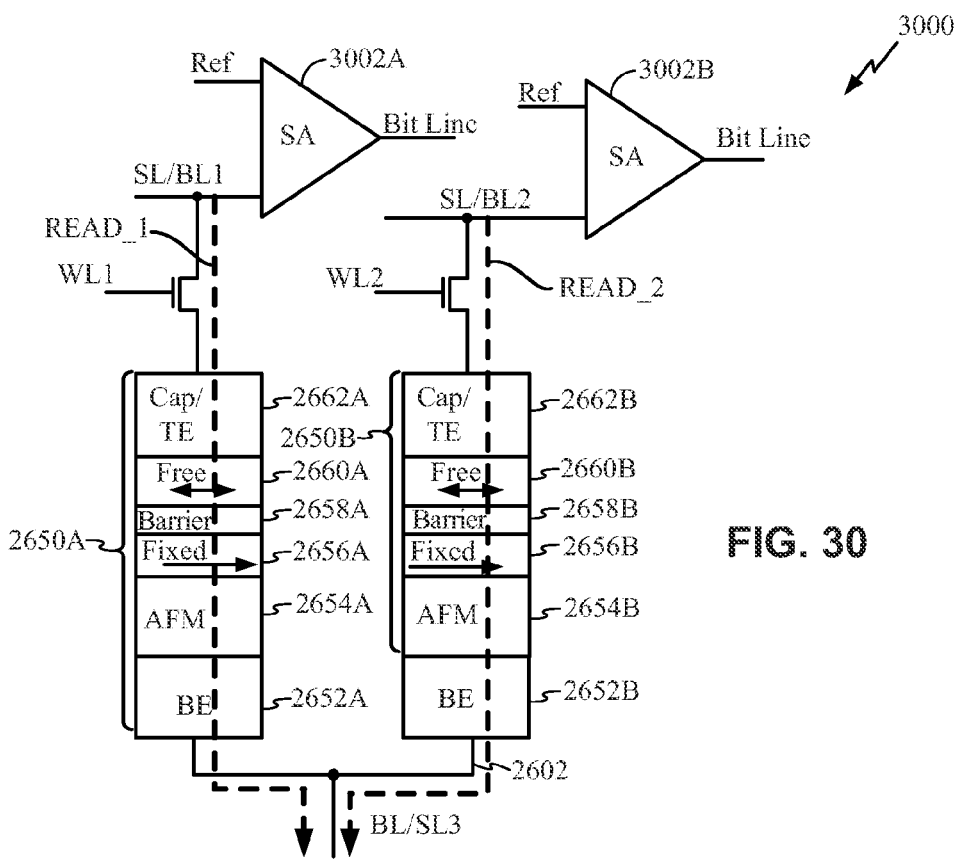
FIG. 30 shows one example individual free magnetization layer read MTJ storage cell, according to one three terminal read aspect, in relation to the FIG. 26 multiple pillar, multi-free layer MTJ structure according to one exemplary embodiment.

FIG. 30 shows one example individual free magnetization layer read MTJ storage cell 3000, according to one three terminal read aspect of another exemplary embodiment, in relation to the FIG. 26 multiple pillar, multi-free layer MTJ structure 2600. The individual free magnetization layer read MTJ cell 3000 can include a first sense amplifier (SA) 3002A to detect the state of the first pillar 2650A free magnetization layer 2660A, and a second SA 3002B to detect the state of the second pillar 2650B free magnetization layer 2660B. In one aspect, both first and second SA 3002A and 3002B can receive a Ref that is the above-described Ref 1 voltage, the midpoint between the nominal sense voltage resulting from the free magnetization layers 2660A and 2660B being at a P state and the nominal sense voltage resulting from the free magnetization layers 2660A and 2660B being at an AP state. Assuming read current sources are coupled to SL/BL1 and SL/BL2 as previously described, in an aspect a current IND_Read_1 passes through the MTJ established by the first pillar 2650A having its free magnetization layer 2660A separated, by its barrier layer 2658A, above its fixed layer 2656A, which develops an SL/BL1 sense voltage indicative of the state of free magnetization layer 2660A. Similarly, IND_Read_2 passes through the MTJ established by the second pillar 2650B having its free magnetization layer 2660B separated, by its barrier layer 2658B, above its fixed layer 2656B, which develops an SL/BL2 sense voltage indicative of the state of free magnetization layer 2660B. It will be understood that the directions described for the read current IND_Read_1 and IND_Read_2 shown on FIG. 12 assume, arbitrarily, a read polarity applying the read voltage at SL/BL1 and SL/BL2 and the ground/current sink at BL/SL3, and that a reverse direction for either or both of IND_Read_1 and IND_Read_2 can be obtained, and used, by applying an opposite assignment of read voltage and ground/current sink to one or both of SL/BL1 and SL/BL2 with respect to BL/SL3.

Figure 31:
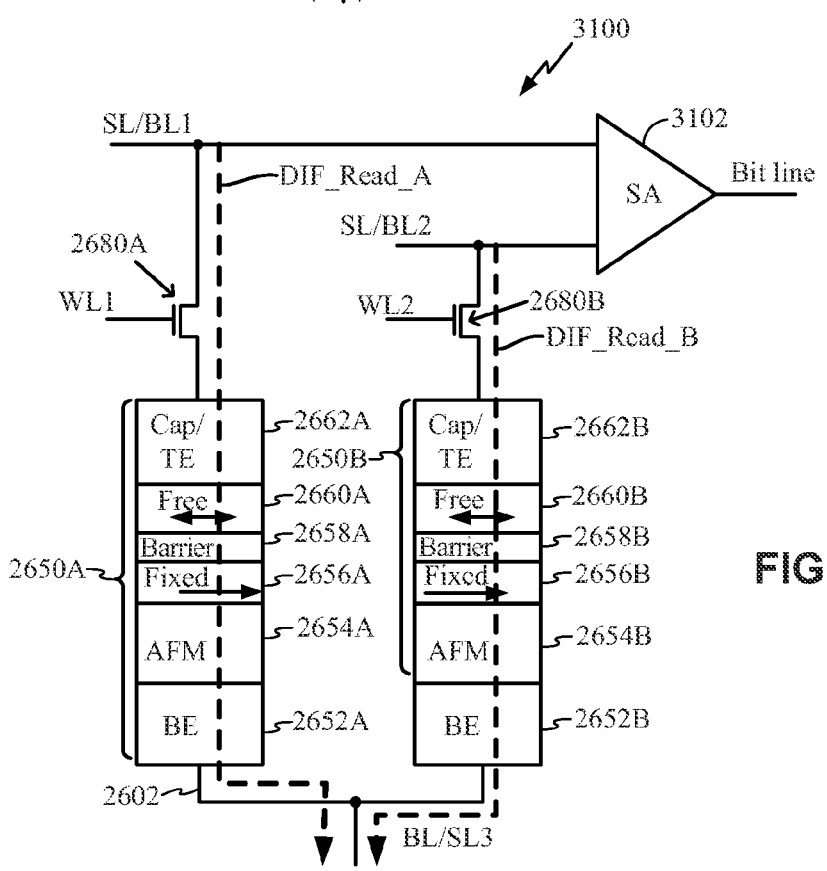
FIG. 31 shows one example multi-free layer differential read MTJ storage cell, according to a further three terminal read aspect, in relation to the FIG. 26 multiple pillar, multi-free layer MTJ structure according to one exemplary embodiment.
Figure 33A:
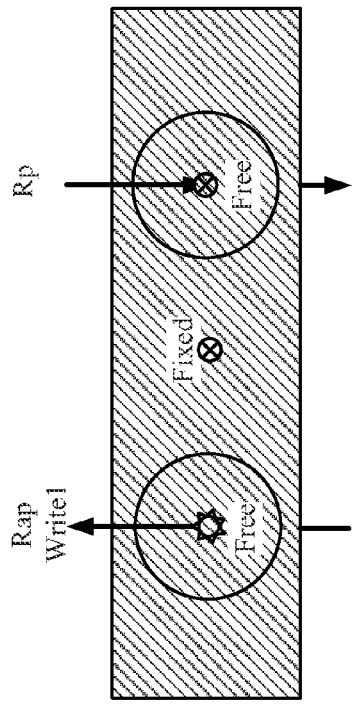
FIGS. 33A, 33B, 33C and 33D show four possible sets of free-layer magnetization states for one two layer example of one multi-free layer, perpendicular MTJ structure according to one exemplary embodiment, with corresponding write current directions and resulting resistances.
Figure 33B:
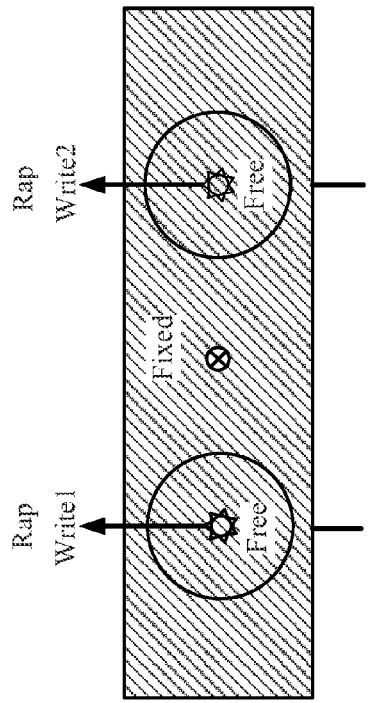
Figure 33C:
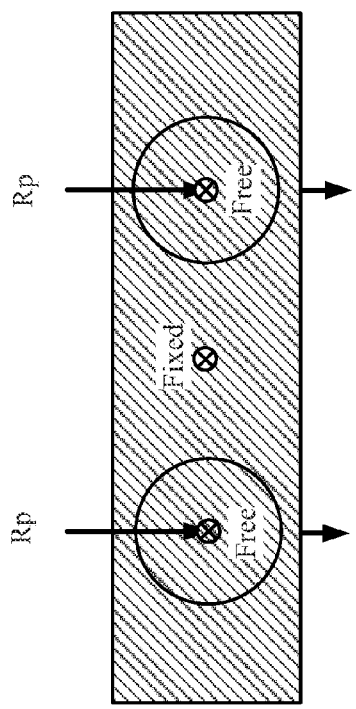
Figure 33D:
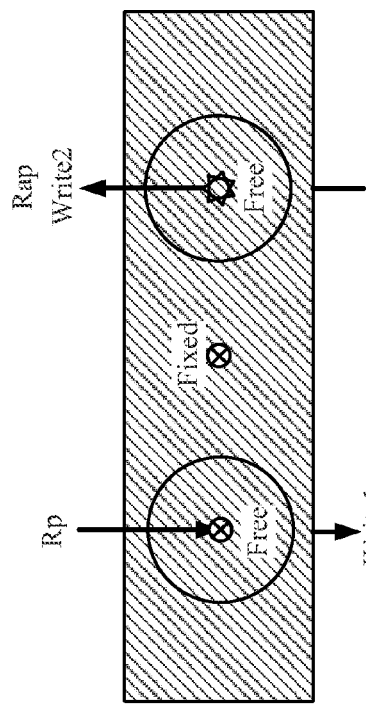

FIG. 31 shows one example multi-free layer differential read MTJ storage cell 3100, according to a further three terminal read aspect, in relation to the FIG. 26 multiple pillar, common bottom electrode layer, multi-free layer MTJ structure according to one exemplary embodiment. In an aspect, a general operation of the FIG. 31 multi-free layer differential read MTJ cell 3100 can, using SA 3102, be according to the general operation described for the FIG. 7 multi-free layer differential read MTJ cell 700.

FIGS. 32A, 32B, 32C and 32D show four possible sets of free-layer magnetization states for one two layer example of one multi-free layer, in-plane MTJ structure according to one exemplary embodiment, with corresponding write current directions and resulting resistances.

FIGS. 33A, 33B, 33C and 33D show four possible sets of free-layer magnetization states for one two layer example of one multi-free layer, perpendicular MTJ structure according to one exemplary embodiment, with corresponding write current directions and resulting resistances.

Benefits and features include, without limitation, reading through dual tunnel barriers can increase TMR or delta R, and can improve sensing performance. The sensing circuit can be simple. The small free magnetization layer can reduce switching current through single tunnel barrier. The bitcell size can be small. A two step MTJ etching can be employed to pattern the free magnetization layer. The ratio of Fix/AFM can be larger and, therefore improved magnetic pinned performance can be obtained. The MTJ can be in-plane STT MTJ or perpendicular STT MTJ. In various aspects, multi-bits/levels can provide for high density MRAM and spin logic. In other aspects, differential sensing read can provide a simpler sensing circuit. The fabrication process can be simple and compatible with regular MTJ process and integration.

Figure 34:
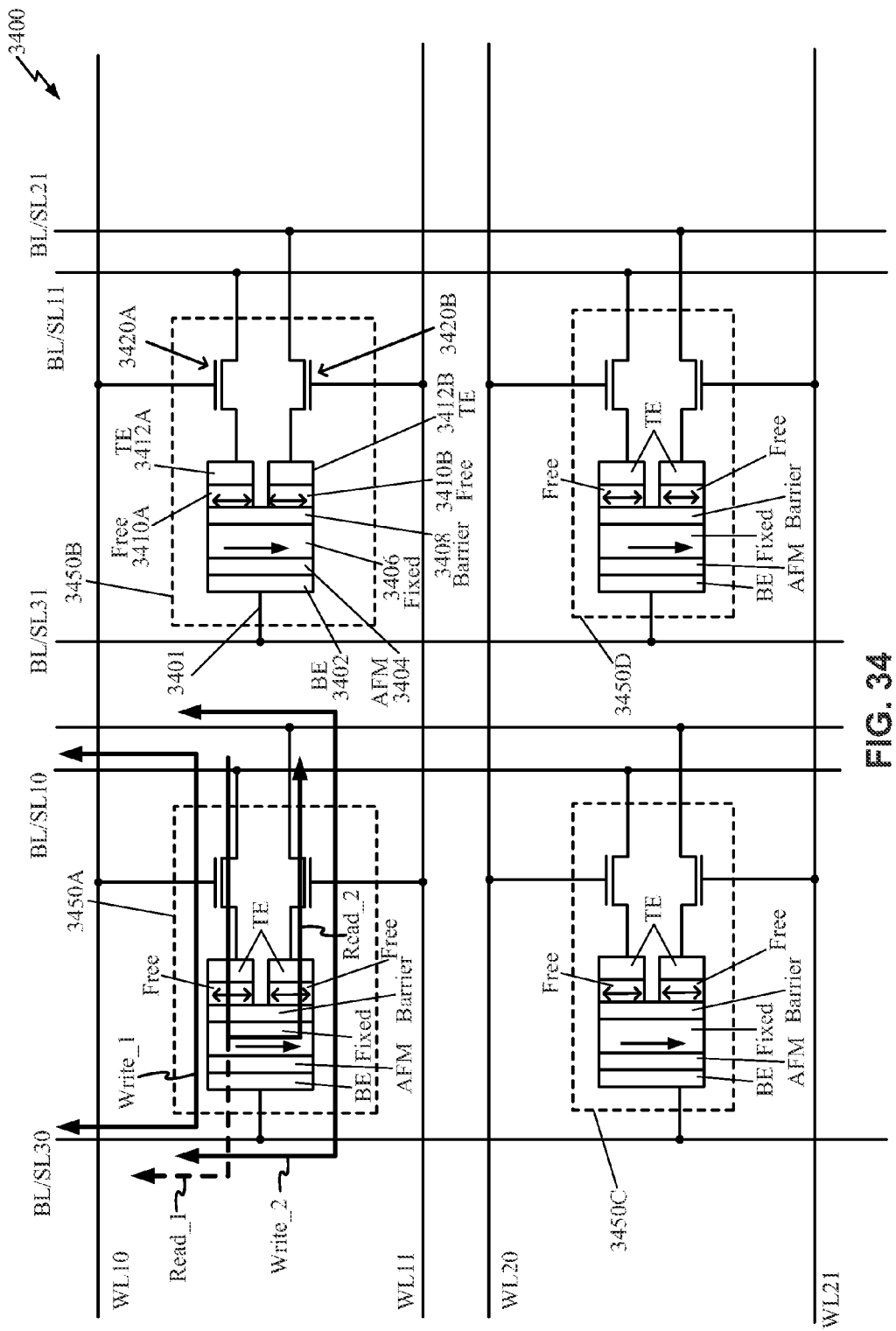
FIG. 34 shows one MTJ memory circuit having one example array of multi-terminal, multi-free layer MTJ memory cells in accordance with one or more exemplary embodiments.

FIG. 34 shows a representative four-cell portion of one MTJ memory circuit 3400 having one example array of multi-terminal, multi-free layer MTJ memory cells in accordance with one or exemplary embodiments. Referring to FIG. 34, in one aspect the MTJ memory circuit 3400 can include three-terminal, multi-free layer MTJ memory cells 3450A, 3450B, 3450C and 3450D (collectively referenced as "3450"). The MTJ memory circuit 3400 shows a common structure to all the three-terminal, multi-free layer MTJ memory cells 3450 and therefore, to simplify graphics, the figure shows explicit reference numbers on only the three-terminal, multi-free layer MTJ memory cell 3450B. Likewise, it will be understood that all of the three-terminal, multi-free layer MTJ memory cells 3450 can operate in like manner and, therefore, for purposes simplifying graphics current flows are shown only on the three-terminal, multi-free layer MTJ memory cell 3450A.

With continuing reference to FIG. 34, in particular to the three-terminal, multi-free layer MTJ memory cell 3450B, in an aspect the three-terminal, multi-free layer MTJ memory cell 3450 is shown as being in general accordance with FIG. 1 multi-terminal, multi-free layer MTJ structure 100. However, this is only for purposes of example and is not intended to limit the scope of any of the embodiments contemplated by the concepts illustrated in FIG. 34. Instead, as will be readily understood by persons of ordinary skill in the art upon view of this disclosure, the FIG. 34 MTJ memory circuit 3400 can substitute the depicted three-terminal, multi-free layer MTJ memory cells 3450 with any of the three-terminal, multi-free layer MTJ memory devices shown at FIGS. 1, 8, 14, 20, and/or 26. Further, sense amplifiers and aspects employing reference voltages are not shown in FIG. 34, but it will become apparent to persons of ordinary skill in the art, upon viewing FIG. 34 along with one or more of FIGS. 2-7, 9-13, 15-19, 21-25 and/or 27-31, that sense amplifiers and, where appropriate, reference voltage means can be readily selected and arranged to configure the FIG. 34 MTJ memory circuit 3400 to function as one or more of the cells shown at FIGS. 4A-4B, 6, and/or 7, FIGS. 11A-11B, 12, and/or 13, FIGS. 17A-17B, 18 and/or 19, FIGS. 23A, 23B, 24 and/or 26, and/or FIGS. 29A, 29B, 30 and/or 31.

Referring to FIG. 34, and in particular to the three-terminal, multi-free layer MTJ memory cell 3450B, in an aspect the three-terminal, multi-free layer MTJ memory cells 3450 can include a common bottom electrode (BE) layer 3402 coupled by a terminal 3401 to a bit line/select line BL/SL3X, with examples BL/SL30 and BL/SL31 being depicted. In an aspect, the three-terminal, multi-free layer MTJ memory cells 3450 can include, in a left-to-right order relative to the FIG. 34 sheet, beginning with the top (rightmost surface) of the BE layer 3402, a common antiferromagnetic (AFM) layer 3404, a common fixed or pinned magnetization (hereinafter "fixed") layer 3406, and a common barrier layer 3408. Formed at a first location (shown but not separately numbered) on the top (rightmost) surface of the common barrier layer 3408 can be a first free magnetization layer 3410A with a corresponding first capping/top electrode (TE) layer 3412A. Formed at a second location (shown but not separately numbered), also on the top (rightmost) surface of the common barrier layer 3408, and laterally displaced (meaning spaced in downward direction in the plane of the FIG. 34 sheet) can be a second free magnetization layer 3410B with a corresponding second TE layer 3412B.

Referring still to FIG. 34, in an aspect, the first TE layer 3412A can be coupled through a first word enabled switch 3420A to a bit line/select line BL/SL1X, with examples BL/SL10 and 11 being depicted. The first word enabled switch 3420A can be controlled by a word line WLY0, with examples WL10 and WL20 being depicted. In a similar aspect, the second TE layer 3412B can be coupled through a second word enabled switch 3420B to a bit line/select line BL/SL2X, with examples BL/SL20 and 21 being depicted. The second word enabled switch 3420B can be controlled by a word line WLY1, with examples WL11 and WL21 being depicted.

With continuing reference to FIG. 34, in particular to the three-terminal, multi-free layer MTJ memory cell 3450A, in one example first phase of a two-phase read aspect, operation BL/SL30 is coupled to a ground, WL11 is at a level switching the second word enabled switch 3420B OFF, and WL10 is at a level switching the first word enabled switch 3420A ON. As a result, read current READ_1 passes from BL/SL10, through the MTJ formed by the first free magnetization layer 3410A spaced above the common fixed layer 3406 by the common barrier layer 3408, through the common AFM layer 3404, through the common BE layer 3402 to BL/SL30 to ground. The result is a sense voltage formed on BL/SL10 that can, in one aspect, be detected by a sense amplifier (not shown in FIG. 34) as a least significant bit (e.g., Bit 1 generated by the embodiments shown at FIGS. 4A, 11A, 17A, 23A and/or 29) of a multi-bit storage state.

Still referring to FIG. 34, in particular to the three-terminal, multi-free layer MTJ memory cell 3450A, in one example second phase of a the above-references two-phase read aspect, BL/SL30 is uncoupled from a ground (e.g., floated), WL1 switches to a level switching the second word enabled switch 3420B OFF, and WL10 is maintained at a level at which the first word enabled switch 3420A is ON. As a result, read current READ_2 passes from BL/SL10, through the MTJ formed by the first free magnetization layer 3410A spaced above the common fixed layer 3406 by the common barrier layer 3408, into common fixed layer 3406, across the common fixed layer 3406 (downward in FIG. 34) to a region aligned with (leftward in FIG. 34) the second free magnetization layer 3410B, then up (rightward in FIG. 34) through the common barrier layer 3408, through the MTJ formed by the second free magnetization layer 3410 spaced above (rightward in FIG. 34) the common fixed layer 3406 by the common barrier layer 3408, to BL/SL20 to ground. The result is a sense voltage formed on BL/SL10 that can, in one aspect, be detected by a sense amplifier (not shown in FIG. 34) as the next least significant bit (e.g., Bit 2 generated by the embodiments shown at FIGS. 4A, 11A, 17A, 23A and/or 29) of a multi-bit storage state.

Continuing to refer to FIG. 34, in particular to the three-terminal, multi-free layer MTJ memory cell 3450A, in one write aspect WL10 switches the first word-enabled switch 3420A ON, and WL11 switches the second word-enabled switch 3420B OFF. A first write path between BL/SL10 and BL/SL30 is therefore established, the write path including the first TE layer 3412A, the MTJ formed by the first free magnetization layer 3410A spaced above the common fixed layer 3406 by the common barrier layer 3408, the common AFM layer 3404 and the common BE layer 3402. A Write_1 write current, sourced by a write current source (not shown) passes through the first write path, in a direction determined by the desired state (P or AP) of the first free magnetization layer 3410A. In another write aspect WL10 switches the first word-enabled switch 3420A OFF, and WL11 switches the second word-enabled switch 3420B ON. A second write path between BL/SL20 and BL/SL30 is therefore established, the write path including the second TE layer 3412B, the MTJ formed by the second free magnetization layer 3410B spaced above the common fixed layer 3406 by the common barrier layer 3408, the common AFM layer 3404 and the common BE layer 3402. A Write_2 write current passes through the second write path, in a direction determined by the desired state (P or AP) of the second free magnetization layer 3410B.

Figure 35:
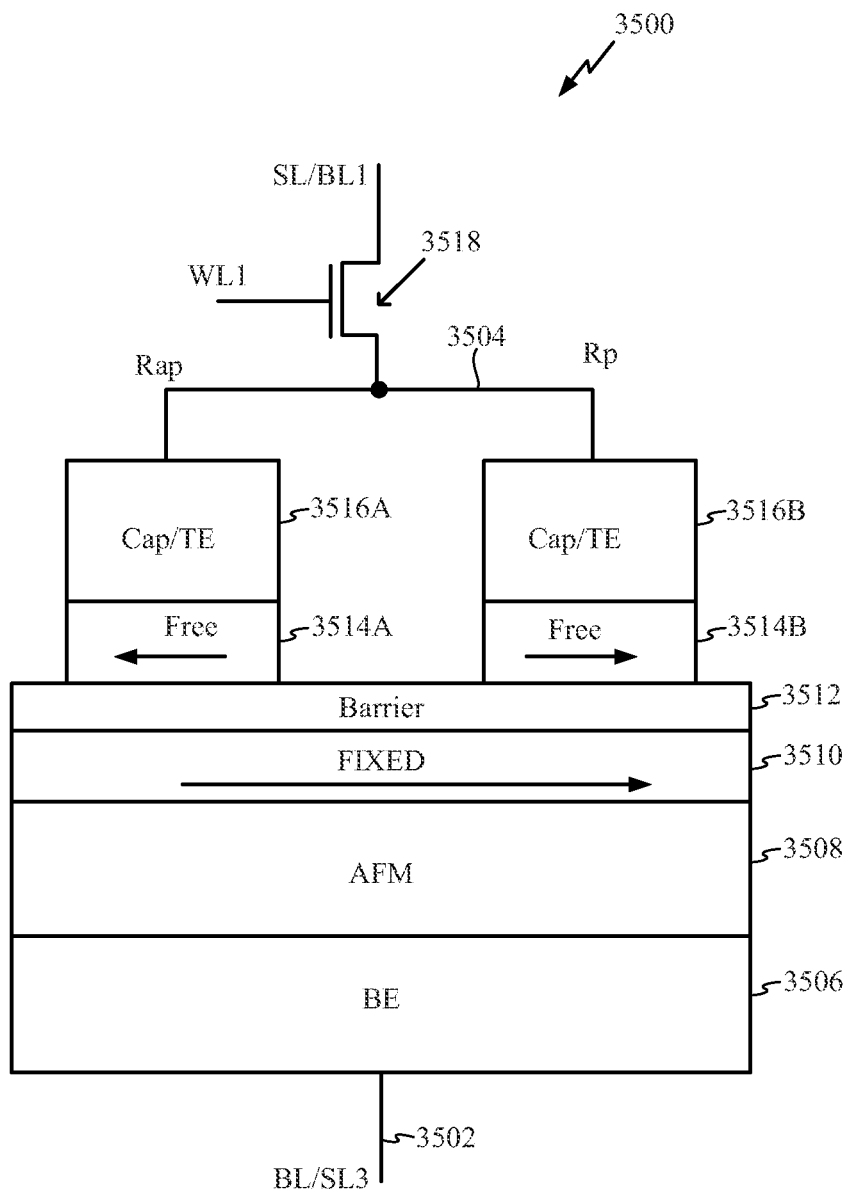
FIG. 35 shows one example of a two-terminal, multi-free layer, multi-level MTJ structure in accordance with various exemplary embodiments.

FIG. 35 shows one example of a two-terminal, multi-free layer, multi-level MTJ device 3500 in accordance with various exemplary embodiments, having at least two free magnetization layers in parallel paths between a bottom or first terminal 3502 and a top or second terminal 3504. The first terminal 3502 may, in an aspect within an addressable array (not shown in FIG. 35), couple to a bit line/select line BL/SL3. Similarly, the second terminal 3504 may couple to a select line/bit line SL/BL1, for example through a word line switch 3518 controlled by, for example, word line control signal WL1.

Referring still to FIG. 35, the two-terminal, multi-free layer, multi-level MTJ device 3500 according to one exemplary embodiment can include a common bottom electrode layer 3506 coupled to the first or bottom terminal 3502, a common AFM layer 3508 above the common bottom electrode layer 3506, a common fixed layer 3510 above the common AFM layer 3508, and a common barrier layer 3512 above the common fixed layer 3510. Located on a first and second surface area, respectively, of the common barrier layer 3512 are separate, laterally spaced, free magnetization layers, such as the first free magnetization layer 3514A and the second free magnetization layer 3514B. The first and second free magnetization layers 3514A, 3514B are collectively referenced as "3514" and are two examples of what can be a larger number of separate, laterally spaced free magnetization layers (not shown).

With continuing reference to FIG. 35, in an aspect, above each of the free magnetization layers 3514 can be a corresponding, separate capping/top electrode layer, for example the capping/top electrode layer 3516A above the free magnetization layer 3514A and the capping/top electrode layer 3516B above the free magnetization layer 3514B. In a further aspect, the top or second terminal 3504 can be configured as a top interconnect to couple the capping/top electrode layers 3516A, 3516B (collectively "3516").

Referring still to FIG. 35, although the laterally spaced, separate first and second free magnetization layers 3514A and 3514B are on the same stack formed of the common barrier layer 3512, common fixed layer 3510, AFM layer 3508, and common bottom electrode layer 3506, the first and second free magnetization layers 3514A and 3514B provide two parallel tunnel barriers through which read current can flow from the top terminal 3504 to the bottom terminal 3502. The electrical resistance from the top terminal 3504 to the bottom terminal 3502 will therefore be established as the parallel resistance of the MTJ through the common fixed layer 3510, common barrier layer 3512 and first free magnetization layer 3514A, and the MTJ through the common fixed layer 3510, common barrier layer 3512 and second free magnetization layer 3514A. FIG. 35 illustrates an example with the first free magnetization layer 3514A having an AP magnetization relative to the common fixed layer 3510, and therefore a resistance labeled "Rap," and second free magnetization layer 3514B having a P magnetization relative to the common fixed layer 3510, and therefore a resistance labeled "Rp."

Further, as will be described in greater detail in reference to FIGS. 36A, 36B, and 36C, even if (as in the FIG. 35 example) separate current switches are not provided to selectively inject write current through selected ones of the free magnetization layers 3514 (in this example 3514A, 3514B), in an aspect a statistical, feedback converging write can, with a predetermined probability, obtain target ratio of the number of the free magnetization layers 3514 in a P (or AP) state to the total number of the free magnetization layers 3514. Since the difference between Rp and Rap can be known, obtaining the target ratio can obtain a target two-terminal resistance from the bottom terminal 3502 to the top terminal 3504. As will be appreciated, since there are multiple parallel free magnetization layers 3514, the two-terminal resistance can have multiple levels of resistance.

Referring to Table I below, and assuming "Free 1" indicates the resistance state (between Rp and Rap) of the FIG. 35 free magnetization layer 3514A, and "Free 2" indicates the resistance state of the free magnetization layer 3514B, the depicted arrangement of the two laterally spaced, separate free magnetization layers 3514 is capable of establishing three values of the two-terminal resistance

TABLE I

Multi-levels (2) twin free layers structure

| State | Free 1 | Free 2 | Resistance | If TMR = 100% |
|---|---|---|---|---|
| 00 | Rp | Rp | Rp/2 | Rp/2 |
| 01 | Rp | Rap | ~(Rp//Rap) | ~2Rp/3 |
| 01 | Rap | Rp | ~(Rp//Rap) | ~2Rp/3 |
| 11 | Rap | Rap | ~Rap/2 | ~Rp |

Figure 36A:
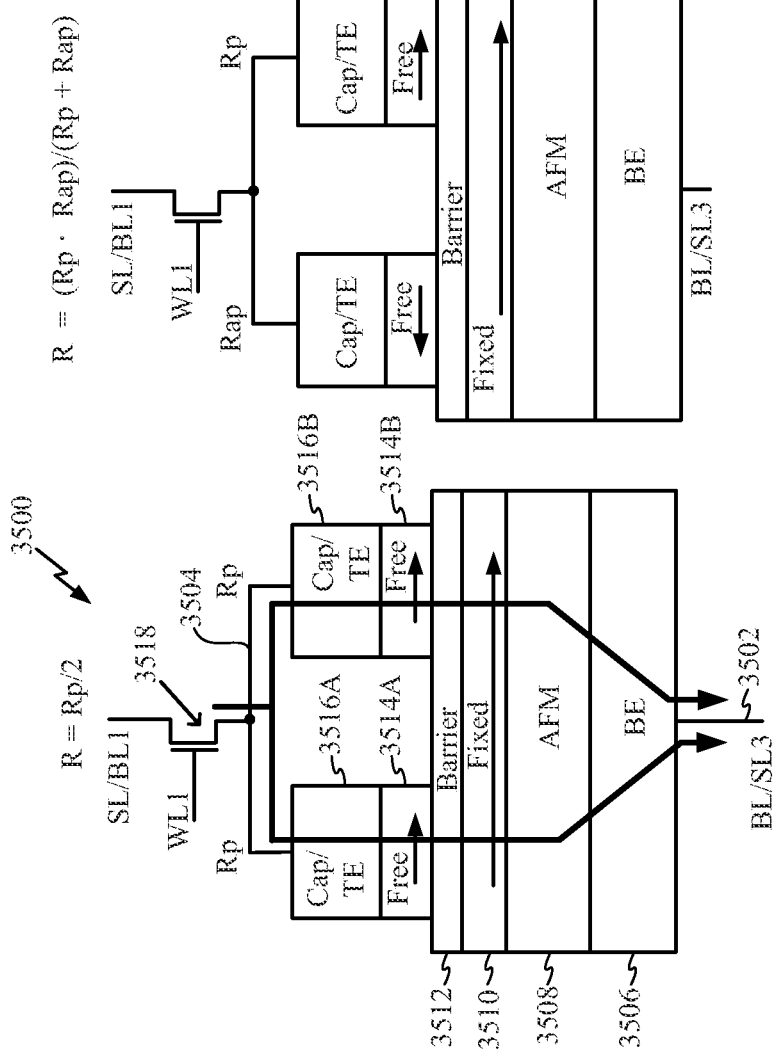
FIGS. 36A, 36B, and 36C show the FIG. 35 example two-terminal, multi-free layer, multi-level MTJ structure according to one exemplary embodiment, at an example first, second, and third set of magnetization states, respectively, during a statistical, feedback converging writing process according to one exemplary embodiment.
Figure 36B:
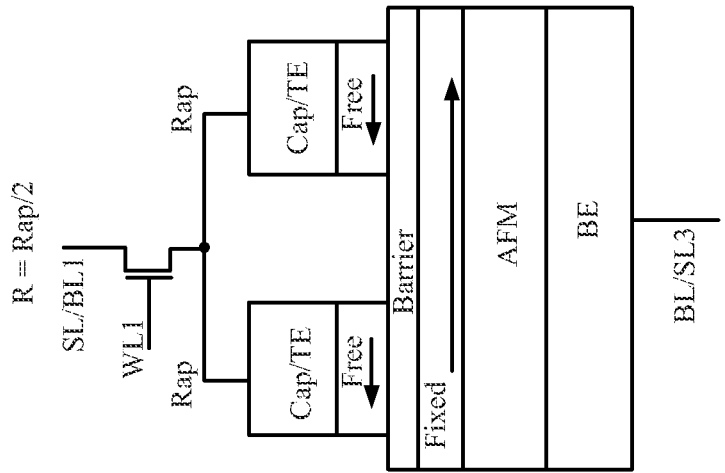
Figure 36C:

FIGS. 36A, 36B, and 36C show the FIG. 35 example two-terminal, multi-free layer, multi-level MTJ device 3500 according to one exemplary embodiment, at an example first, second, and third set of magnetization states, respectively, during a statistical, feedback converging writing process according to one exemplary embodiment. More particularly, FIG. 36A shows Table IV state "00," FIG. 36B shows one of the possibilities of state "01," and FIG. 36B shows Table IV state "11." One example statistical, feedback converging process for obtaining the example states of FIGS. 36A, 36B and 36C will be described in reference to FIG. 49.

Figure 37:
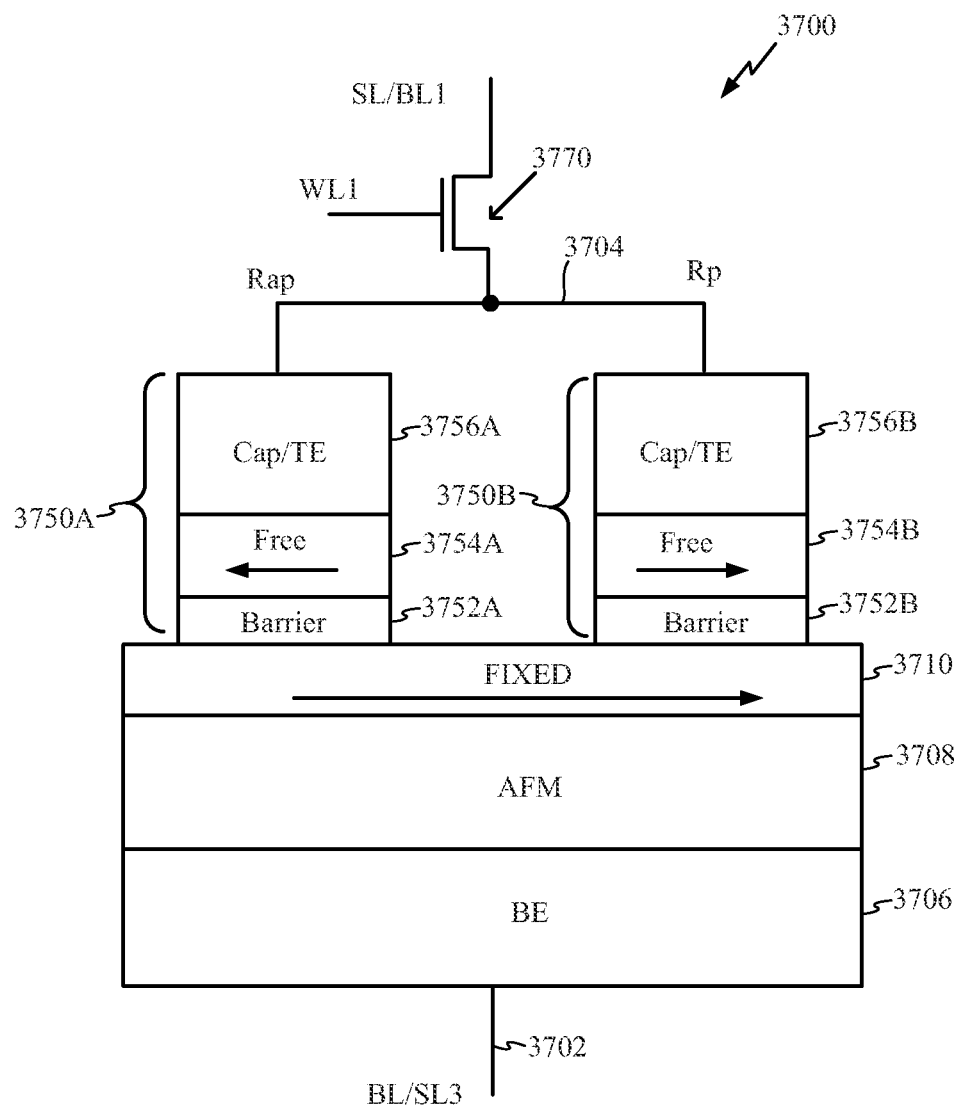
FIG. 37 shows one example of a two terminal, multi-free layer, corresponding separate barrier layer, common fixed layer, common AFM layer, common bottom electrode layer, multi-level MTJ structure in accordance with one exemplary embodiment.

FIG. 37 shows one example of a two-terminal, multi-free layer, multi-level MTJ device 3700 in accordance with another exemplary embodiment. Referring to FIG. 37, the two-terminal, multi-free layer, multi-level MTJ device 3700 can have a common bottom electrode layer 3706 coupling a bottom or first terminal 3702 to a common AFM layer 3708, and a common fixed layer 3710 disposed or supported on the common AFM layer 3708. The first terminal 3702 may, in an aspect within an addressable array (not shown in FIG. 37), couple to a bit line/select line BL/SL3. The common fixed layer 3710 supports, in this example, two pillars 3750A and 3750B. The pillars 3750A, 3750B are collectively referenced as "pillars 3750." It will be understood that the quantity of two pillars 3750 is an arbitrary example, and that embodiments contemplate more than two pillars 3750. Each of the pillars 3750 can, in an aspect, be identically structured and, for purposes of avoiding complexity not necessary to the concepts of the fundamental embodiments, the structures will be assumed identical.

Continuing to refer to FIG. 37, in an aspect pillar 3750A can have, in bottom-to-top order beginning, a barrier layer 3752A supported at a first location (shown but not explicitly labeled) on a top of the fixed layer 3710, a free magnetization layer 3754A on the barrier layer 3752A, and a capping/top electrode layer 3756A coupling the free magnetization layer 3754A to a top interconnect 3704. In like manner, pillar 3750B can have, in bottom-to-top order beginning, a barrier layer 3752B supported at a second location (shown but not explicitly labeled) on the top of the common fixed layer 3710, laterally displaced from the first location, a free magnetization layer 3754B on the barrier layer 3752B, and a capping/top electrode layer 3756B coupling the free magnetization layer 3754B to the top interconnect 3704 and, therefore, to the free magnetization layer 3754A of pillar 3750A. The top interconnect 3704 may couple to a select line/bit line SL/BL1, for example through a word line switch 3770 controlled by, for example, word line control signal WL1. FIG. 37 shows the first free magnetization layer 3754A having an AP magnetization relative to the common fixed layer 3510, and therefore a resistance labeled "Rap," and the second free magnetization layer 3754B having a P magnetization relative to the common fixed layer 3710, and therefore a resistance labeled "Rp." FIG. 37 therefore shows one of three possible resistance states, between the bottom terminal 3702 and the top interconnect 3704, that the combination of the free magnetization layers 3754A and 3754B can represent. Assuming the free magnetization layers 3754A and 3754B having substantially the same P and AP resistance values, it will be understood that although the combination of the free magnetization layers 3754A and 3754B can actually have four possible magnetization states, two of these, namely 3754A at a P state and 3754B at an AP state, and its opposite state of 3754A at an AP state and 3754B at a P state (which is shown in FIG. 37), exhibit identical resistance and, therefore, are not resolvable from one another.

Figure 38:
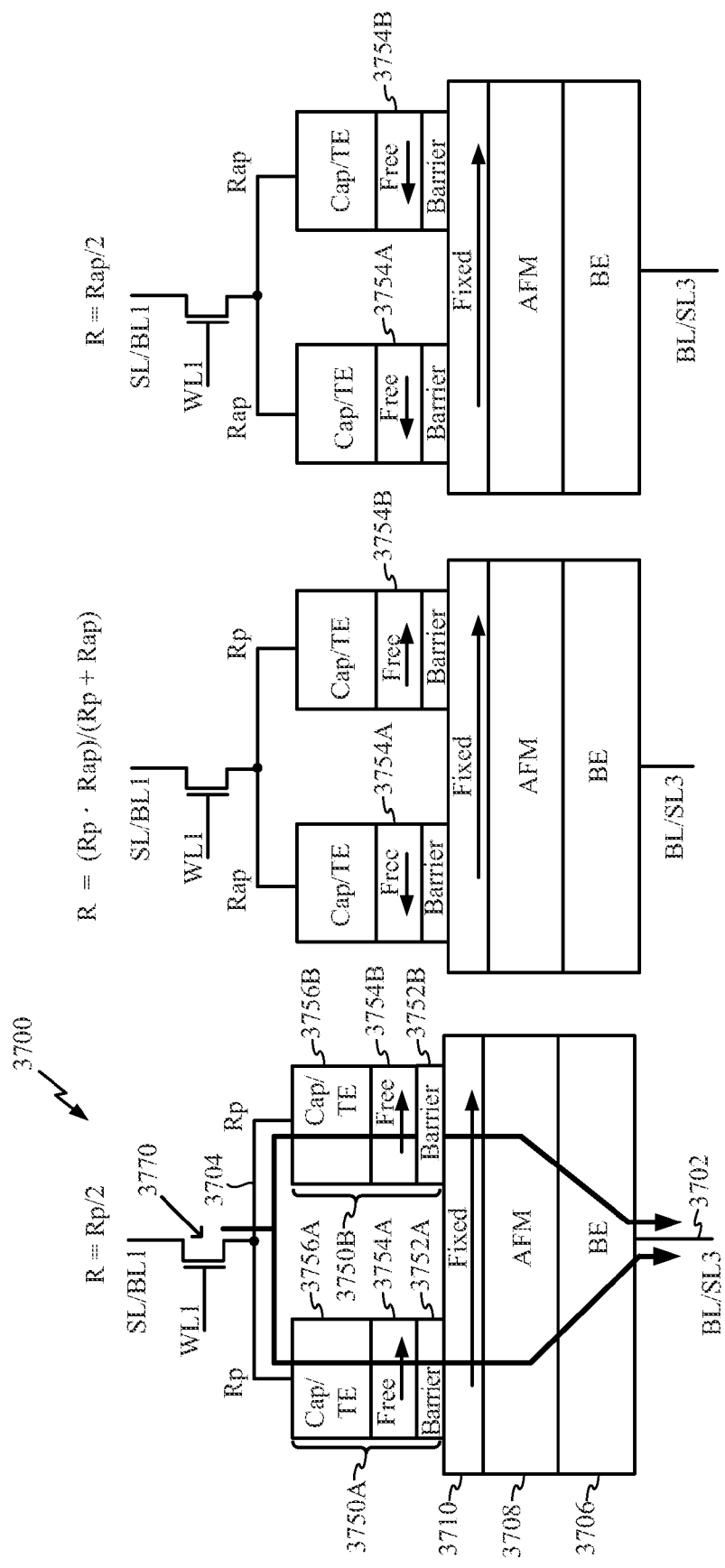
FIGS. 38A, 38B, and 38C show the FIG. 37 example two-terminal, multi-free layer, multi-level MTJ structure at an example first, second, and third set of magnetization states, respectively, formed during a statistical, feedback converging writing process according to one exemplary embodiment.

FIGS. 38A, 38B, and 38C show the FIG. 37 example two-terminal, multiple pillar, common AFM layer, common bottom electrode layer, multi-free layer MTJ structure at an example first, second, and third set of magnetization states, respectively, and the resistance exhibited at each of these states. It will be understood that the FIG. 38B state is arbitrarily shown as the FIG. 37 state of the free magnetization layer 3754A at an AP state and the free magnetization layer 3754B at a P state, and that the opposite state of the free magnetization layer 3754A at s P state and the free magnetization layer 3754B at an AP state can be another physical state representing the same device state. Moving between the three states (and a larger number of states when using more than two pillars 3750) can be performed by a statistical, feedback converging writing process according to various exemplary embodiments. Examples will be described in greater detail in reference to FIG. 49.

Figure 39:
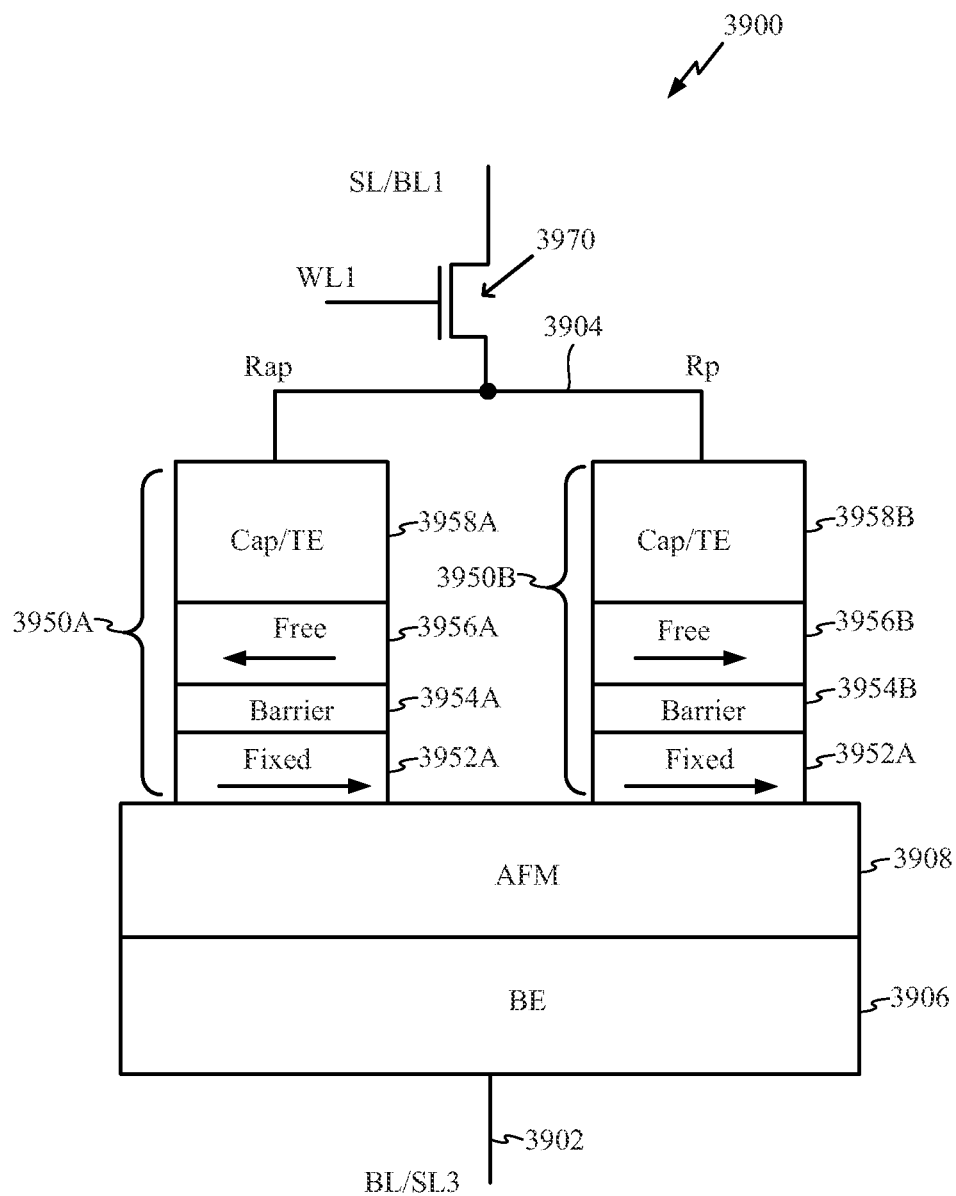
FIG. 39 shows one example multiple pillar, common AFM layer, common bottom electrode layer, multi-free layer MTJ structure according to one exemplary embodiment, in an aspect providing pillars having a capping layer, free-layer, barrier layer, and fixed layer, in accordance with one exemplary embodiment.

FIG. 39 shows one example multi-free layer, two-terminal multilevel MTJ device 3900 having a common bottom electrode layer 3906, and a common AFM layer 3908 disposed on the common bottom electrode layer 3906 and supporting, in this example, two pillars 3950A and 3950B that, in operation, can form two parallel current paths, each of the current paths having its own tunnel barrier, from the common AFM layer 3908 to a top interconnect 3904. The pillars 3950A, 3950B are collectively referenced as "pillars 3950," and it will be understood that the embodiments contemplate, in addition to two pillars 3950, more than two pillars 3950. Each of the pillars 3950A, 3950B can, in an aspect, be identically structured and, for purposes of avoiding complexity not necessary to the concepts of the fundamental embodiments, the structures will be assumed identical.

Continuing to refer to FIG. 39, in an aspect pillar 3950A can have a fixed layer 3952A that contacts and is supported on the common AFM later 3908 at a first location (shown but not explicitly labeled) and disposed, in bottom-to-top order beginning at the top of the fixed layer 3952A, a barrier layer 3954A, a free magnetization layer 3956A, and a capping/top electrode layer 3958A that can be coupled to the top interconnect 3904. Likewise, pillar 3950B can have a fixed layer 3952B facing and supported on the common AFM layer 3908 at a second location (shown but not explicitly labeled) displaced from the first location and, arranged in the same bottom-to-top order as described in relation to pillar 3950A, beginning at the top of the fixed layer 3952B, a barrier layer 3954B, a free magnetization layer 3956B, and a capping/top electrode layer 3958B that can be coupled to the top interconnect 3904. A bottom or first terminal 3902 can couple to the common bottom electrode layer 3906 and, in an aspect within an addressable array (not shown in FIG. 37), can couple to a bit line/select line BL/SL3. The top interconnect 3904 can couple to a select line/bit line SL/BL1, for example through a word line switch 3970 controlled by, for example, word line control signal WL1.

Figure 40:
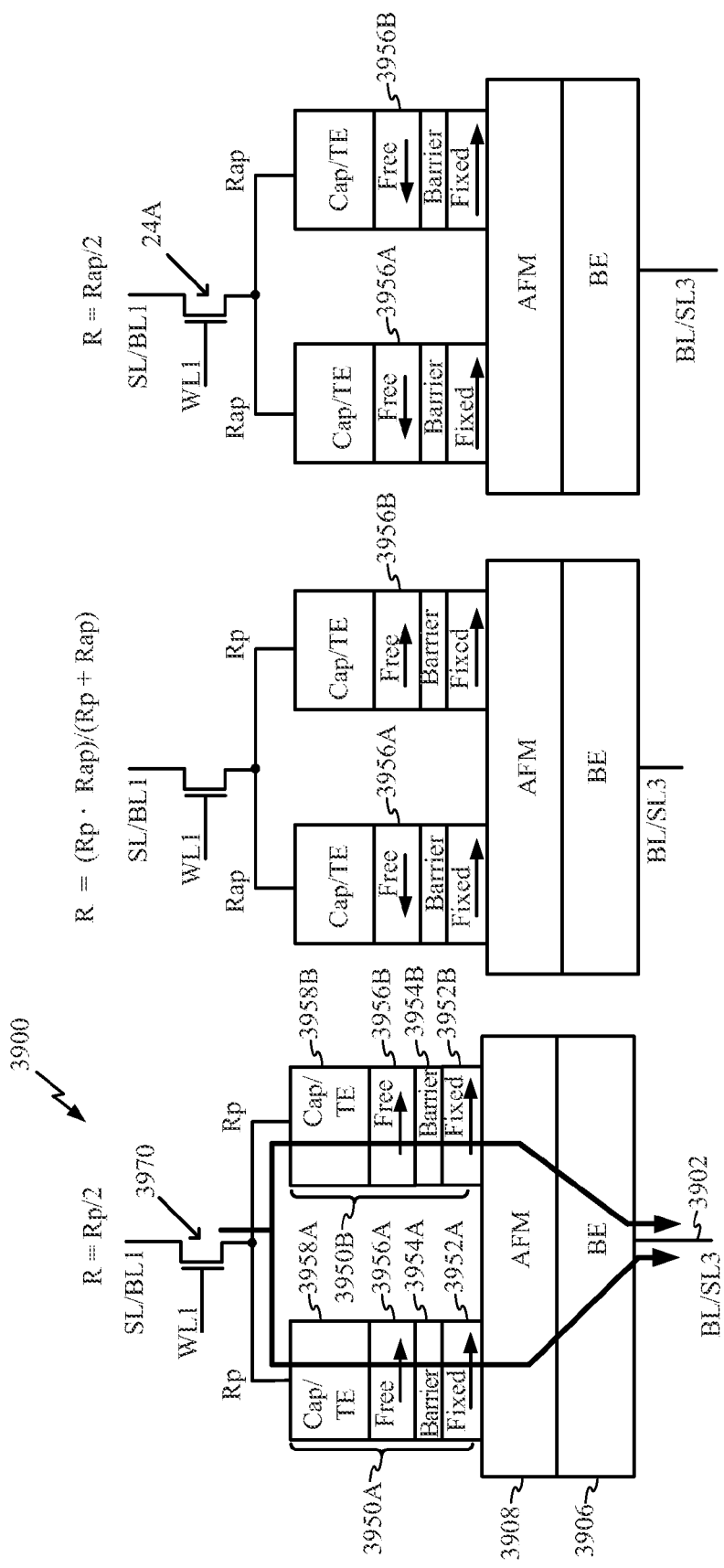
FIGS. 40A, 40B, and 40C show the FIG. 34 example two-terminal, multiple pillar, common AFM layer, common bottom electrode layer, multi-free layer MTJ structure at an example first, second, and third set of magnetization states, respectively, formed during a statistical, feedback converging writing process according to various exemplary embodiments.

FIGS. 40A, 40B, and 40C show the FIG. 39 example two-terminal, multiple pillar, common AFM layer, common bottom electrode layer, multi-free layer MTJ structure at an example first, second, and third set of magnetization states, respectively, and the resistance exhibited between the first terminal 3902 and the top interconnect 3904 at each of these states. It will be understood that the FIG. 40B state is arbitrarily shown as the FIG. 39 state of the free magnetization layer 3956A at an AP state and the free magnetization layer 3954B at a P state, and that the opposite state of the free magnetization layer 3956A at a P state and the free magnetization layer 3754B at a P state can be another physical state representing the same device state. Moving between the three states shown at FIGS. 40A, 40B, and 40C (and a larger number of states when using more than two pillars 3950) can be performed by a statistical, feedback converging writing process according to various exemplary embodiments. Examples will be described in greater detail in reference to FIG. 49.

Figure 41:
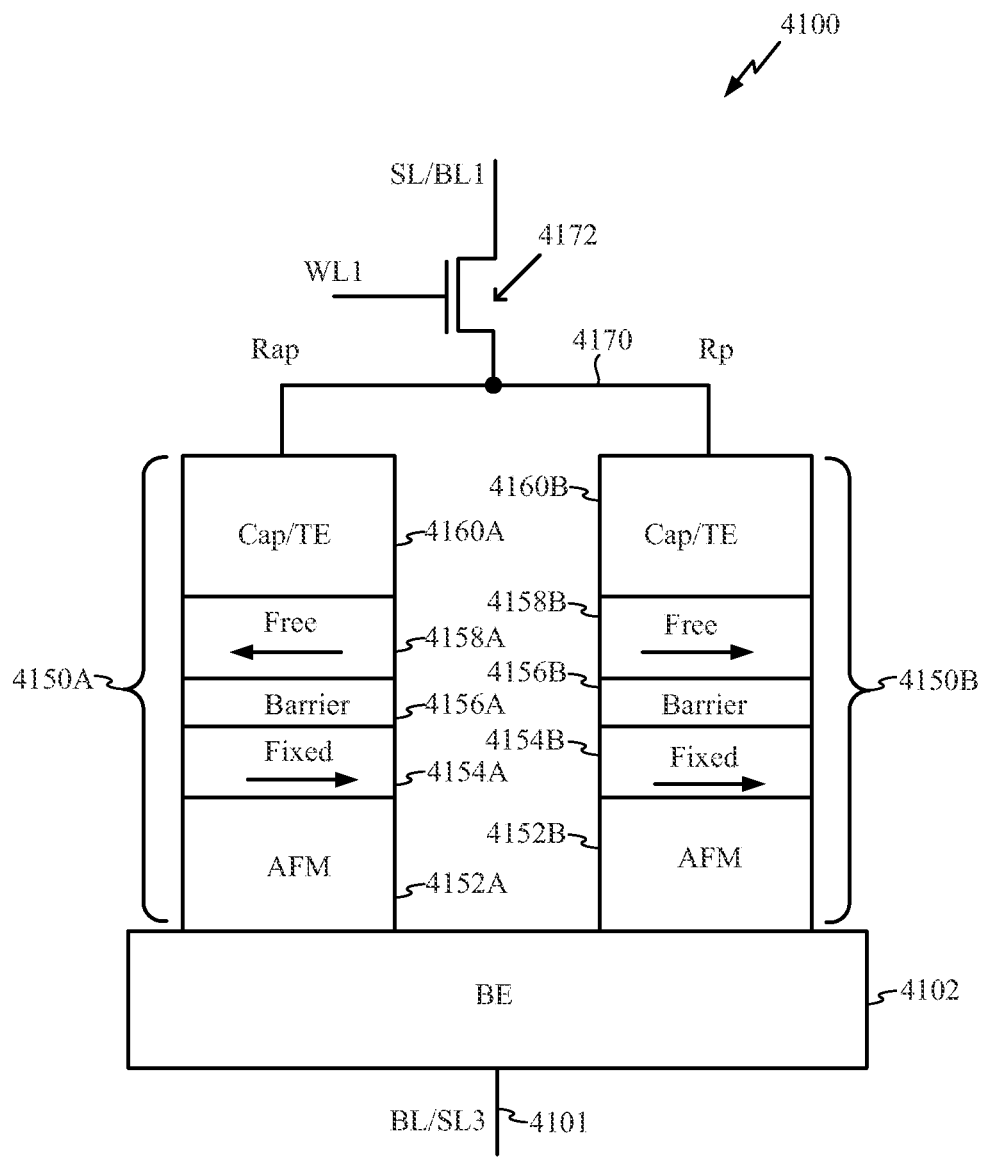
FIG. 41 shows one example multiple pillar, common bottom electrode layer, multi-free layer MTJ structure according to one exemplary embodiment, in an aspect including pillars having a capping layer, free-layer, barrier layer, fixed layer and AFM layer, in accordance with various exemplary embodiments.

FIG. 41 shows one example multiple pillar, common bottom electrode layer, multi-free layer, two-terminal, multi-level MTJ device 4100 according to another exemplary embodiment. Referring to FIG. 41, the multiple pillar, common bottom electrode layer, multi-free layer, two-terminal, multi-level MTJ device 4100 includes a common bottom electrode layer 4102 supporting, in this example, two pillars 4150A and 4150B that, in operation, can form two parallel current paths, each of the current paths having its own tunnel barrier, from the common bottom electrode layer 4102 to a top interconnect 4170. The pillars 4150A, 4150B are collectively referenced as "pillars 4150." It will be understood that the quantity of pillars 4150 extending parallel between the common bottom electrode layer 4102 and the top interconnect 4170 is not limited to the example of two. Each of the pillars 4150A, 4150B can, in an aspect, be identically structured and, for purposes of avoiding complexity not necessary to the concepts of the fundamental embodiments, the structures will be assumed identical.

Referring still to FIG. 41, in an aspect pillar 4150A can have an AFM layer 4152A as a base, supported at a first location (shown, but not separately labeled) on the common bottom electrode layer 4102 in bottom-to-top order beginning at the top of its AFM layer 4152A, a fixed layer 4154A, a barrier layer 4156A, a free magnetization layer 4158A, and a capping/top electrode layer 4160 coupling to the top interconnect 4170. In like fashion, pillar 4150B can have an AFM layer 4152B as a base, supported at a second location (shown, but not separately labeled) on the common bottom electrode layer 4102, laterally displaced from the first location. Pillar 4150B can have, in bottom-to-top order beginning at the top of its AFM layer 4152B, a fixed layer 4154B, a barrier layer 4156B, a free magnetization layer 4158B, and a capping/top electrode layer 4160B coupling to the same top interconnect 4170 coupled to the capping/top electrode layer 4160A of pillar 4150A. A bottom or first terminal 4101 can couple to the common bottom electrode layer 4102 and can, in an aspect within an addressable array (not shown in FIG. 41), couple to a bit line/select line BL/SL3. The top interconnect 4170 can couple to a select line/bit line SL/BL1, for example through a word line switch 4172 controlled by, for example, word line control signal WL1.

The FIG. 41 example multiple pillar, common bottom electrode layer, multi-free layer, two-terminal, multi-level MTJ device 4100 is shown with the free magnetization layer 4158A in an AP state and, therefore, exhibiting a resistance Rap, and the free magnetization layer 4158B in a P state and, therefore, exhibiting a resistance Rap. The overall resistance, between the first terminal 4101 and the top interconnect 4170 is therefore equal to the product of Rap and Rp divided by their sum. It will be understood that a reverse AP and P states of the magnetization layer 4158A and magnetization layer 4158B will exhibit the same resistance.

Figure 42:
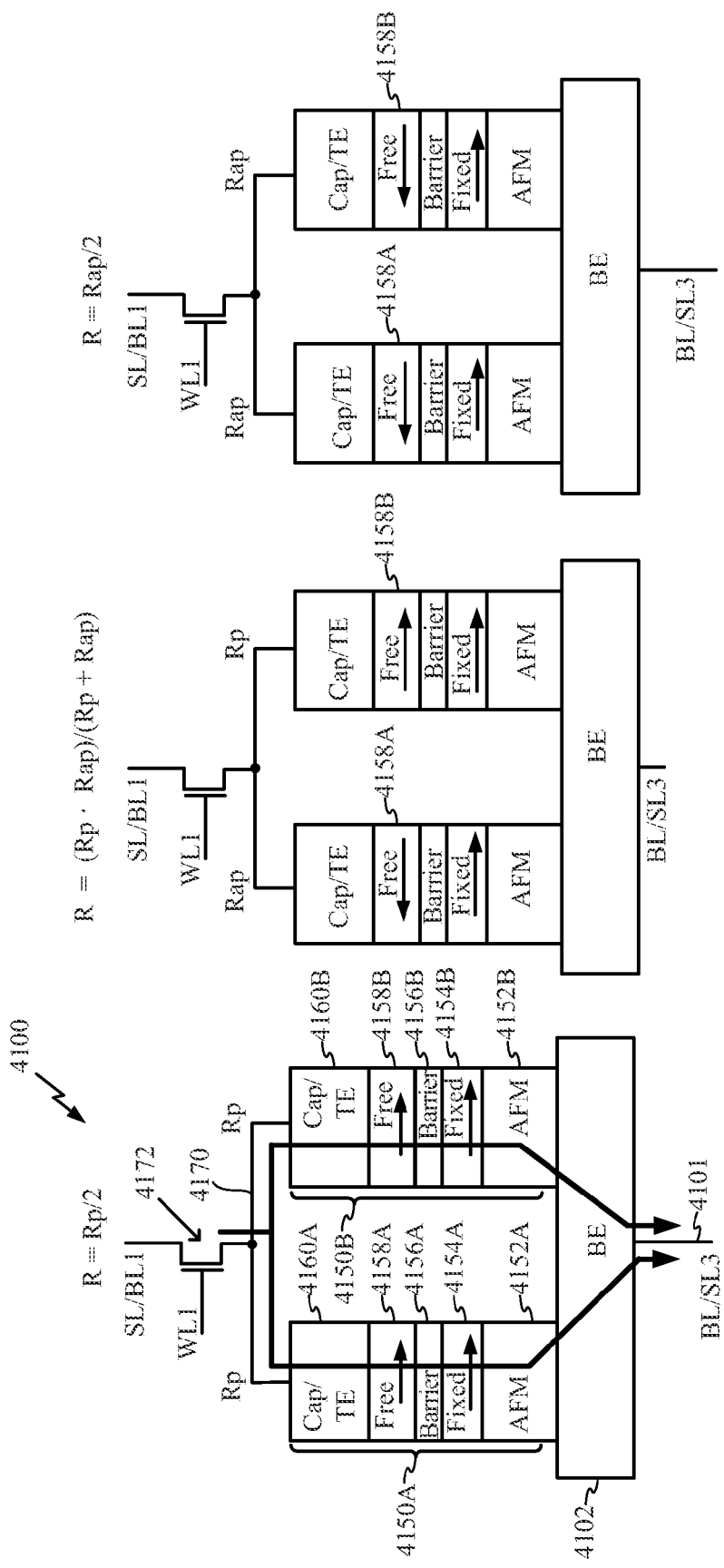
FIGS. 42A, 42B, and 42C show the FIG. 41 example two-terminal, multiple pillar, common bottom electrode layer, multi-free layer, multi-level MTJ structure according to one exemplary embodiment, at an example first, second, and third set of magnetization states, respectively, formed during a statistical, feedback converging writing process according to various exemplary embodiments.

FIGS. 42A, 42B, and 42C show the FIG. 41 example two-terminal, multiple pillar, common AFM layer, common bottom electrode layer, multi-free layer MTJ structure at an example first, second, and third set of magnetization states, respectively, and the resistance exhibited at each of these states. The FIG. 42B state is arbitrarily shown as the FIG. 41 state of the free magnetization layer 4158A at an AP state and the free magnetization layer 4158B at a P state. The opposite state, with the free magnetization layers 4158A and 4158B being at a P state and an AP state, respectively, can be another physical state representing the same device state. Moving between the three states (and a larger number of states when using more than two pillars 4150) can be performed by a statistical, feedback converging writing process according to various exemplary embodiments. Examples will be described in greater detail in reference to FIG. 49.

Figure 43:
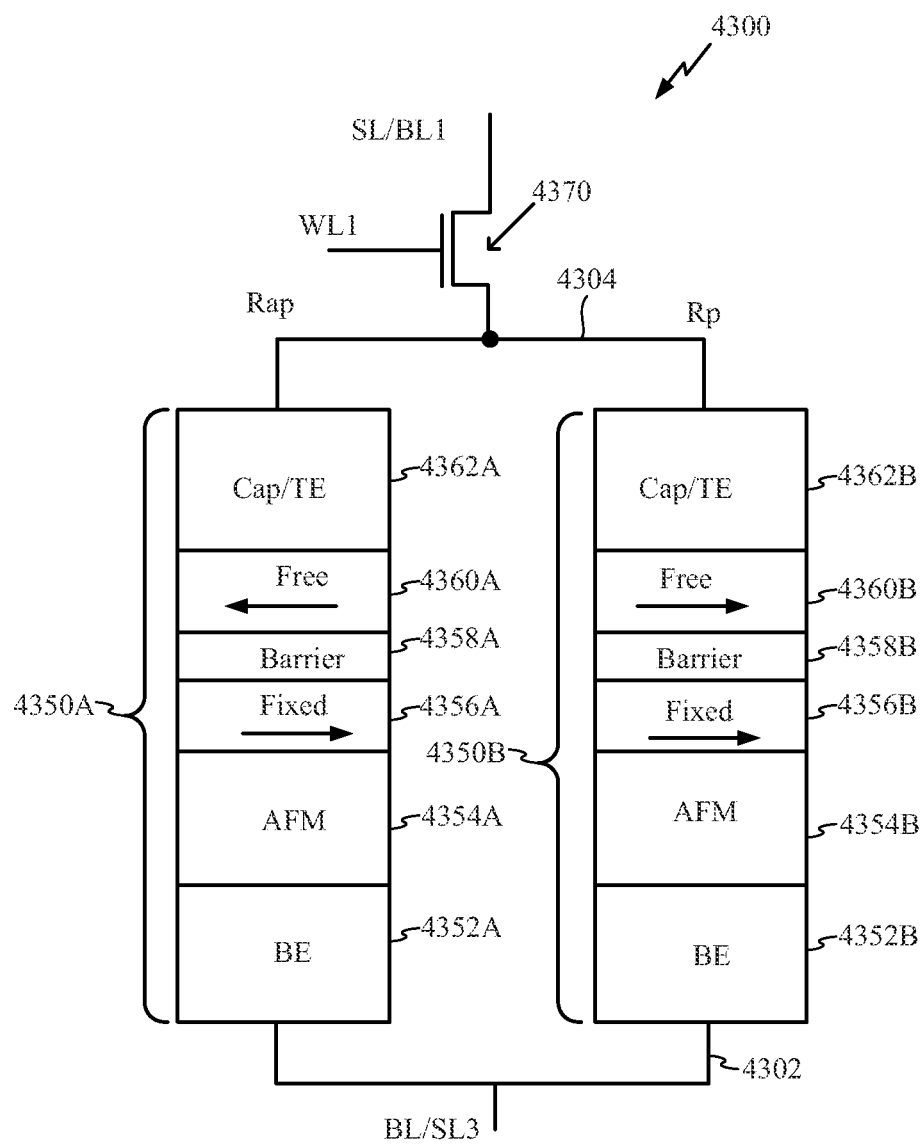
FIG. 43 shows one example two-terminal, multiple pillar, multi-free layer, multi-level MTJ structure according to one exemplary embodiment, in an aspect including pillars having a capping layer, free-layer, barrier layer, fixed layer, AFM layer and bottom electrode layer, in accordance with various exemplary embodiments.

FIG. 43 shows one example multiple pillar, multi-free layer, two-terminal, multi-level MTJ device 4300 according to one exemplary embodiment. Referring to FIG. 43, the multiple pillar, multi-free layer, two-terminal, multi-level MTJ device 4300 includes a plurality, in this example two, pillars 4350A, 4350B (collectively "pillars 4350") extending in parallel from a bottom interconnect 4302 to a top interconnect 4304. In operation the pillars 4350 can form parallel (in this example two) current paths, each of the current paths having its own tunnel barrier, from the bottom interconnect 4302 to the top interconnect 4304. It will be understood that the quantity of pillars 4350 extending parallel between the bottom interconnect 4302 and the top interconnect 4304 is not limited to the example of two. Each of the pillars 4350A, 4350B can, in an aspect, be identically structured and, for purposes of avoiding complexity not necessary to the concepts of the fundamental embodiments, the structures will be assumed identical.

With continuing reference to FIG. 43, pillar 4350A can have, in bottom-to-top order, with "bottom" being the end coupled to the bottom interconnect 4302 and "top" being the end coupled to the top interconnect 4304, a bottom electrode layer 4352A, an AFM layer 4354A, a fixed layer 4356A, a barrier layer 4358A, a free magnetization layer 4360A, and a capping/top electrode layer 4362A that can be coupled to the top interconnect 4304. Pillar 4350B can likewise have, in the same bottom-to-top order, a bottom electrode layer 4352B, an AFM layer 4354B, a fixed layer 4356B, a barrier layer 4358B, a free magnetization layer 4360B, and a capping/top electrode layer 4362B that can couple to the top interconnect 4304. The bottom interconnect 4302 can form a first terminal that, in an aspect within an addressable array (not shown in FIG. 43), can couple to a bit line/select line BL/SL3. The top interconnect 4170 can couple to a select line/bit line SL/BL1, for example through a word line switch 4370 controlled by, for example, word line control signal WL1.

FIGS. 44A, 44B, and 44C show the FIG. 43 example two-terminal, multiple pillar device, at an example first, second, and third set of magnetization states, respectively, that can be formed during a statistical, feedback converging writing process according to one exemplary embodiment. The FIG. 44B state is arbitrarily shown as the FIG. 43 state of the free magnetization layer 4360A at an AP state and the free magnetization layer 4360B at a P state. The opposite state, with the free magnetization layers 4360A and 4360B being at a P state and an AP state, respectively, can be another physical state representing the same device state.

Figure 45A:
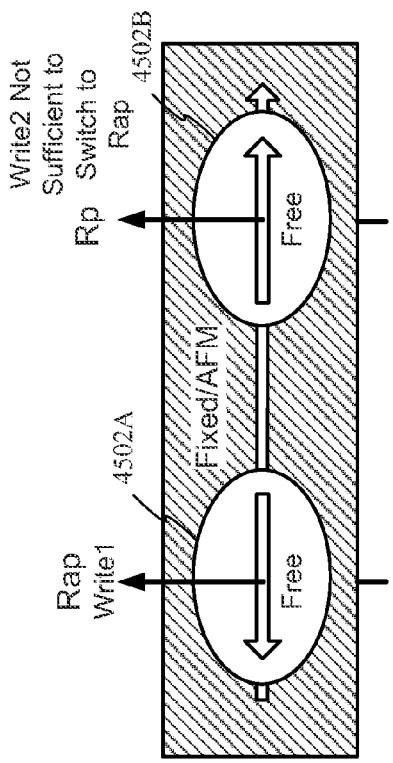
FIGS. 45A, 45B, 45C and 45D show four possible sets of free-layer magnetization states for one example of one two-terminal, multi-level, multi-free layer, in-plane MTJ structure according to one exemplary embodiment, with corresponding write current directions and resulting resistances.

FIGS. 45A, 45B, 45C and 45D show four possible sets of free-layer magnetization states for one example of one two-terminal, multi-level, multi-free layer, in-plane MTJ structure according to one exemplary embodiment, with corresponding write current directions and resulting resistances. Referring to FIG. 45A, write current Write1 is shown passing (e.g., being injected) through free layer 4502A in a direction switching (or repeating an earlier switching) of the free layer 4502A to an Rp state, concurrent with (or sequential to), write current Write2 passing (or being injected) through free layer 4502B in the same direction switching (or repeating an earlier switching) of the free layer 4502B to that Rp state as well. As known to persons of ordinary skill in the art from reading this disclosure, selection of the magnitude and duration of the Write1 and Write2 currents is application-specific, based on factors such as, without limitation, physical parameters of the MTJ structure and, in accordance with various exemplary embodiments, a desired probability that the Write 1 or Write 2 will effect a switching. As will be described in greater detail below, according to various exemplary embodiments, the desired probability can be other than 100%. Persons of ordinary skill in the art, however, can readily determine the levels and durations for Write1 and Write2 by applying general MTJ techniques known to such persons to the present disclosure and, therefore, further detailed description of specific magnitudes and durations is therefore omitted.

Figure 45B:
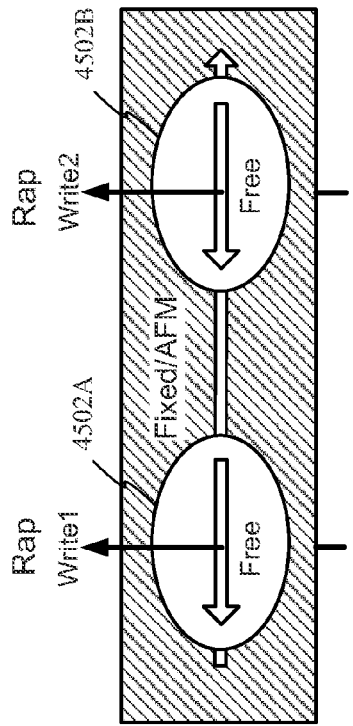
Figure 45C:
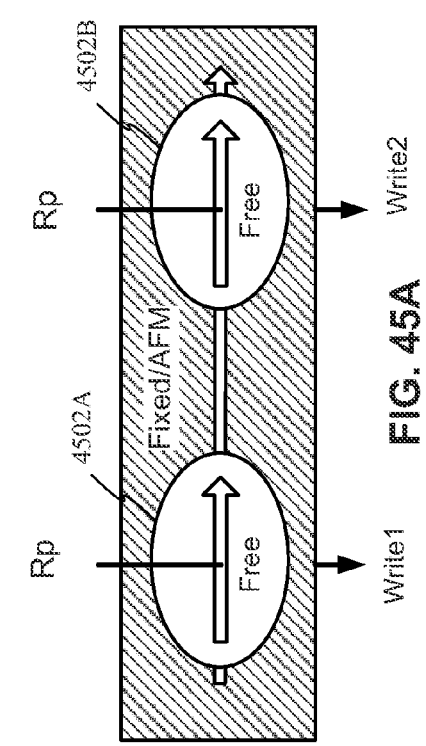
Figure 45D:
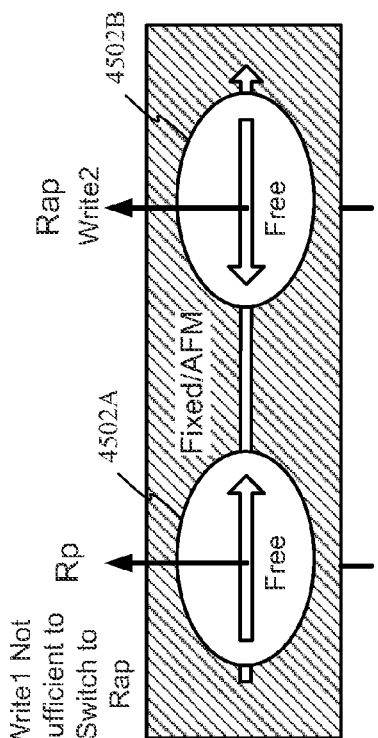
Figure 46A:
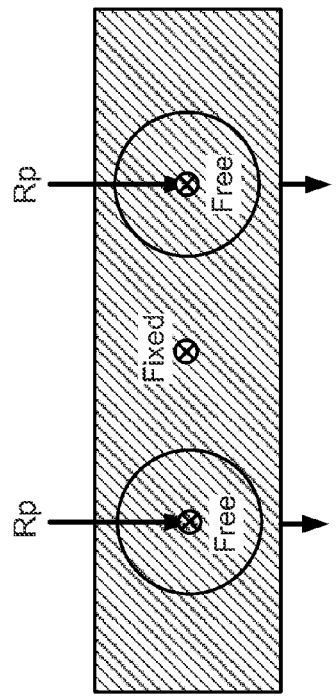
FIGS. 46A, 46B, 46C and 46D show four possible sets of free-layer magnetization states for one example of one two-terminal, multi-level, multi-free layer, perpendicular MTJ structure according to one exemplary embodiment, with corresponding write current directions and resulting resistances.
Figure 46B:
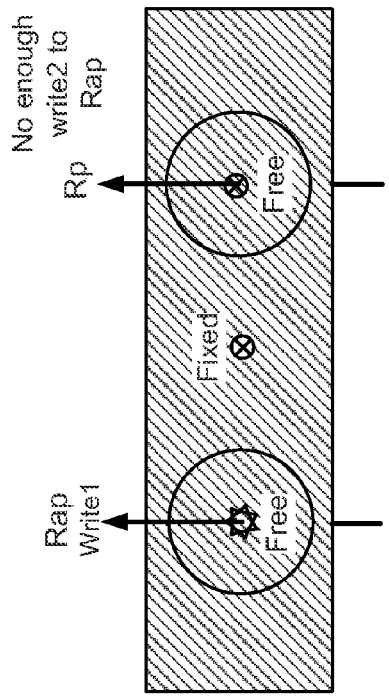
Figure 46C:
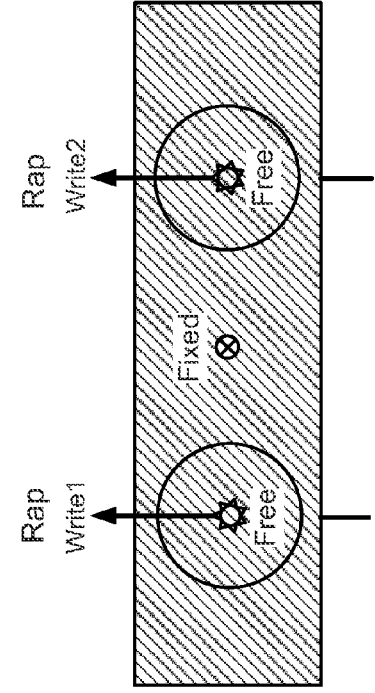
Figure 46D:
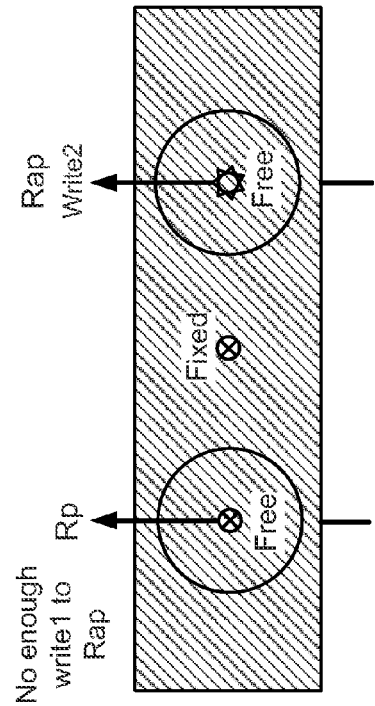

Referring to FIG. 45B, to reverse the magnetization state of the free magnetization layer 4502A to the Rap state, without reversing the magnetization state of the free magnetization layer 4502B, Write1 is injected in a direction opposite that shown at FIG. 45A, at a magnitude and duration sufficient to switch the state, while Write2 is below the level sufficient to switch its state. Referring to FIG. 45C, to reverse the magnetization state of the free magnetization layer 4502B to the Rap state, without reversing the magnetization state of the free magnetization layer 4502A, Write2 is injected in a direction opposite that shown at FIG. 45A, at a magnitude and duration sufficient to switch the state of the magnetization layer 4502B, while Write1 is below the level sufficient to switch the state of the free magnetization layer 4502A. Referring to FIG. 45D, to reverse the magnetization state of the free magnetization layers 4502A and 4502B to the Rap state, Write 1 and Write2 are injected (concurrently or sequentially), both in a direction opposite their direction shown at FIG. 45A, at a magnitude and duration sufficient to switch the state of the magnetization layers 4502A and 4502B to the Rap state.

FIGS. 46A, 46B, 46C and 46D show four possible sets of free-layer magnetization states for one example of one two-terminal, multi-level, multi-free layer, perpendicular MTJ structure according to one exemplary embodiment, with corresponding Write1 and Write2 current directions and resulting resistances, substantially as described in reference to FIGS. 45A-45D.

Figure 47:
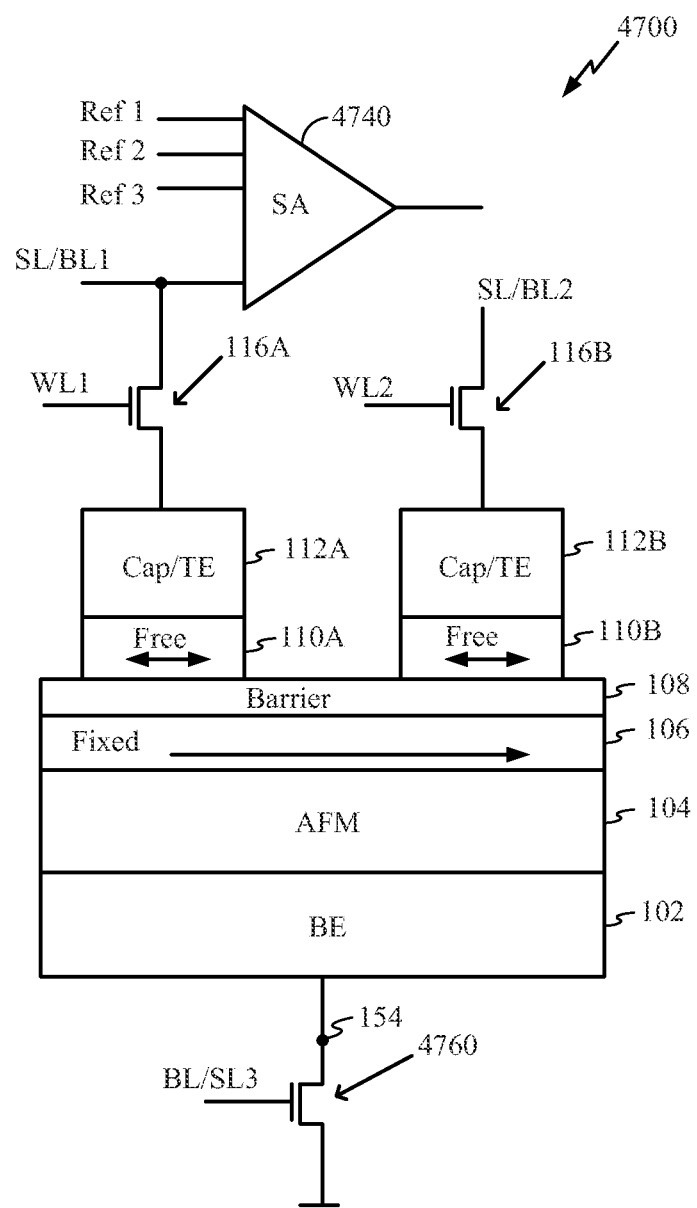
FIG. 47 shows one multi-level MTJ storage cell, employing the read FIG. 8 multiple terminal, multi-free layer, corresponding separate barrier layer MTJ structure, according to one exemplary embodiment.

FIG. 47 shows one multi-level MTJ storage cell 4700, employing the read FIG. 1 multiple terminal, multi-free layer, corresponding separate barrier layer MTJ structure 100, combined with a sense amplifier 4740, and a third terminal switch FET 4760 selectively coupling the third or MTJ base terminal 154 to a bit/switch line BL/SL3, according to one exemplary embodiment. Referring to FIG. 47, one example storage process according to an embodiment will be described, assuming a two-bit binary data "S2, S1," with "S1" being at a first bit position and "S2" being at a second bit position. According to one aspect, the "S1" first bit can be written by WL1 and BL/SL3 switching to an ON level which, in turn, switches ON the first word line switch 116A and the third terminal switch FET 4760. A write current then passes through the first free magnetization layer 110A in a direction according to S1, switching (or maintaining a previous switching" of) the first free magnetization layer 110A to one of a P or AP state, based on "S1". In a similar aspect, the "S2" second bit can be written by WL2 and BL/SL3 switching to an ON level which, in turn, switches ON the second word line switch 116B and the third terminal switch FET 4760, for a write current to passes through the second free magnetization layer 110B in a direction according to S2. This switches (or maintains a previous switching" the second free magnetization layer 110B to one of a P or AP state, based on "S2."

Referring still to FIG. 47, to read "S1" WL1 and BL/SL3 can be switched ON level which switches ON the first word line switch 116A and the third terminal switch FET 4760, and read current can pass from SL/BL1 through the first free magnetization layer 110A. This establishes a sense voltage at the IN input of the SA 4740, which is compared to Ref 3. Ref 3 can be configured to be at the midpoint between the sense voltage if the first free magnetization layer 110A is in a P state and the sense voltage if the free magnetization layer is in an AP state. In a further aspect, to read "S2" WL1 and WL2 can be switched to an ON level which switches ON the first and second word line switches 116A and 116B, while BL/SL3 is switched OFF, which switches OFF the third terminal switch FET 4760. A series read current can then pass from SL/BL1 through the first free magnetization layer 110A, into the common barrier layer 108, laterally through common barrier layer 108, up through the second free magnetization layer 110B, through the capping/top electrode layer 112B, through the second word line switch 116B and to SL/BL2. This establishes a series sense voltage at the IN input of the SA 4740, which is compared to Ref. 1 and 2. Ref 1 can be configured to be at the midpoint between the series sense voltage that is exhibited if, assuming the first free magnetization layer 110A is at Rp, a first instance in which the second free magnetization layer 110B is at a Rp, and a second instance in which the second free magnetization layer 110B is at a Rap. Ref 2 can be configured to be at the midpoint between the series sense voltage that is exhibited if, assuming the first free magnetization layer 110A is at Rap, a first instance in which the second free magnetization layer 110B is at a Rp, and a second instance in which the second free magnetization layer 110B is at a Rap.

Figure 48:
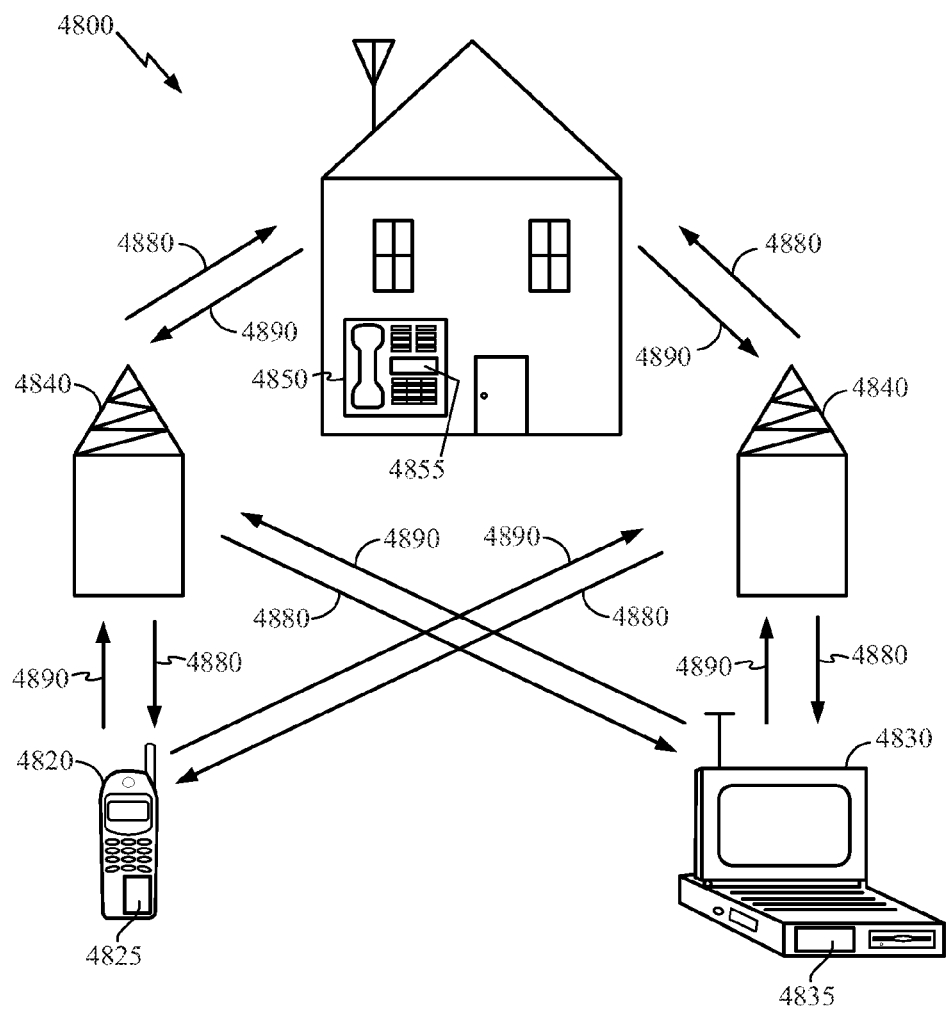
FIG. 48 illustrates an exemplary wireless communication system in which one or more embodiments of the disclosure may be advantageously employed.

FIG. 48 illustrates an exemplary wireless communication system 4800 in which one or more embodiments of the disclosure may be advantageously employed. For purposes of illustration, FIG. 48 shows three remote units 4820, 4830, and 4850 and two base stations 4840. It will be recognized that conventional wireless communication systems may have many more remote units and base stations. The remote units 4820, 4830, and 4850 include integrated circuit or other semiconductor devices 4825, 4835 and 4855 (including on-chip voltage regulators, as disclosed herein), which are among embodiments of the disclosure as discussed further below. FIG. 48 shows forward link signals 4880 from the base stations 4840 and the remote units 4820, 4830, and 4850 and reverse link signals 4890 from the remote units 4820, 4830, and 4850 to the base stations 4840.

In FIG. 48, the remote unit 4820 is shown as a mobile telephone, the remote unit 4830 is shown as a portable computer, and the remote unit 4850 is shown as a fixed location remote unit in a wireless local loop system. For example, the remote units may be any one or combination of a mobile phone, hand-held personal communication system (PCS) unit, portable data unit such as a personal data assistant (PDA), navigation device (such as GPS enabled devices), set top box, music player, video player, entertainment unit, fixed location data unit such as meter reading equipment, or any other device that stores or retrieves data or computer instructions, or any combination thereof. Although FIG. 48 illustrates remote units according to the teachings of the disclosure, the disclosure is not limited to these exemplary illustrated units. Embodiments of the disclosure may be suitably employed in any device which includes active integrated circuitry including memory and on-chip circuitry for test and characterization.

Figure 49:
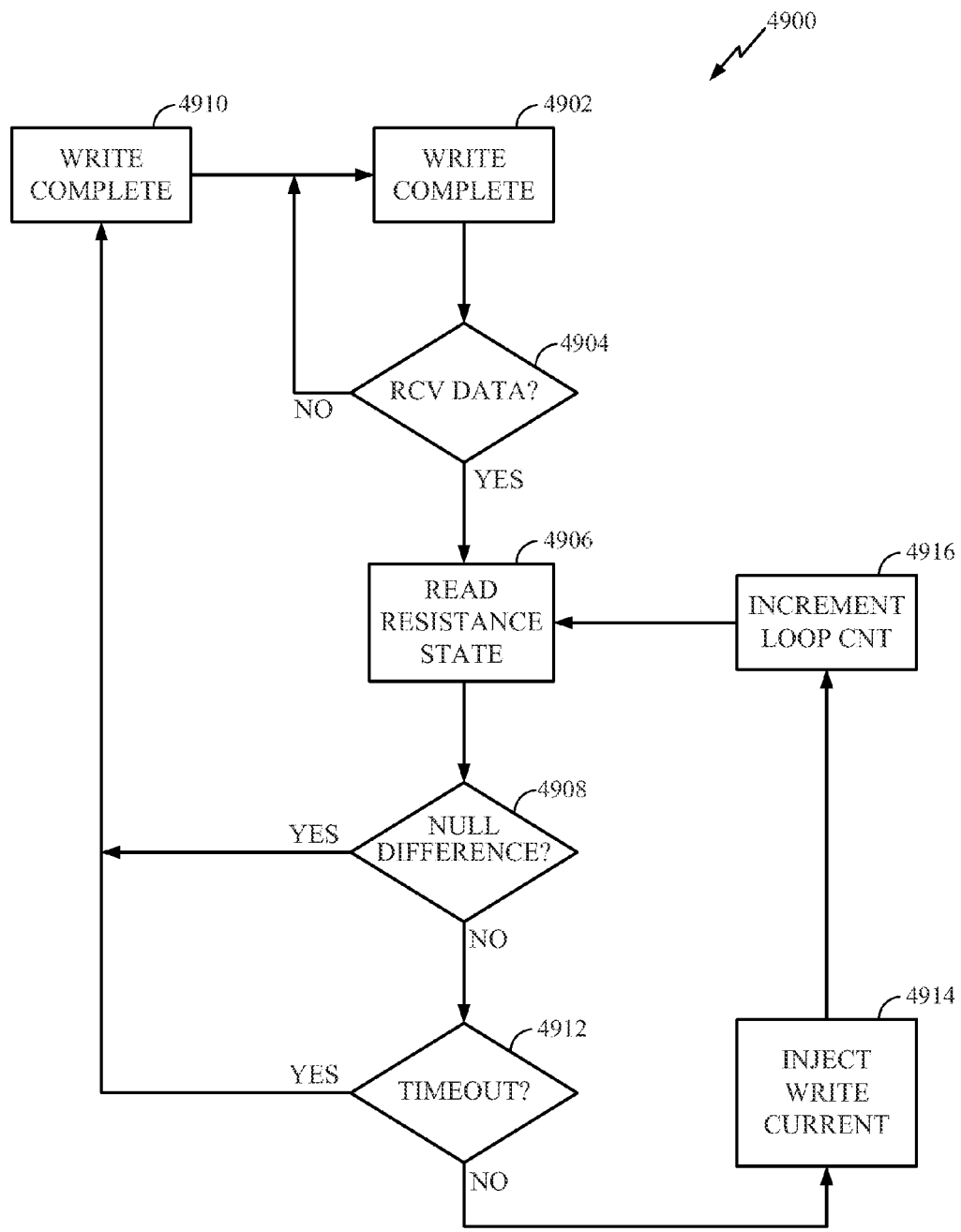
FIG. 49 shows a flow diagram of one example statistical, feedback converging writing for a two-terminal, multi-free layer, multi-level MTJ device according to various exemplary embodiments.

FIG. 49 is a flow diagram of one example statistical, feedback converging writing 4900 for a two-terminal, multi-free layer, multi-level MTJ device according to various exemplary embodiments. To illustrate concepts, a process according to the FIG. 49 example 4900 will be described in reference to the FIG. 35 example two-terminal, multi-free layer, multi-level MTJ device 3500. As will be understood, this is only for purposes of example, and is not any limitation on the scope of the various exemplary embodiments may be practiced.

As will be understood by persons of ordinary skill in the art from this disclosure, the FIG. 49 example statistical, feedback converging writing 4900 is iterative, and the exact number of loops or iterations required to complete the programming may be unknown. Hence, programming two-terminal, multi-free layer, multi-level MTJ devices according to various embodiments may be alternatively referred to as, for example, "iterative programming," "probabilistic programming," o."

Referring now to FIG. 49, the example statistical, feedback converging writing 4900 may start from an initial state 4902. The initial state 4902 may, for example, be an arbitrary state of the magnetizations of the free magnetization layers in FIG. 35. In one aspect the initial state includes, or assumes resetting a PC time-out counter (not shown) to zero. At 4904 a value to write is received, whereupon the process goes to 4906 to read the two-terminal resistance of the FIG. 35 device. The read at 4906 may be provided by, for example, a read current source (not shown) injecting a read current through the FIG. 35 device and then comparing the resulting voltage to a target voltage corresponding to the target resistance.

With continuing reference to FIG. 49, after the read at 4906 the example statistical, feedback converging writing 4900 goes to the null exit decision block 4908 which compares the read at 4906 to a null difference criterion or other given criterion, examples of which are described below. If the null exit decision block 4908 indicates a "YES" the process terminates by going to the write complete block 4910 and then back to the initial state 4902. In one aspect, the null difference criterion applied by the null exit decision block 4908 may be FIG. 35 device being at the target resistance state. In another aspect, the null difference criterion may be defined as the resistance state being within a given distance of the target resistance state. As will be understood, one case of a "YES" at the first instance of entering the null exit decision block 4908 may be the FIG. 35 device being at the state representing the data to be written.

With continuing reference to FIG. 49, if the null exit decision block 4908 indicates "NO" the example statistical, feedback converging writing 4900 may go to the timeout exit decision block 4912, where a time-out counter value (not shown) is compared to a given time-out. If the timeout exit decision block 4912 indicates a "YES," the process terminates by going to the write complete block 4910 and back to the initial state 4902.

Referring still to FIG. 49, if the timeout exit decision block 4912 indicates a "NO," the process goes to 4914, to apply or inject a first or, if the instant loop is a repeat loop, another appropriate programming current pulse, and then goes to 4916 and increments a counter, and repeats the depicted and above-described loop until a termination condition is detected at one of the decision blocks 4908 and 4912.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, an embodiment of the invention can include a computer readable media embodying a method for implementation. Accordingly, the invention is not limited to illustrated examples and any means for performing the functionality described herein are included in embodiments of the invention.

The foregoing disclosed devices and functionalities may be designed and configured into computer files (e.g. RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then employed in devices described above.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A multi-free layer magnetic tunnel junction (MTJ) cell comprising:
    a bottom electrode layer;
    an anti-ferromagnetic (AFM) layer on the bottom electrode layer;
    a fixed magnetization layer on the anti-ferromagnetic layer;
    a barrier layer on the fixed magnetization layer;
    a first free magnetization layer on a first area of the barrier layer;
    a second free magnetization layer on a second area of the barrier layer, laterally displaced from the first area;
    a first top electrode coupled to the first free magnetization layer and a second top electrode coupled to the second free magnetization layer;
    a first read/write terminal coupled to a first bit/select line;
    a first current switch configured to receive a first control line signal switchable between an ON voltage and an OFF voltage and, in response, to respectively switch between coupling and not coupling the first top electrode to the first read/write terminal;
    a second read/write terminal coupled to a second bit/select line;
    a second current switch configured to receive a second control line signal switchable between an ON voltage and an OFF voltage and, in response, to respectively switch between coupling and not coupling the second top electrode to the second read/write terminal;
    a third read/write terminal coupled to a third bit/select line; and
    a third current switch configured to receive a third control line signal switchable between an ON voltage and an OFF voltage and, in response, to respectively switch between coupling and not coupling the bottom electrode layer to the third read/write terminal.

2. The multi-free layer MTJ cell of claim 1, further comprising:
    a read current switch control configured to generate the first control line signal, the second control line signal and the third control line signal according to a first read mode, wherein, in the first read mode, the first control line signal is at the ON voltage, the second control line signal is at the OFF voltage, and the third control line signal is at the ON voltage, and wherein the read current switch control is further configured to generate the first control line signal, the second control line signal and the third control line signal according to a second read mode, wherein, in the second read mode, the first control line signal is at the ON voltage, the second control line signal is at the ON voltage, and the third control line signal is at the OFF voltage.

3. The multi-free layer MTJ cell of claim 1, further comprising:
a read current switch control configured to generate the first control line signal, the second control line signal and the third control line signal according to a first read mode, wherein, in the first read mode, the first control line signal, the second control line signal, and the third control line signal are at respective ON/OFF voltages that the place the first current switch, second current switch and third current switch in respective states that establish a first read mode current path from the first read/write terminal to the third read/write terminal, wherein the first read mode current path includes the first free magnetization layer and does not include the second free magnetization layer, and
wherein the read current switch control is further configured to generate the first control line signal, the second control line signal and the third control line signal according to a second read mode, wherein, in the second read mode, the first control line signal, the second control line signal, and the third control line signal are at respective ON/OFF voltages that establish a second read current path between the first read/write terminal and the second read/write terminal, wherein the second read current path includes the first free magnetization layer in series with the second free magnetization layer.

4. The multi-free layer MTJ cell of claim 3, wherein the second read current path further includes the fixed magnetization layer between an interface of the fixed magnetization layer with the barrier layer under the first area and an interface of the fixed magnetization layer with the barrier layer under the second area.

5. The multi-free layer MTJ cell of claim 3, wherein the second read path further includes the first current switch, the barrier layer at the first area, the fixed magnetization layer between an interface of the fixed magnetization layer with the barrier layer under the first area and an interface of the fixed magnetization layer with the barrier layer under the second area, the barrier layer at the second area, and the second current switch, and wherein the first read path further includes the first current switch, the barrier layer at the first area, the fixed magnetization layer, the AFM layer, the bottom electrode layer and the third current switch.

6. The multi-free layer MTJ cell of claim 1, wherein the multi-free layer MTJ cell is integrated in at least one semiconductor die.

7. The multi-free layer MTJ cell of claim 1, further comprising a device, selected from the group consisting of a set top box, music player, video player, entertainment unit, navigation device, communications device, personal digital assistant (PDA), fixed location data unit, and a computer, into which the multi-free layer MTJ cell is integrated.

8. A method for magnetic tunnel junction (MTJ) memory, comprising:
injecting a first write current from one of a first read/write terminal and a base read/write terminal to the other of the first read/write terminal and the base read/write terminal, the first write current passing through a first free magnetization layer;
injecting a second write current from one of a second read/write terminal and the base read/write terminal to the other of the second read/write terminal and the base read/write terminal, the second write current passing through a second free magnetization layer;
detecting a magnetization state of the first free magnetization layer; and
detecting a magnetization state of the second free magnetization layer, wherein detecting the magnetization state of the second free magnetization layer is based in part on a result of detecting the magnetization state of the first free magnetization layer.

9. The method for MTJ memory of claim 8, wherein detecting the magnetization state of the first free magnetization layer includes
injecting a first read current into one of the first read/write terminal and the base read/write terminal, through the first free magnetization layer and not through second free magnetization layer, and out of the other of the first read/write terminal and the base read/write terminal, to generate, on one of the first read/write terminal and the base read/write terminal, a first sense voltage indicative of the resistance state of the first free magnetization layer,
comparing the first sense voltage to a first reference, and
detecting the magnetization state of the first free magnetization layer based on the comparing the first voltage to the first reference, and
wherein detecting the magnetization state of the second free magnetization layer includes
selecting, as a selected reference, between a second reference and a third reference, based on a result of detecting the magnetization state of the first free magnetization layer,
injecting a second read current into one of the first read/write terminal and the through read/write terminal, through a succession of the first free magnetization layer and the second free magnetization layer, and out of the other of the first read/write terminal and the second read/write terminal to generate, on one of the first read/write terminal and the second read/write terminal, a second sense voltage indicative of the resistance state of the first free magnetization layer in series with the resistance state of the second free magnetization layer,
comparing the second sense voltage to the selected reference, and
detecting the magnetization state of the second free magnetization layer based on the comparing the second sense voltage to the selected reference.

10. The method for MTJ memory of claim 8, wherein the first write current further passes through a first region of a barrier layer, a first region of a fixed magnetization layer, and a first region of an anti-ferromagnetic layer coupled to the base read/write terminal; and
wherein the second write current further passes through a second region of the barrier layer, a second region of the fixed magnetization layer, and a second region of the anti-ferromagnetic layer coupled to the base read/write terminal.

11. The method for MTJ memory of claim 10, wherein the second read current flows further flows through the first region of the barrier layer, into one of the first region and the second region of the fixed magnetization layer, out of the other of the first region and the second region of the fixed magnetization layer, and through the second region of the barrier layer.

12. A method for magnetic tunnel junction (MTJ) memory storage of a multi-bit data, comprising:
- storing a first bit by injecting a first write current, based on said first bit, from one of a first read/write MTJ terminal and a base read/write MTJ terminal to the other of the first read/write MTJ terminal and the base read/write MTJ terminal, the first write current passing through a first free magnetization layer to place the first free magnetization layer in a state indicating the first bit;
- storing a second bit by injecting a second write current, based on said second bit, from one of a second read/write MTJ terminal and the base read/write MTJ terminal to the other of the second read/write MTJ terminal and the base read/write MTJ terminal, the second write current passing through a second free magnetization layer to place the second free magnetization layer in a state indicating the second bit;
- reading the first bit, wherein reading the first bit comprises
  - injecting a first read current into one of the first read/write terminal and the base read/write terminal, through the first free magnetization layer and not through second free magnetization layer, and out of the other of the first read/write terminal and the base read/write terminal, to generate a first sense voltage on one of the first read/write terminal and the base read/write terminal,
  - comparing the first sense voltage to a first reference,
  - detecting the first bit based on the comparing the first sense voltage to the first reference; and
- reading the second bit, wherein reading the second bit comprises
  - selecting, as a selected reference, between a second reference and a third reference, based on a result of detecting the first bit,
  - injecting a second read current into one of the first read/write terminal and the through read/write terminal, through a succession of the first free magnetization layer and the second free magnetization layer, and out of the other of the first read/write terminal and the second read/write terminal, to generate, on one of the first read/write terminal and the second read/write terminal, a second sense voltage,
  - comparing the second sense voltage to the selected reference, and
  - detecting the second bit based on the comparing the second sense voltage to the selected reference.

13. An apparatus for magnetic tunnel junction (MTJ) memory, comprising:
- means for injecting a first write current from one of a first read/write terminal and a base read/write terminal to the other of the first read/write terminal and the base read/write terminal, the first write current passing through a first free magnetization layer;
- means for injecting a second write current from one of a second read/write MTJ terminal and the base read/write terminal to the other of the second read/write MTJ terminal and the base read/write terminal, the second write current passing through a second free magnetization layer;
- means for detecting a magnetization state of the first free magnetization layer; and
- means for detecting a magnetization state of the second free magnetization layer based, in part, on a result of detecting the magnetization state of the first free magnetization layer.

14. The apparatus of claim 13, wherein the means for detecting the magnetization state of the first free magnetization layer is configured to
- inject a first read current into one of the first read/write terminal and the base read/write terminal, through the first free magnetization layer and not through second free magnetization layer, and out of the other of the first read/write terminal and the base read/write terminal, to generate, on one of the first read/write terminal and the base read/write terminal, a first sense voltage indicative of the resistance state of the first free magnetization layer,
- compare the first sense voltage to a first reference, and
- detect the magnetization state of the first free magnetization layer based on the comparing the first sense voltage to the first reference, and
- wherein means for detecting the magnetization state of the second free magnetization layer is configured to
- select, as a selected reference, between a second reference and a third reference, based on a result of detecting the magnetization state of the first free magnetization layer,
- inject a second read current into one of the first read/write terminal and the through read/write terminal, through a succession of the first free magnetization layer and the second free magnetization layer, and out of the other of the first read/write terminal and the second read/write terminal to generate a second sense voltage on one of the first read/write terminal and the second read/write terminal,
- compare the second sense voltage to the selected reference, and
- detect the magnetization state of the second free magnetization layer based on the comparing the second sense voltage to the selected reference.

15. The apparatus of claim 13, wherein the multi-free layer MTJ cell is integrated in at least one semiconductor die.

16. The apparatus of claim 13, further comprising a device, selected from the group consisting of a set top box, music player, video player, entertainment unit, navigation device, communications device, personal digital assistant (PDA), fixed location data unit, and a computer, into which the multi-free layer MTJ cell is integrated.

17. A method for magnetic tunnel junction (MTJ) memory, comprising:
- step for injecting a first write current from one of a first read/write terminal and a base read/write terminal to the other of the first read/write terminal and the base read/write terminal, the first write current passing through and setting a magnetization state of a first free magnetization layer;
- step for injecting a second write current from one of a second read/write terminal and the base read/write terminal to the other of the second read/write terminal and the base read/write terminal, the second write current passing through and setting a magnetization state of a second free magnetization layer;
- step for detecting the magnetization state of the first free magnetization layer; and
- step for detecting the magnetization state of the second free magnetization layer, wherein detecting the magnetization state of the second free magnetization layer is based in part on a result of detecting the magnetization state of the first free magnetization layer.

* * * * *